US009064763B2

(12) United States Patent
Ozawa et al.

(10) Patent No.: US 9,064,763 B2
(45) Date of Patent: Jun. 23, 2015

(54) SOLID-STATE IMAGING ELEMENT, SOLID-STATE IMAGING DEVICE, IMAGING APPARATUS, AND METHOD OF MANUFACTURING POLARIZING ELEMENT

(75) Inventors: Ken Ozawa, Kanagawa (JP); Yutaka Ooka, Kanagawa (JP); Eiji Otani, Kanagawa (JP)

(73) Assignee: Sony Corporation, Tokyo (JP)

( * ) Notice: Subject to any disclaimer, the term of this patent is extended or adjusted under 35 U.S.C. 154(b) by 306 days.

(21) Appl. No.: 13/508,509

(22) PCT Filed: Aug. 25, 2011

(86) PCT No.: PCT/JP2011/069114
§ 371 (c)(1),
(2), (4) Date: Jul. 18, 2012

(87) PCT Pub. No.: WO2012/032939
PCT Pub. Date: Mar. 15, 2012

(65) Prior Publication Data
US 2012/0319222 A1 Dec. 20, 2012

(30) Foreign Application Priority Data

Sep. 7, 2010 (JP) .................................. 2010-199926
Apr. 28, 2011 (JP) .................................. 2011-100684

(51) Int. Cl.
*H01L 27/146* (2006.01)
(52) U.S. Cl.
CPC .... *H01L 27/14625* (2013.01); *H01L 27/14605* (2013.01); *H01L 27/14621* (2013.01); *H01L 27/14627* (2013.01); *H01L 27/14629* (2013.01)
(58) Field of Classification Search
CPC .................... H01L 27/14625; H01L 27/14627
See application file for complete search history.

(56) References Cited

U.S. PATENT DOCUMENTS 8,542,269 B2 9/2013 Lee
2008/0170143 A1 7/2008 Yoshida
(Continued)

FOREIGN PATENT DOCUMENTS

CN 1571519 A 1/2005
CN 202454558 U 9/2012
(Continued)

OTHER PUBLICATIONS

International Search Report; International Application No. PCT/JP2011/069114; Date of mailing of the International Search Report: Nov. 15, 2011.
(Continued)

*Primary Examiner* — Yu Chen
(74) *Attorney, Agent, or Firm* — Fishman Stewart Yamaguchi PLLC

(57) ABSTRACT

The present invention relates to a solid-state imaging element which is able to provide the solid-state imaging element having a polarizing element having a simple configuration and structure based on a wire grid polarizer technique, a solid-state imaging device, an imaging apparatus, and a method of manufacturing a polarizing element. The solid-state imaging device includes a plurality of solid-state imaging elements 41 each including a photoelectric conversion element 61 and a polarizing element 70 formed on the light incident side of the photoelectric conversion element 61. The solid-state imaging device includes two or more kinds of polarizing elements 70 having different polarization orientations. Each polarizing element has a stacked structure in which a stripe-shaped reflecting layer 71, an insulating layer 72 formed on the reflecting layer 71, and a light absorption layer 73 made up of a plurality of segments 73' formed on the insulating layer 72 in a separated state are stacked in that order from the photoelectric conversion element side.

19 Claims, 35 Drawing Sheets

(56) References Cited

U.S. PATENT DOCUMENTS

| | | | |
|---|---|---|---|
| 2008/0278811 A1* | 11/2008 | Perkins et al. | 359/486 |
| 2008/0303107 A1* | 12/2008 | Minamio et al. | 257/432 |
| 2011/0180893 A1* | 7/2011 | Minegishi et al. | 257/432 |

FOREIGN PATENT DOCUMENTS

| | | | |
|---|---|---|---|
| DE | 102008014334 A1 * | 9/2009 | |
| JP | 06-54991 A | 7/1994 | |
| JP | 2004-309868 | 11/2004 | |
| JP | 2005-37900 | 2/2005 | |
| JP | 2007-219340 | 8/2007 | |
| JP | 2008-216956 A | 9/2008 | |
| JP | 2010-500811 | 1/2010 | |
| JP | 2011-176525 | 9/2011 | |
| WO | WO-2009/002791 A1 | 12/2008 | |

OTHER PUBLICATIONS

Extended European Search Report issued Jan. 8, 2014 for corresponding European Application No. 11 82 3418.

International Notification Concerning Transmittal of International Preliminary Report on Patentability & Written Opinion of the International Searching Authority for PCT/JP2011/069114; Date of mailing Nov. 15, 2011.

34th Optical Symposium, Lecture 16 "Defect observation of a SiC Wafer Using Polarization Imaging," pp. 45-46, Translation pp. 1-6, 2009.

New Technology and New Communications, "Pencil of Rays" Chapter 23, Grid Polarizer, Cover and pp. 278 to 287, translation of Chapter 23, pages pp. 1-16, published 1993.

Chinese Office Action issued Mar. 26, 2015 for corresponding Chinese Application No. 201110256182.5.

* cited by examiner

[EIGHTH EMBODIMENT]

(TENTH EMBODIMENT)

(TENTH EMBODIMENT)

(TENTH EMBODIMENT)

(TENTH EMBODIMENT)

(TENTH EMBODIMENT)

SOLID-STATE IMAGING ELEMENT, SOLID-STATE IMAGING DEVICE, IMAGING APPARATUS, AND METHOD OF MANUFACTURING POLARIZING ELEMENT

TECHNICAL FIELD

The present invention relates to a solid-state imaging element, a solid-state imaging device, an imaging apparatus, and a method of manufacturing a polarizing element.

BACKGROUND ART

Optical elements in which polarizing elements having different polarization orientations are disposed in each small region and electronic devices in which such optical elements are integrated are commercialized around a display device and a measuring device. For example, Xpol (registered trademark) manufactured by Arisawa Manufacturing Co., Ltd. is sold as a display device.

As disclosed in JP-A-2004-309868, an imaging device is known which includes: imaging means in which pixels corresponding to an integer multiple of a predetermined number of scanning lines are formed on an imaging surface; first horizontal component polarizing means that transmits only horizontal components of first video light from a subject; and first vertical component polarizing means that is disposed at a position separated by a predetermined distance from the first horizontal component polarizing means so as to transmit only vertical components of second video light from the subject. In the imaging device, horizontal components having passed through the first horizontal component polarizing means are collected by a predetermined range of pixels on the imaging surface, and vertical components having passed through the first vertical component polarizing means are collected by a remaining range of pixels excluding the predetermined range. Horizontal and vertical component polarization filters disposed at a position separated by a predetermined distance in relation to the imaging surface of a CCD so as to be separated by a distance corresponding to a parallax of a person are formed together with two lenses.

As disclosed in JP-A-2008-216956, a polarizing element is known which includes: a substrate that is transparent to light in a used band; a reflecting layer in which strip-shaped thins film extending uniaxially are arranged on the substrate in a one-dimensional grid shape at a pitch smaller than the wavelength of light in the used band; a dielectric layer formed on the reflecting layer; and an inorganic microparticle layer having a light absorbing effect, in which inorganic microparticles are arranged on the dielectric layer at positions corresponding to the strip-shaped thin films in a one-dimensional grid shape. The polarizing element employs a so-called wire grid polarizer technique.

Moreover, as disclosed in 34th Optics Symposium (2009), Lecture 16 "Application of Polarization Imaging to SiC Wafer Defect Evaluation", a technique is known in which polarizing elements having a plurality of polarization orientations are disposed on a solid-state imaging element commonly called a CCD (Charge Coupled Device) element or a CMOS (Complementary Metal Oxide Semiconductor) image sensor, whereby a plurality of polarization information items are spatially divided and acquired at the same time. Specifically, a polarization camera system is proposed in which incident light to the solid-state imaging element is split into polarized light components of four polarization orientations by a photonic crystal array, and the intensities of the respective polarization orientations are output at the same time, whereby polarization analysis which was conventionally performed by time-division processing is concurrently realized by spatial-division processing, so that polarized images can be output without using a driving portion. However, since the photonic crystal array is manufactured separately from the solid-state imaging element and both are integrated by bonding, it is difficult to apply such a technique to an imaging device having a small pixel size.

In general, a wire grid polarizer has a 1-dimensional or 2-dimensional grid structure formed of a conductor material. As shown by a conceptual diagram in FIG. 35, when the formation pitch $P_0$ of the wire grid is significantly smaller than the wavelength of an incident electromagnetic wave, the electromagnetic wave vibrating on a plane parallel to the extension direction of the wire grid is selectively reflected or absorbed by the wire grid. Therefore, as shown in FIG. 35, although the electromagnetic wave arriving at the wire grid polarizer includes a vertically polarized light component and a horizontally polarized light component, the electromagnetic wave having passed through the wire grid polarizer becomes linearly polarized light in which a vertically polarized light component is dominant. Here, focusing on a visible wavelength band, when the formation pitch $P_0$ of the wire grid is equal to or shorter than the wavelength of the electromagnetic wave incident to the wire grid polarizer, polarized light components biased from the plane parallel to the extension direction of the wire grid are reflected or absorbed by the front surface of the wire grid. On the other hand, when the electromagnetic wave having the polarized light components biased from the plane vertical to the extension direction of the wire grid is incident to the wire grid, the electric field having propagated through the front surface of the wire grid exits from the rear surface of the wire grid in a state of having the same wavelength as the incident wavelength and the same polarization orientation. The above physical phenomenon is known and the details thereof are disclosed, for example, in New Technology and New Communications, Tsuruta "3. Pencil of light" Chapter 23, Grid Polarizer.

CITATION LIST

Patent Literature

PTL 1: JP-A-2004-309868
PTL 2: JP-A-2008-216956
PTL 3: JP-B-6-054991

Non Patent Literature

NPL 1: 34th Optics Symposium, Lecture 16 "Application of Polarization Imaging to SiC Wafer Defect Evaluation"
NPL 2: New Technology and New Communications, Tsuruta "3. Pencil of light" Chapter 23, Grid Polarizer

SUMMARY OF INVENTION

Technical Problem

However, in the imaging device disclosed in JP-A-2004-309868, there is no description of the specific configuration of the horizontal and vertical component polarizing means. Moreover, in the polarizing element disclosed in JP-A-2008-216956, the inorganic microparticles (inorganic microparticle layer 14) are formed of a metallic material or a semiconductor material, and the inorganic microparticles have shape anisotropy and are formed based on an oblique sputtering film forming method. Thus, it is very difficult to form inorganic microparticles having different shape anisotropy for each solid-state imaging element. Thus, it is very difficult to apply the polarizing element disclosed in JP-A-2008-216956 to the technique disclosed in NPL 1.

Therefore, an object of the present invention is to provide a solid-state imaging device having two or more kinds of polarizing elements having different polarization orientations which are formed based on the wire grid polarizer (WGP) technique and has a simple configuration and structure, and to provide an imaging apparatus using the solid-state imaging device, a solid-state imaging element constituting the solid-state imaging device, and a method of manufacturing the polarizing element used for the solid-state imaging device.

Solution to Problem

A solid-state imaging element of the present invention for attaining the object includes:

(A) a photoelectric conversion element; and (B) a polarizing element formed on a light incident side of the photoelectric conversion element, wherein the polarizing element has a stacked structure in which a stripe-shaped reflecting layer, an insulating layer formed on the reflecting layer, and a light absorption layer made up of a plurality of segments formed on the insulating layer in a separated state are stacked in that order on the photoelectric conversion element side.

A solid-state imaging device of the present invention for attaining the object includes a plurality of solid-state imaging element having:

(A) a photoelectric conversion element; and (B) a polarizing element formed on an light incident side of the photoelectric conversion element, wherein the solid-state imaging device includes two or more kinds of polarizing elements having different polarization orientations, and wherein each polarizing element has a stacked structure in which a stripe-shaped reflecting layer, an insulating layer formed on the reflecting layer, and a light absorption layer made up of a plurality of segments formed on the insulating layer in a separated state are stacked in that order from the photoelectric conversion element side.

An imaging apparatus of the present invention for attaining the object includes the solid-state imaging device of the present invention, and specifically is configured as a digital still camera, a video camera, or a camcorder, for example.

A polarizing element manufacturing method of the present invention for attaining the object is a method of manufacturing a polarizing element which has a stacked structure in which a stripe-shaped reflecting layer, an insulating layer formed on the reflecting layer, and a light absorption layer made up of a plurality of segments formed on the insulating layer in a separated state are stacked on a base in that order, and a formation pitch of the light absorption layer in a repetition direction of the stripe-shaped reflecting layer is $P_{ab-2}$, a width of the light absorption layer is $W_{ab}$, and the length of the segment of the light absorption layer in the extension direction of the stripe-shaped reflecting layer is $L_{ab}$, the method comprising the steps of:

(a) forming on the base, a reflecting layer-forming layer which forms the reflecting layer, an insulating layer-forming layer which forms the insulating layer, and a light absorption layer-forming layer which forms the light absorption layer;

(b) patterning the light absorption layer-forming layer to obtain the light absorption layer-forming layer having the length of $L_{ab}$;

(c) forming on an entire surface, a resist layer in which the formation pitch in the repetition direction of the strip-shaped light absorption layer is $2\times P_{ab-2}$ and the width is $P_{ab-2}-W_{ab}$ and then forming on a side wall of the resist layer, an etching mask layer of which the thickness on the side wall of the resist layer is $W_{ab}$; and (d) removing the resist layer and then sequentially etching the light absorption layer-forming layer, the insulating layer-forming layer, and the reflecting layer-forming layer using the etching mask layer as an etching mask to thereby obtain the polarizing element having the stacked structure of the reflecting layer, the insulating layer, and the light absorption layer.

Advantageous Effects of Invention

An absorption-type polarizing element in the solid-state imaging element and the like of the present invention, employing a wire grid polarizer technique has a stacked structure in which a stripe-shaped reflecting layer, an insulating layer formed on the reflecting layer, and a light absorption layer made up of a plurality of segments formed on the insulating layer in a separated state are stacked in that order from the photoelectric conversion element side. Thus, it is possible to provide a polarizing element which has a desired polarization orientation and excellent extinction characteristics with a simple configuration and structure. In addition, since polarizing elements are integrally formed above the photoelectric conversion element in an on-chip form, it is possible to decrease the thickness of the solid-state imaging element. As a result, it is possible to minimize mixing (polarization crosstalk) of polarized light into the adjacent solid-state imaging element. Moreover, since the polarizing element is an absorption-type polarizing element having a light absorption layer, the occurrence of stray light, flare, ghost, or the like can be suppressed. Moreover, since the solid-state imaging device of the present invention includes two or more kinds of polarizing elements having different polarization orientations, a polarization separating function of spatially separating polarization information of incident light can be provided to the solid-state imaging device. Thus, it is possible to easily provide a solid-state imaging device including the solid-state imaging element having two or more kinds of polarizing elements having different polarization orientations.

Figure 9:
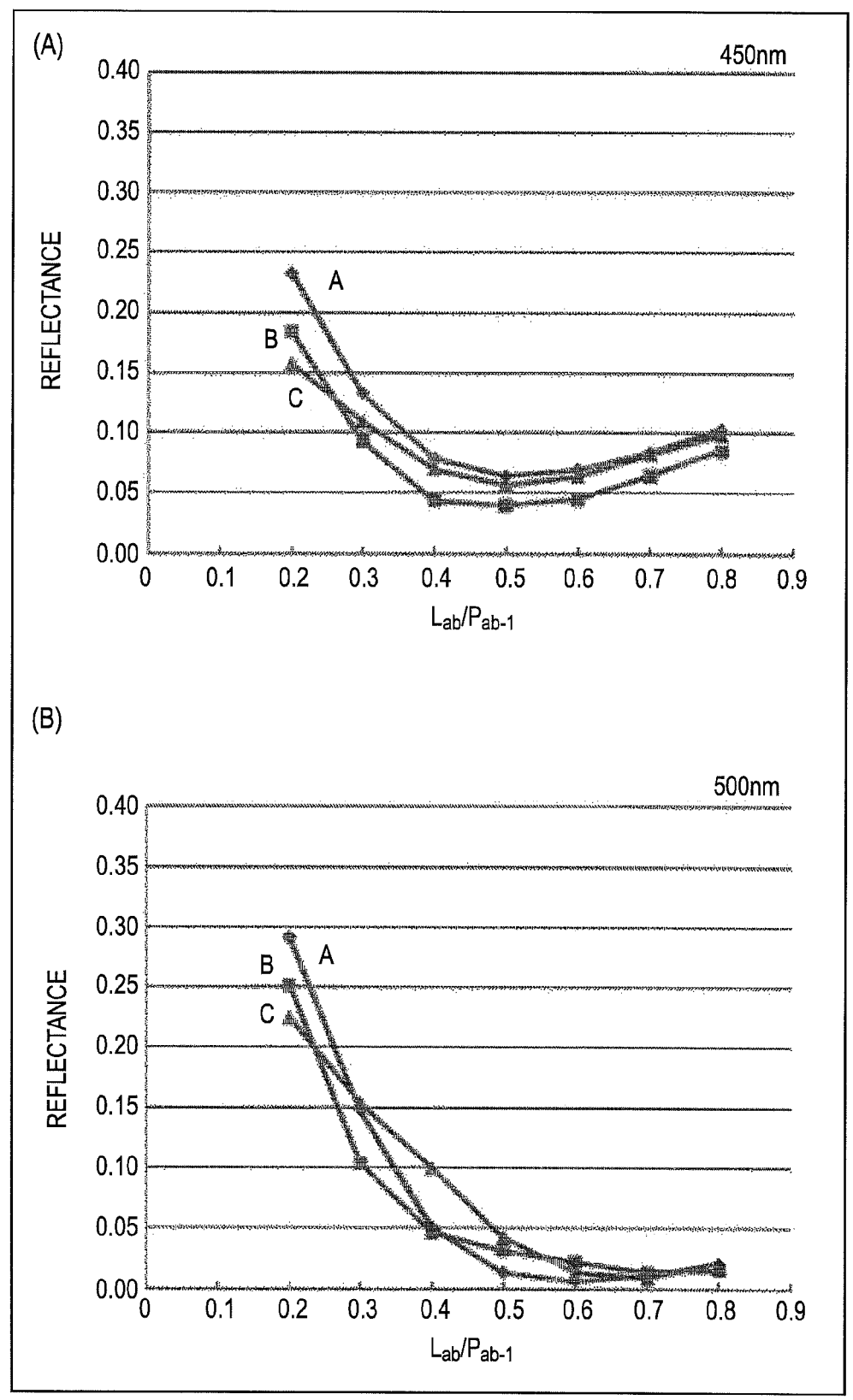

(A) and (B) in FIG. 9 are graphs showing the relation between the value of $L_{ab}/P_{ab-1}$ and an average reflectance in a polarizing element of the fourth embodiment.

Figure 10:
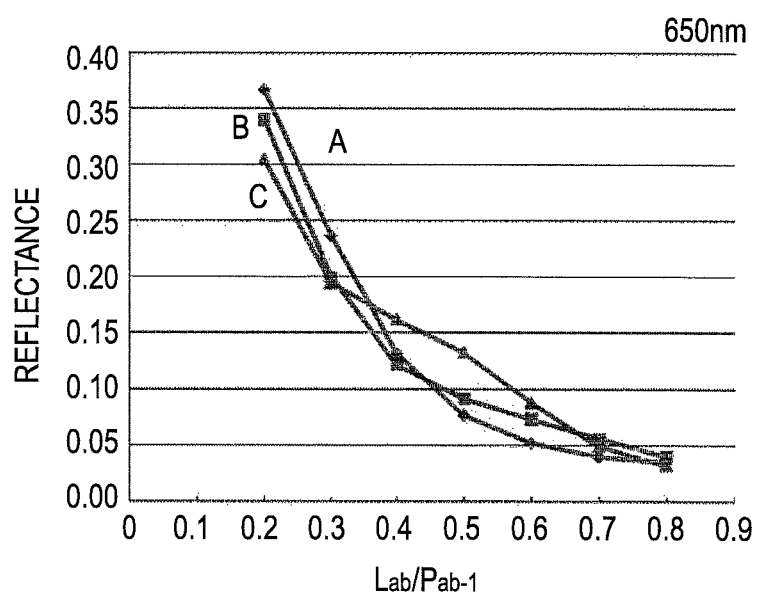

FIG. 10 is a graph showing the relation between the value of $L_{ab}/P_{ab-1}$ and an average reflectance in a polarizing element of the fourth embodiment.

Figure 11:
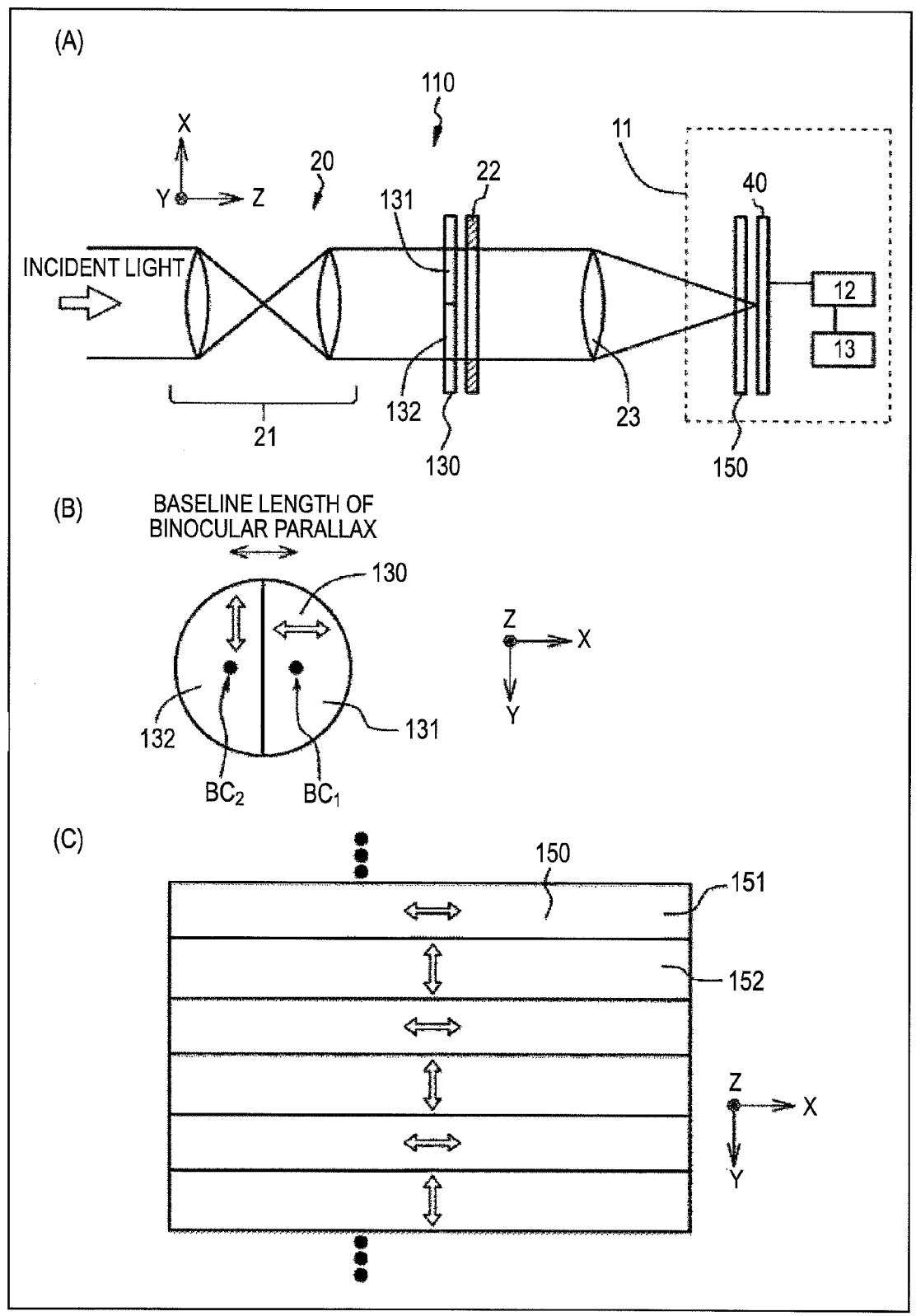

(A), (B) and (C) in FIG. 11 are conceptual diagrams of an imaging apparatus of a fifth embodiment and diagrams schematically showing the polarization states of first and second polarizing means, respectively.

Figure 12:
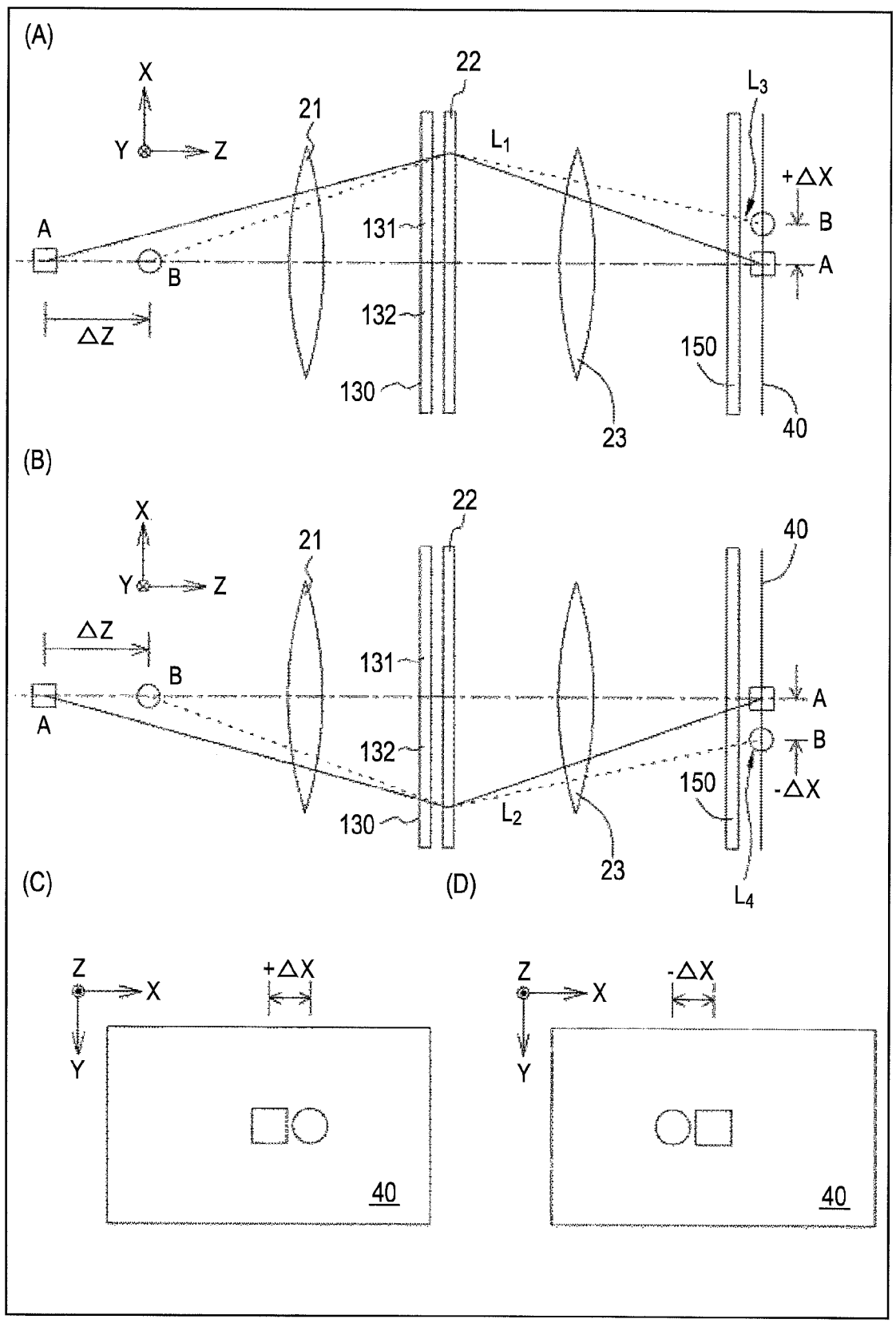

(A) and (B) in FIG. 12 are conceptual diagrams of light passing through a first region of first polarizing means and a third region of a second polarizing means and arriving at an imaging element array in an imaging apparatus of the fifth embodiment and a conceptual diagram of light passing through a second region of the first polarizing means and a fourth region of the second polarizing means and arriving at the imaging element array, respectively, and (C) and (D) in FIG. 12 are diagrams schematically showing images formed on the imaging element array by the light shown in (A) and (B) in FIG. 12, respectively.

Figure 13:
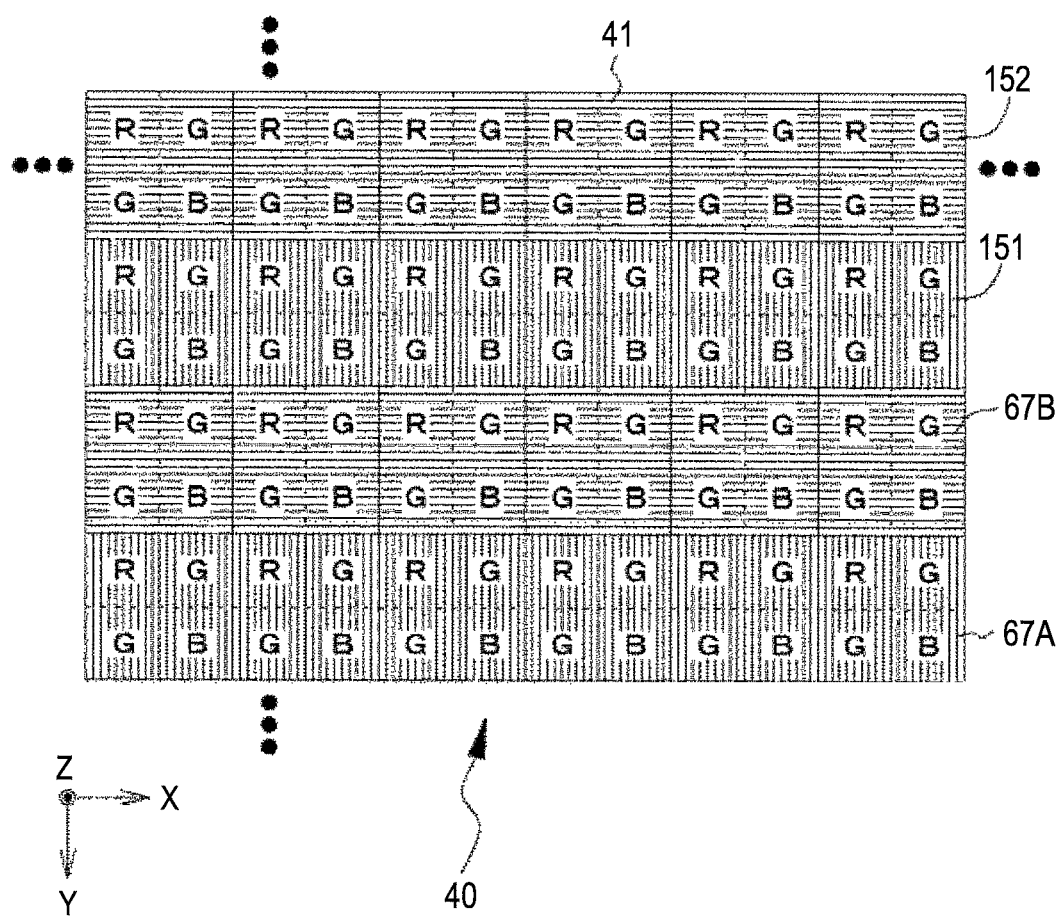

FIG. 13 is a conceptual diagram of an imaging element array having the Bayer arrangement in the imaging apparatus of the fifth embodiment.

Figure 14:
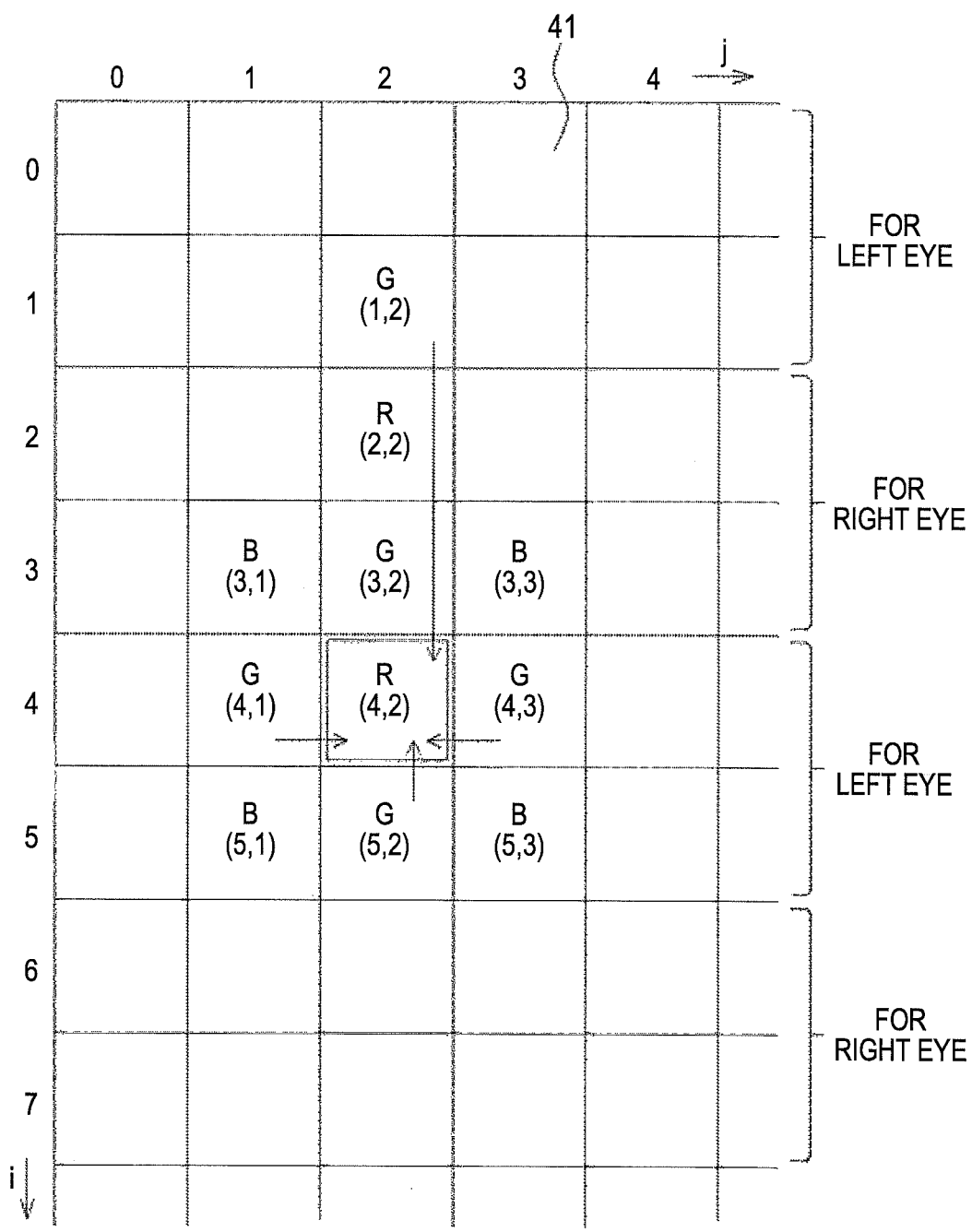

FIG. 14 is a conceptual diagram of an imaging element array having the Bayer arrangement for explaining image processing of performing demosaic processing to an electrical signal obtained from a solid-state imaging element to obtain a signal value.

Figure 15:
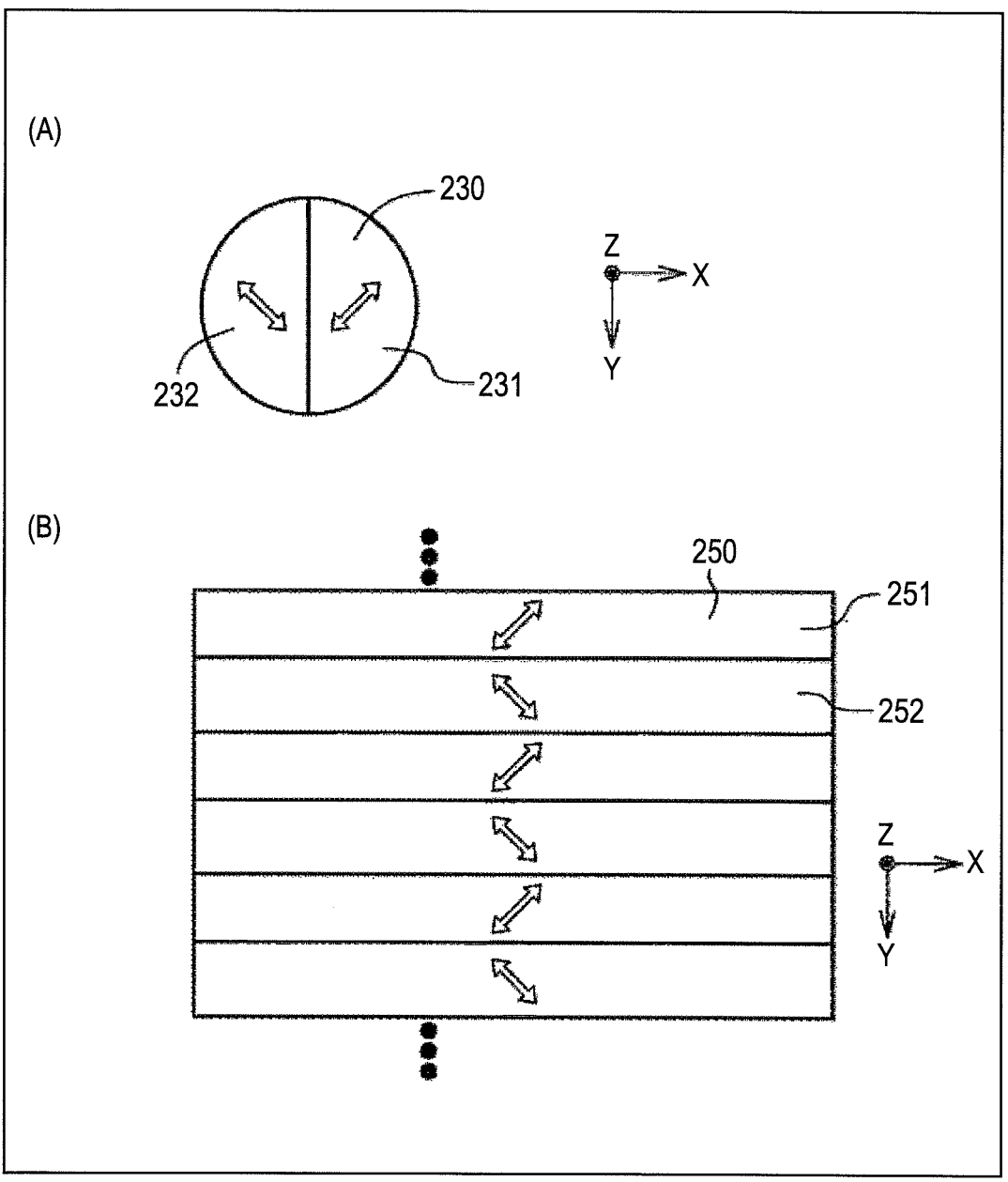

(A) and (B) in FIG. 15 are diagrams schematically showing the polarization states of first and second polarizing means provided in an imaging apparatus of a sixth embodiment, respectively.

Figure 16:
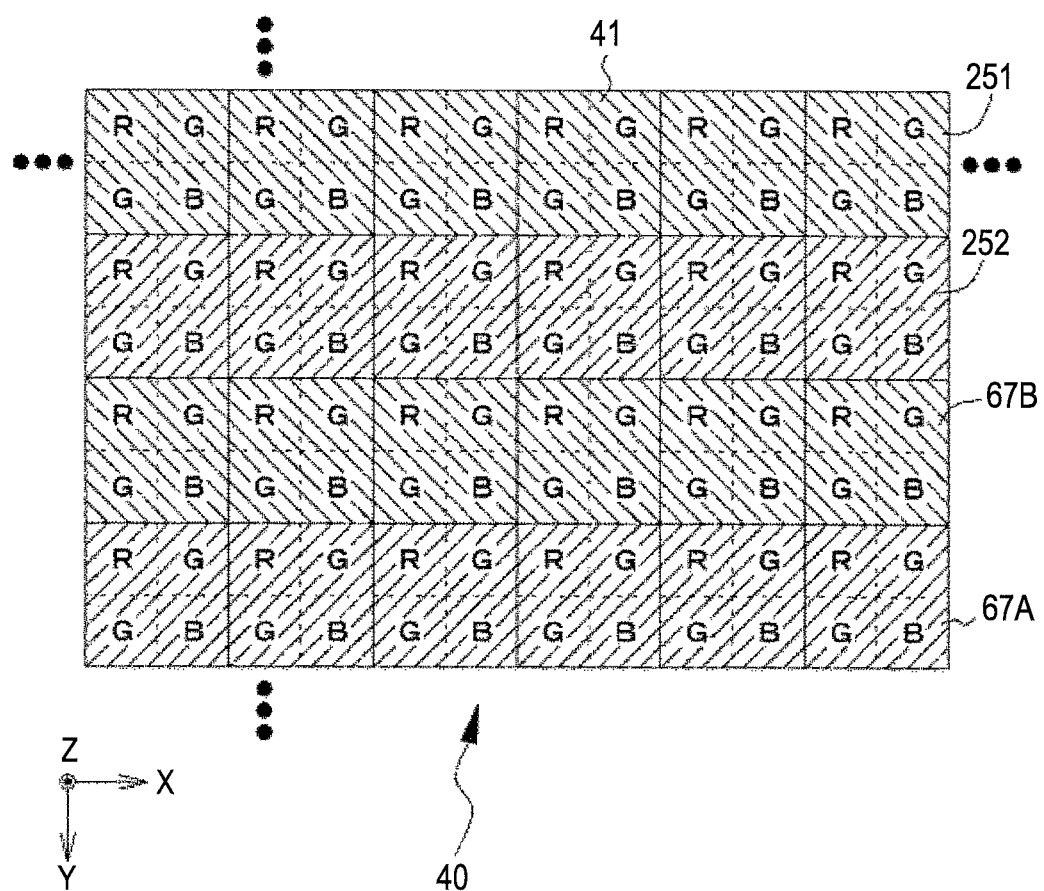

FIG. 16 is a conceptual diagram of an imaging element array having the Bayer arrangement in the imaging apparatus of the sixth embodiment.

Figure 17:
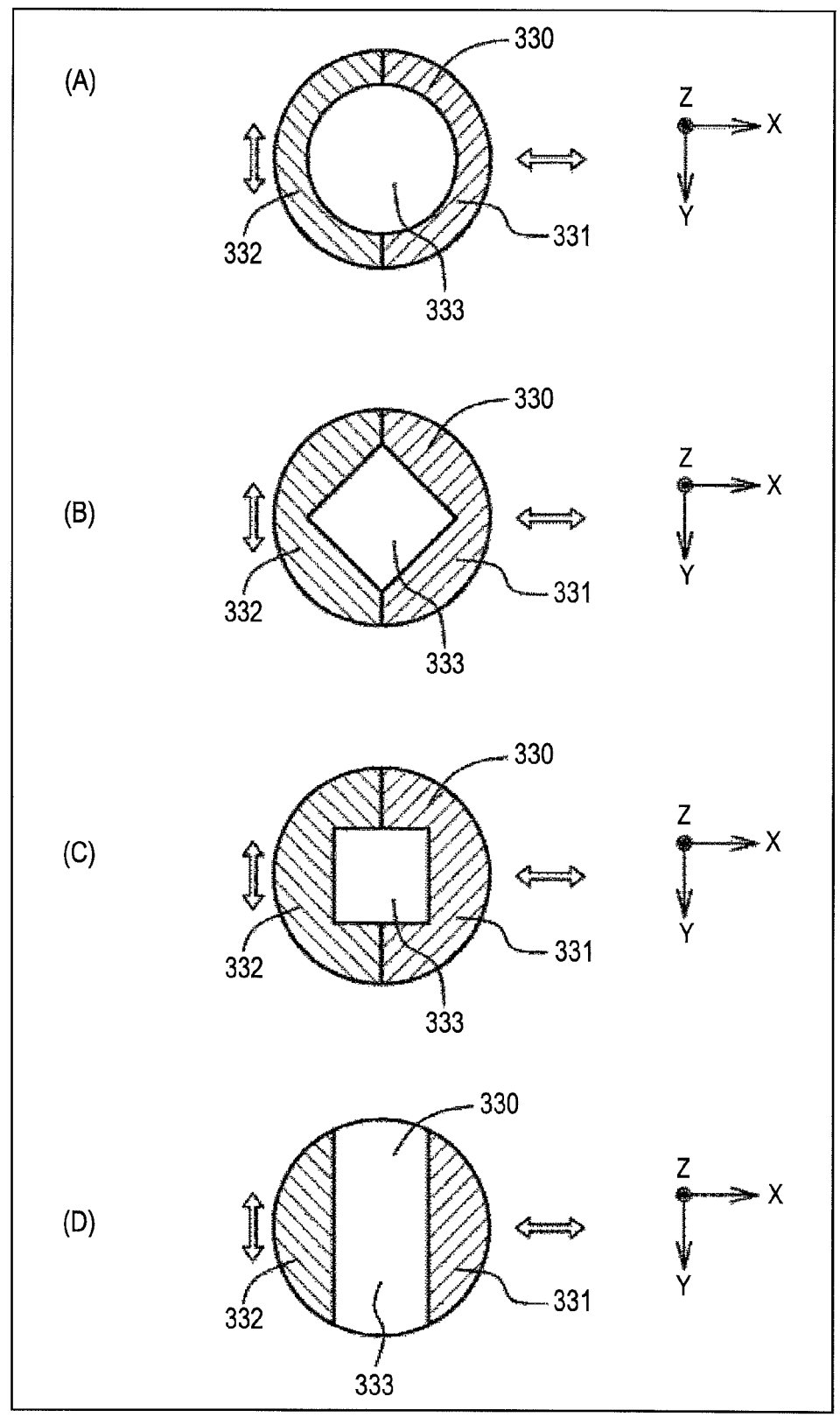

(C) to (D) in FIG. 17 are schematic diagrams of a first polarizing means provided in an imaging apparatus of a seventh embodiment.

Figure 18:
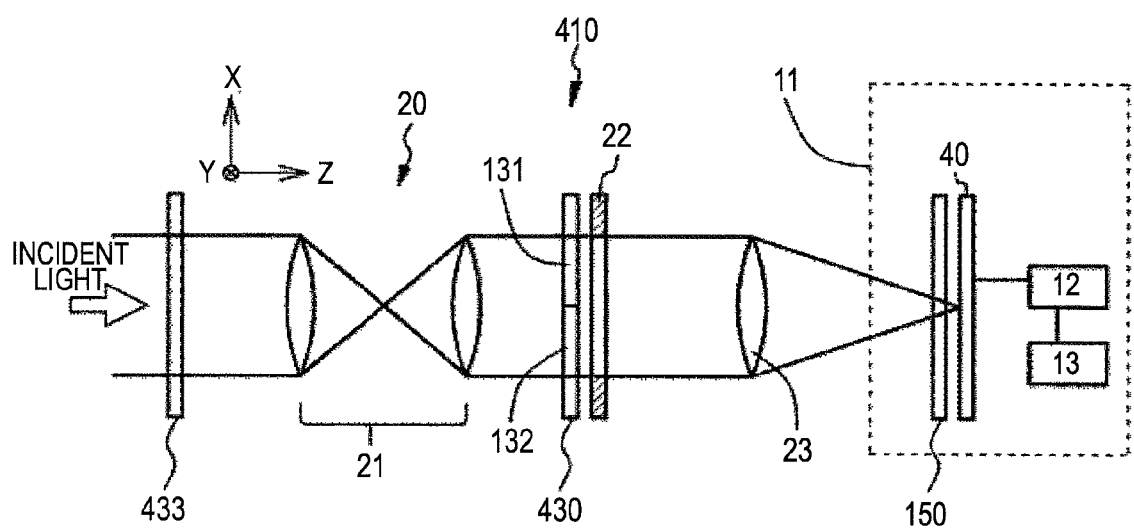

FIG. 18 is a conceptual diagram of an imaging apparatus of an eighth embodiment.

Figure 19:
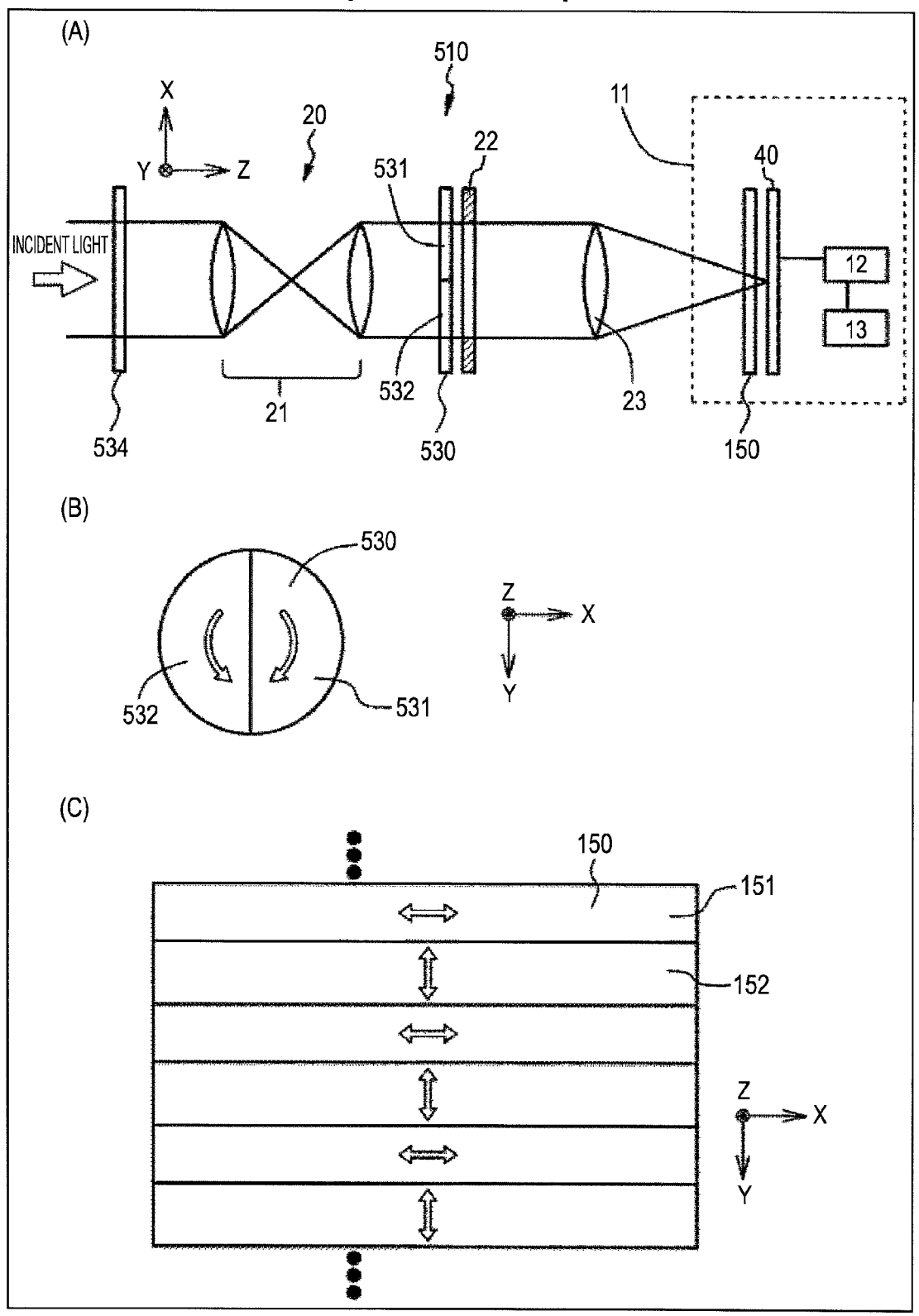

(A), (B) and (C) in FIG. 19 are conceptual diagrams of an imaging apparatus of a ninth embodiment and diagrams schematically showing the polarization states of first and second polarizing means, respectively.

Figure 20:
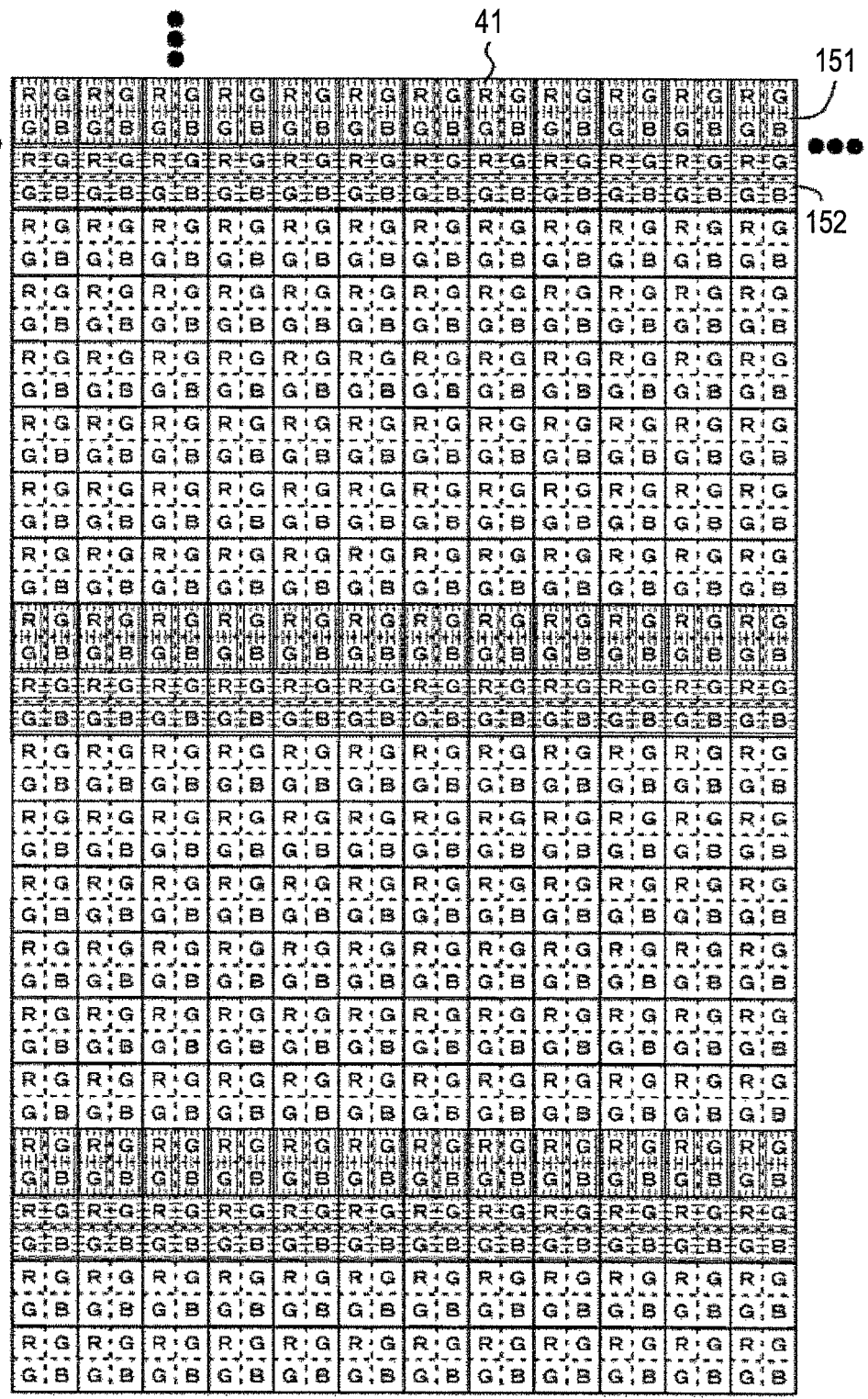

FIG. 20 is a conceptual diagram of an imaging element array having the Bayer arrangement in an imaging apparatus of a tenth embodiment.

Figure 21:
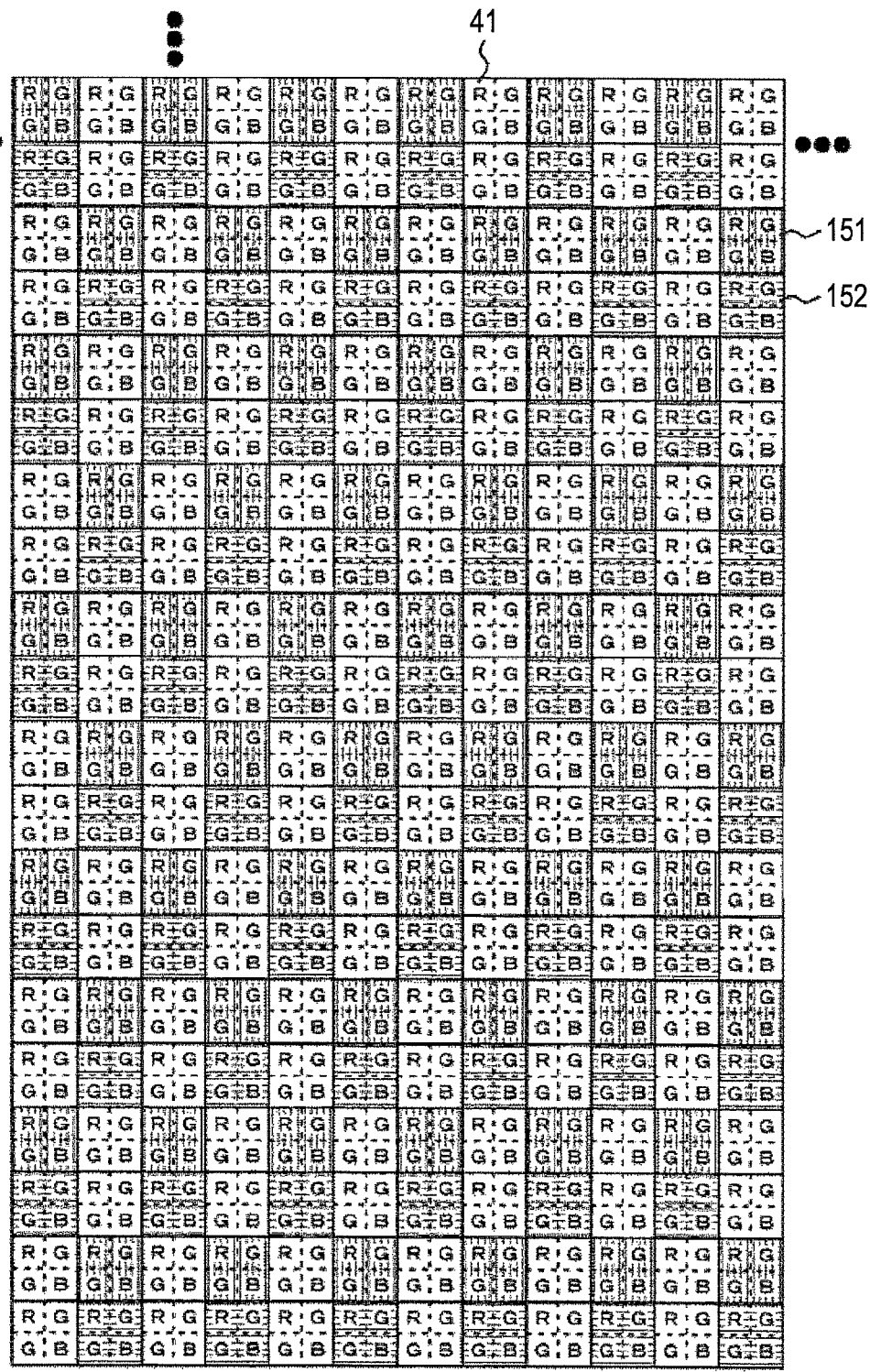

FIG. 21 is a conceptual diagram of an imaging element array having the Bayer arrangement in a first modified example of the imaging apparatus of the tenth embodiment.

Figure 22:
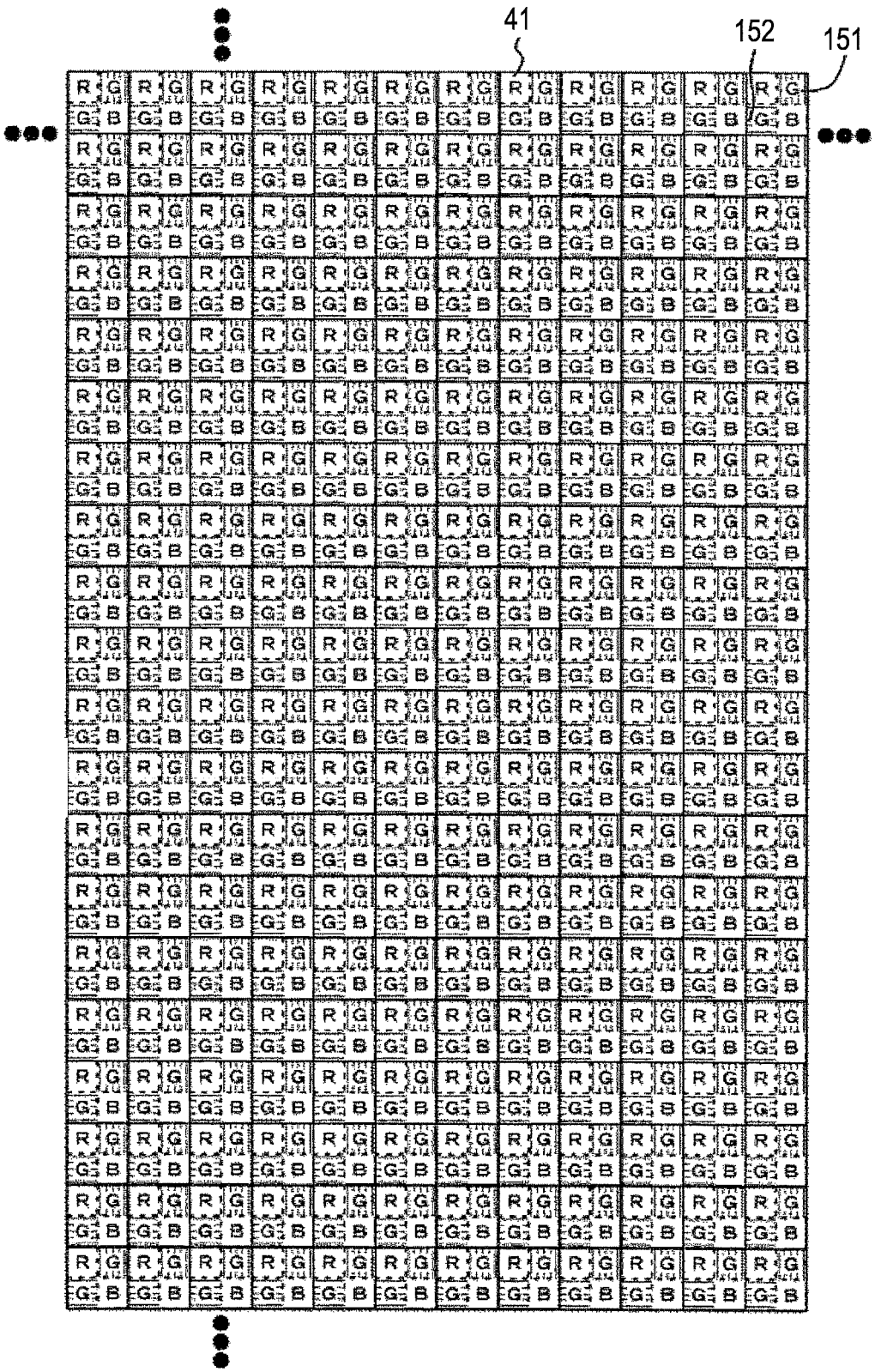

FIG. 22 is a conceptual diagram of an imaging element array having the Bayer arrangement in a second modified example of the imaging apparatus of the tenth embodiment.

Figure 23:
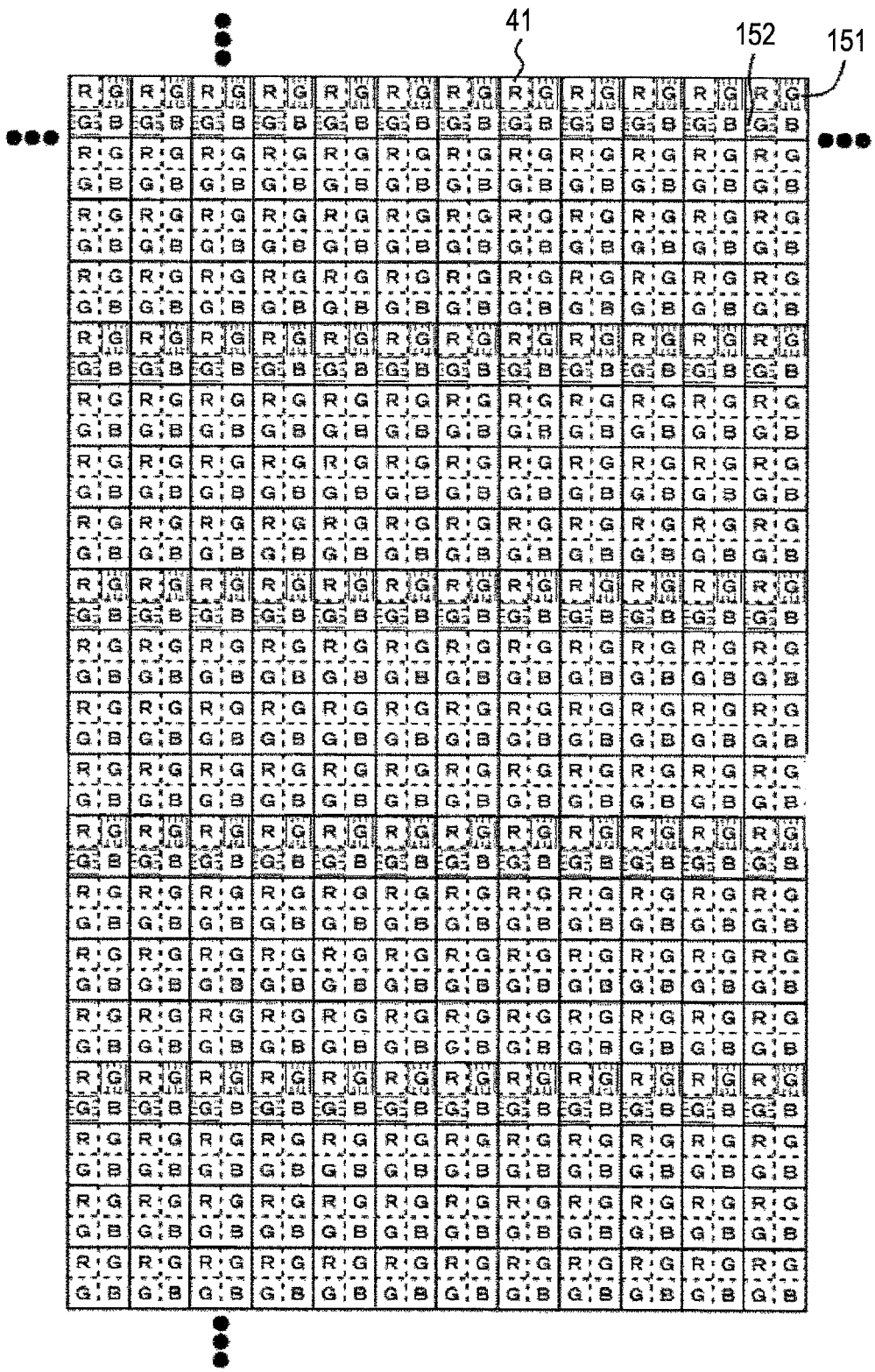

FIG. 23 is a conceptual diagram of an imaging element array having the Bayer arrangement in a third modified example of the imaging apparatus of the tenth embodiment.

Figure 24:
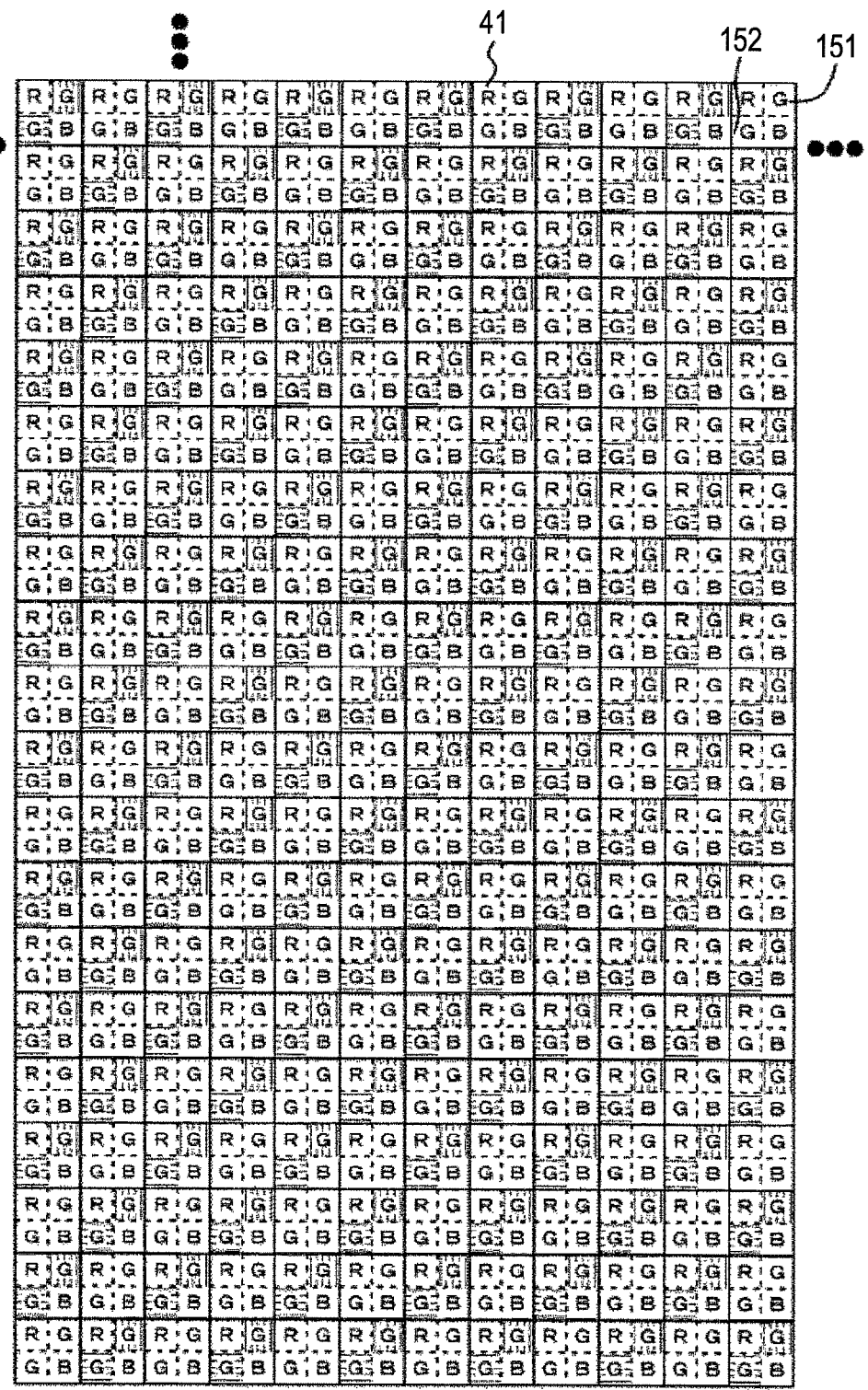

FIG. 24 is a conceptual diagram of an imaging element array having the Bayer arrangement in a fourth modified example of the imaging apparatus of the tenth embodiment.

Figure 25:
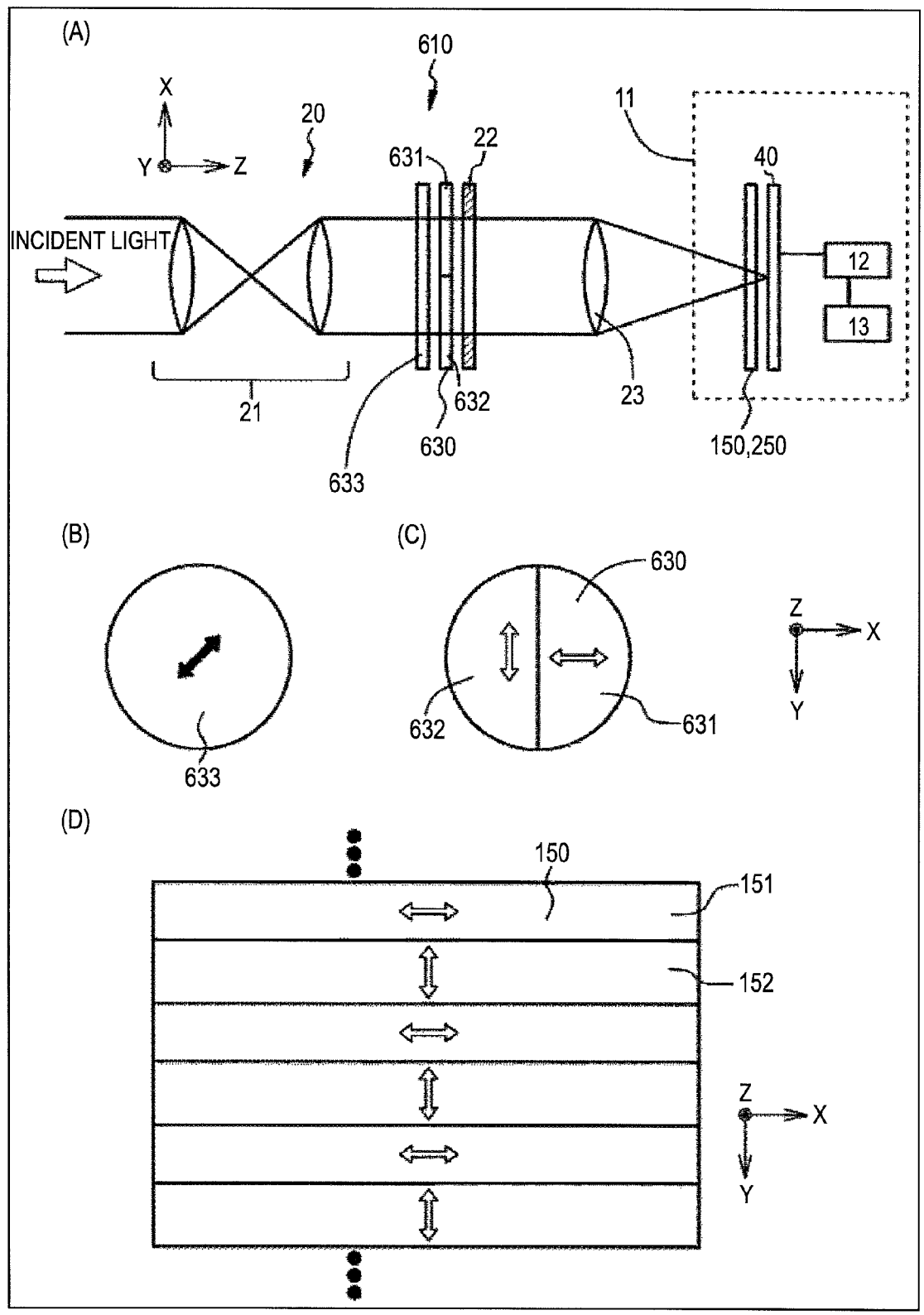

(A), (B), (C) and (D) in FIG. 25 are conceptual diagrams of a solid-state imaging device of an eleventh embodiment, a conceptual diagram of a ¼-wavelength plate, a diagram schematically showing the polarization state of a first polarizing means, and a diagram schematically showing the polarization state of polarizing means (second polarizing means), respectively.

Figure 26:
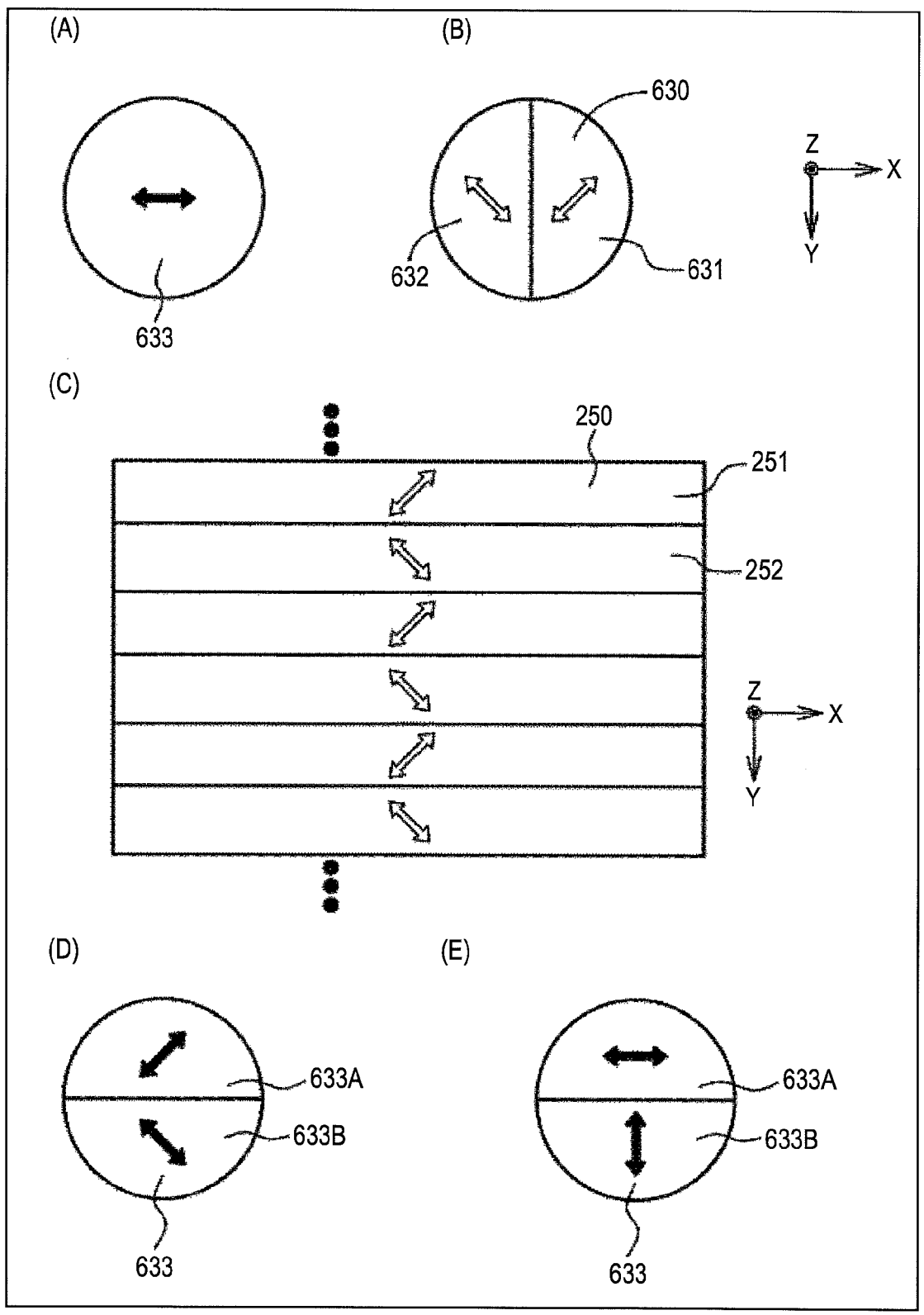

(A), (B) and (C) in FIG. 26 are conceptual diagrams of a ¼-wavelength plate in the solid-state imaging device of the eleventh embodiment, a diagram schematically showing the polarization state of a first polarizing means, and a diagram schematically showing the polarization state of polarizing means (second polarizing means), respectively, and (D) and (E) in FIG. 26 are conceptual diagrams of a ¼-wavelength plate in a solid-state imaging device of a twelfth embodiment.

Figure 27:
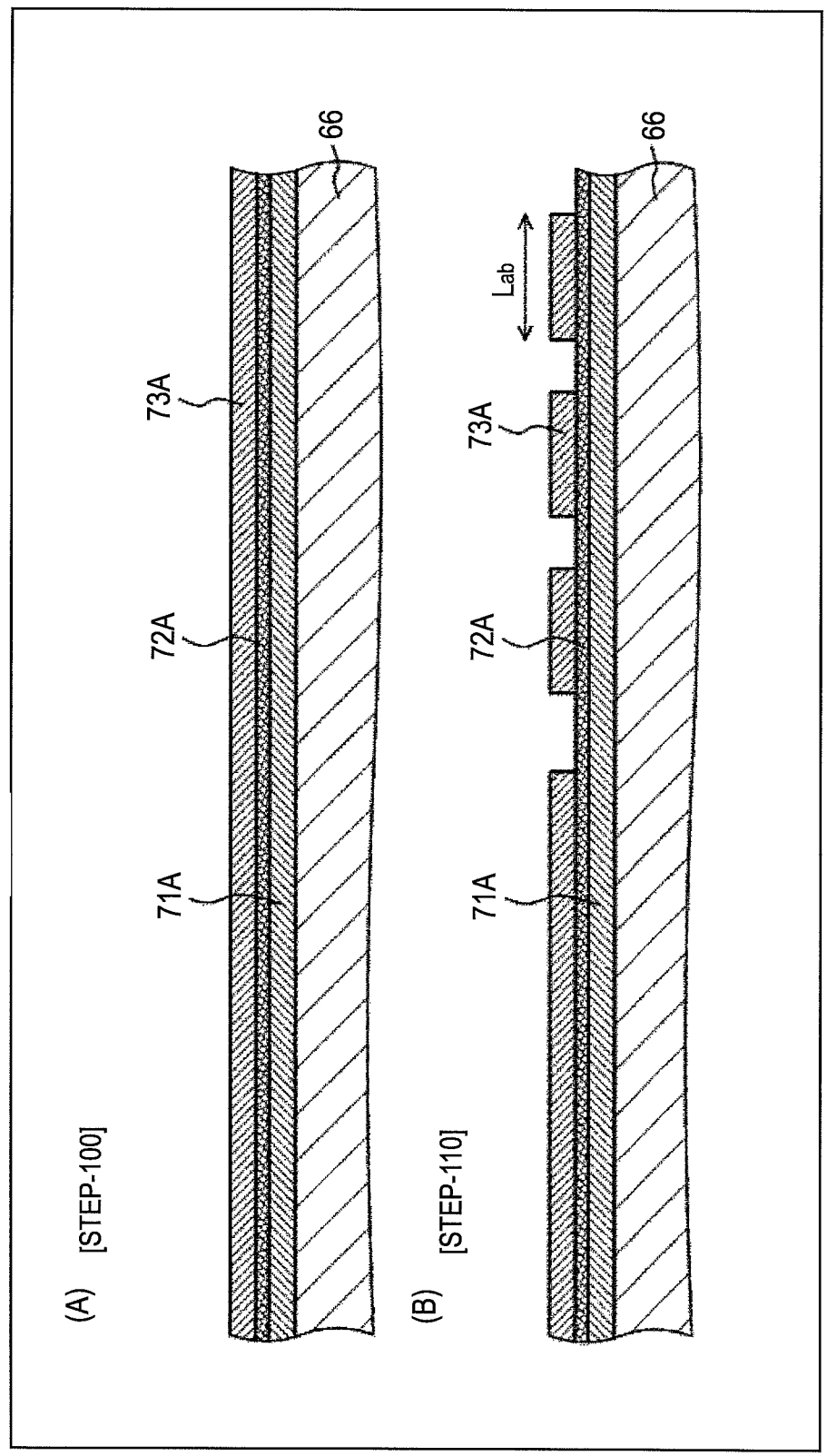

(A) and (B) in FIG. 27 are schematic partial cross-sectional views of a base and the like, for explaining a method of manufacturing a polarizing element of the first embodiment.

Figure 28:
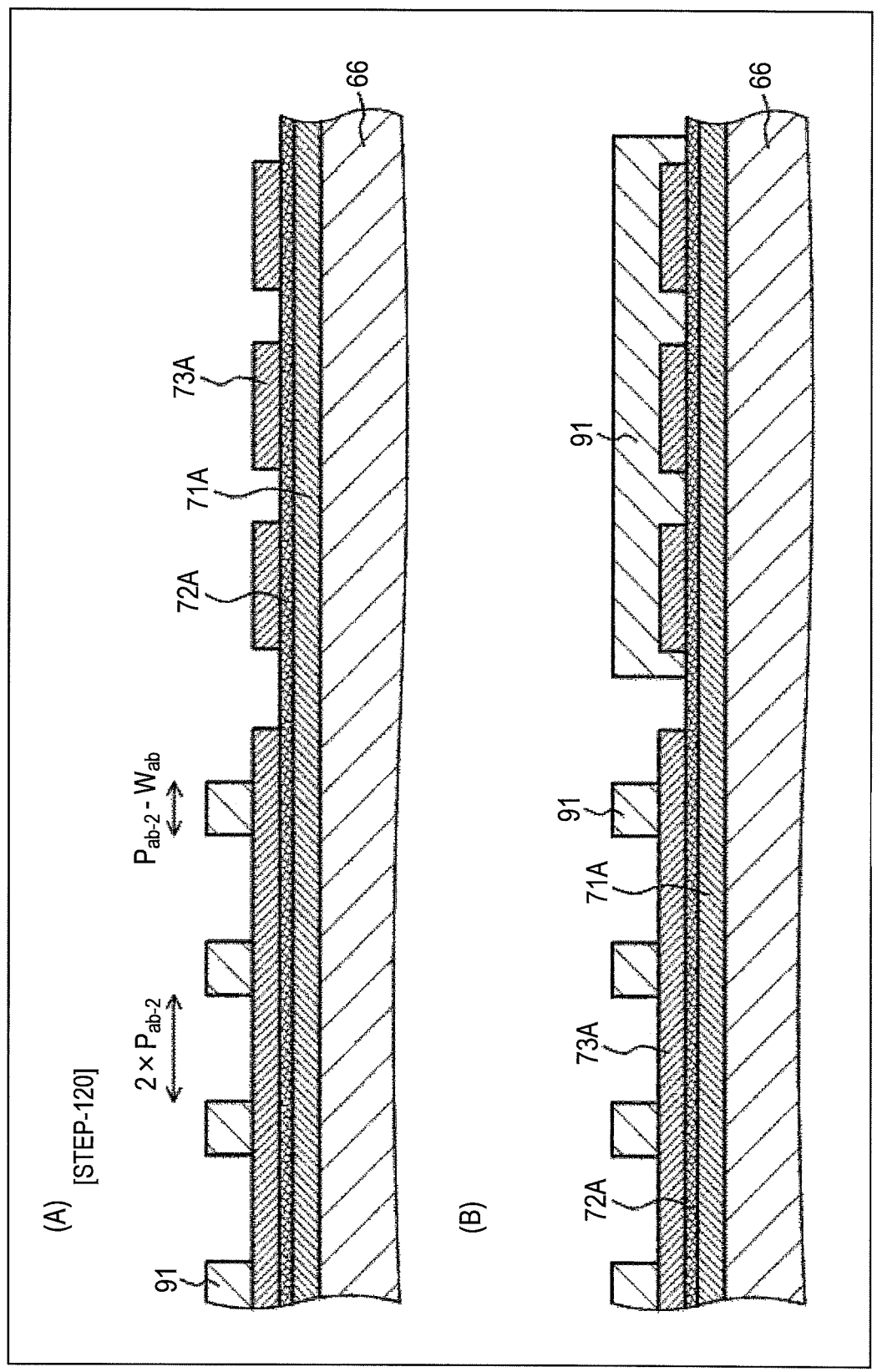

(A) and (B) in FIG. 28 are schematic partial cross-sectional views of a base and the like, for explaining a method of manufacturing a polarizing element of the first embodiment, subsequent to (B) in FIG. 27.

Figure 29:
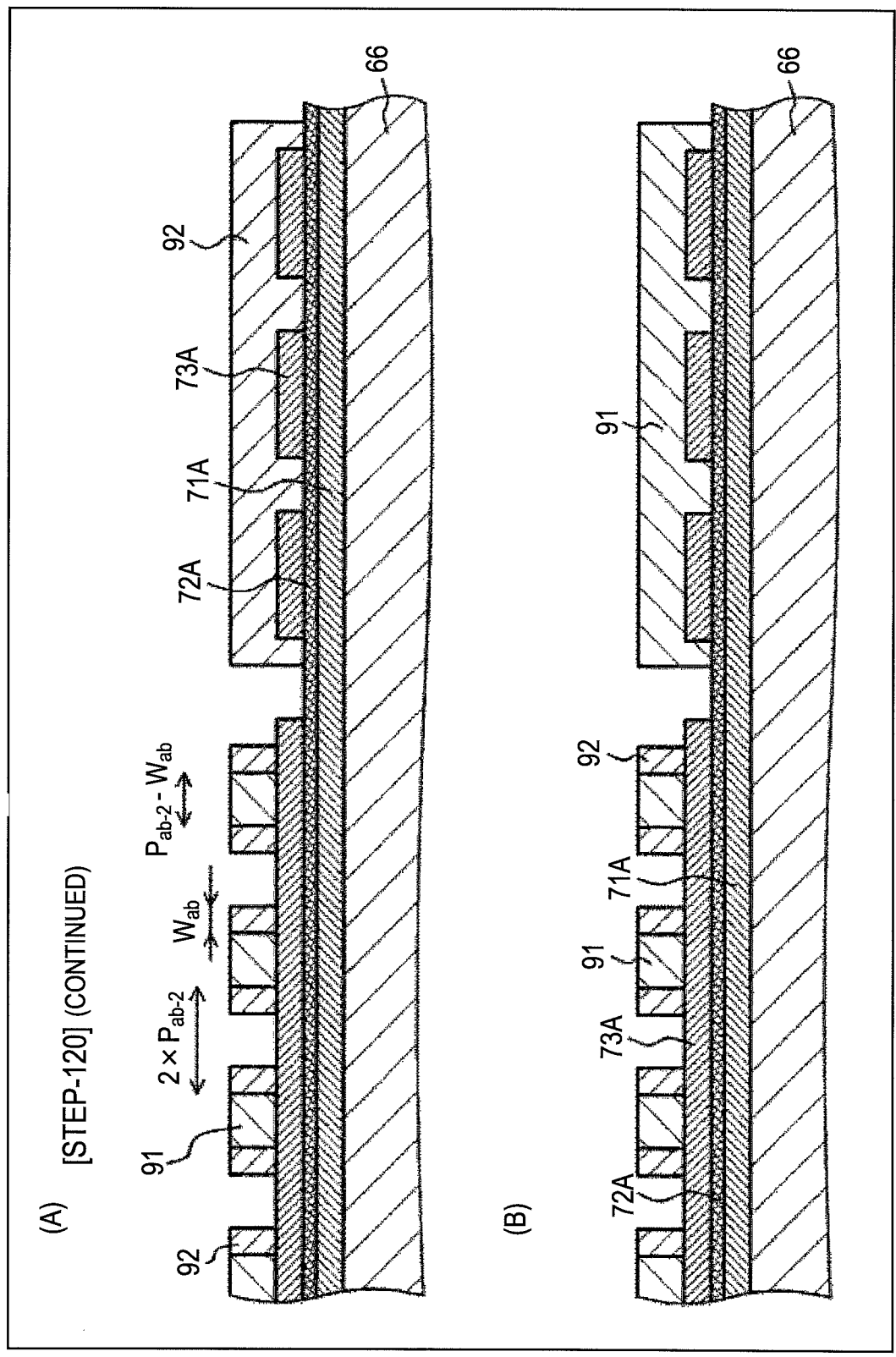

(A) and (B) in FIG. 29 are schematic partial cross-sectional views of a base and the like, for explaining a method of manufacturing a polarizing element of the first embodiment, subsequent to (A) and (B) in FIG. 28.

Figure 30:
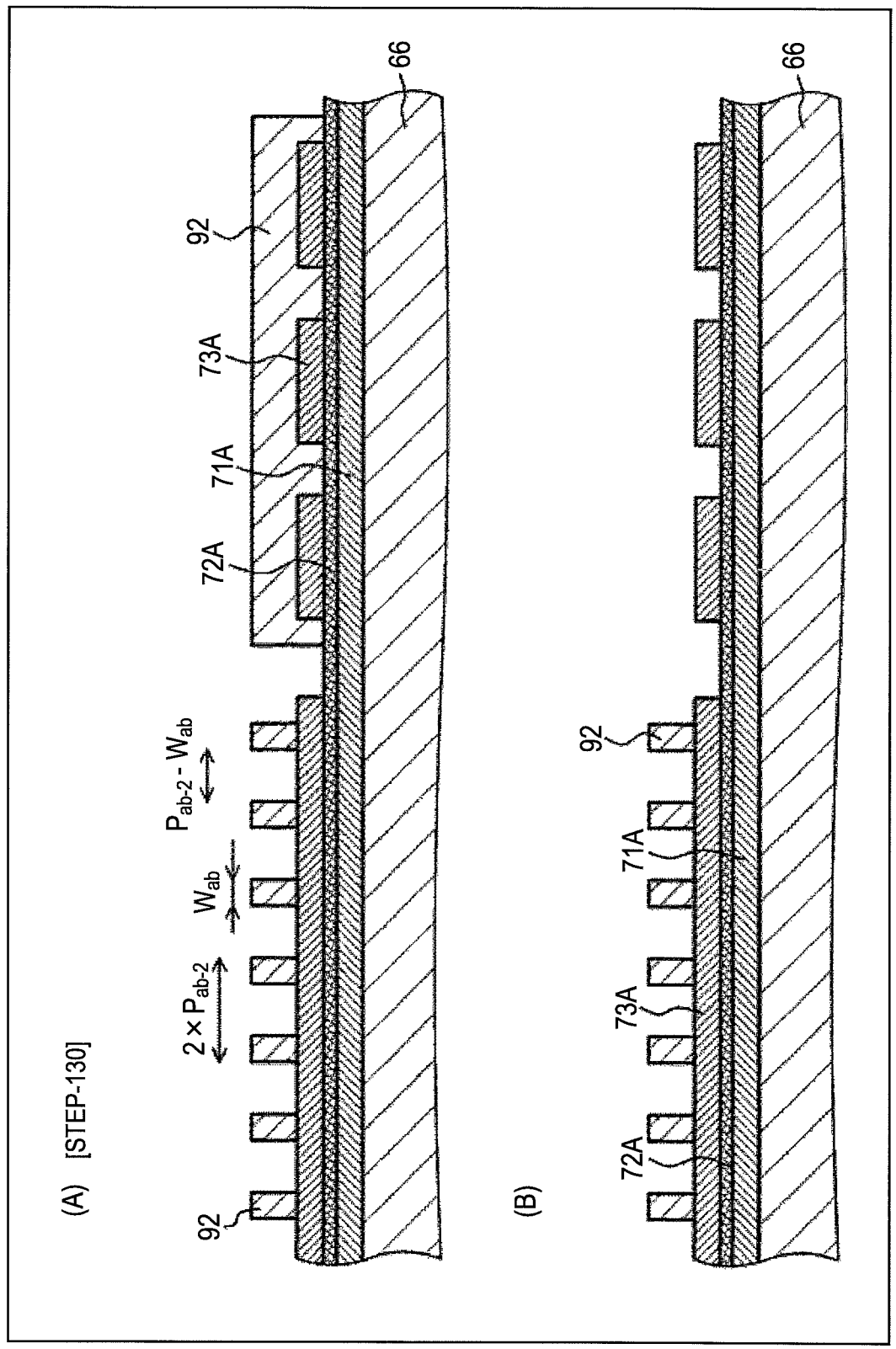

(A) and (B) in FIG. 30 are schematic partial cross-sectional views of a base and the like, for explaining a method of manufacturing a polarizing element of the first embodiment, subsequent to (A) and (B) in FIG. 29.

Figure 31:
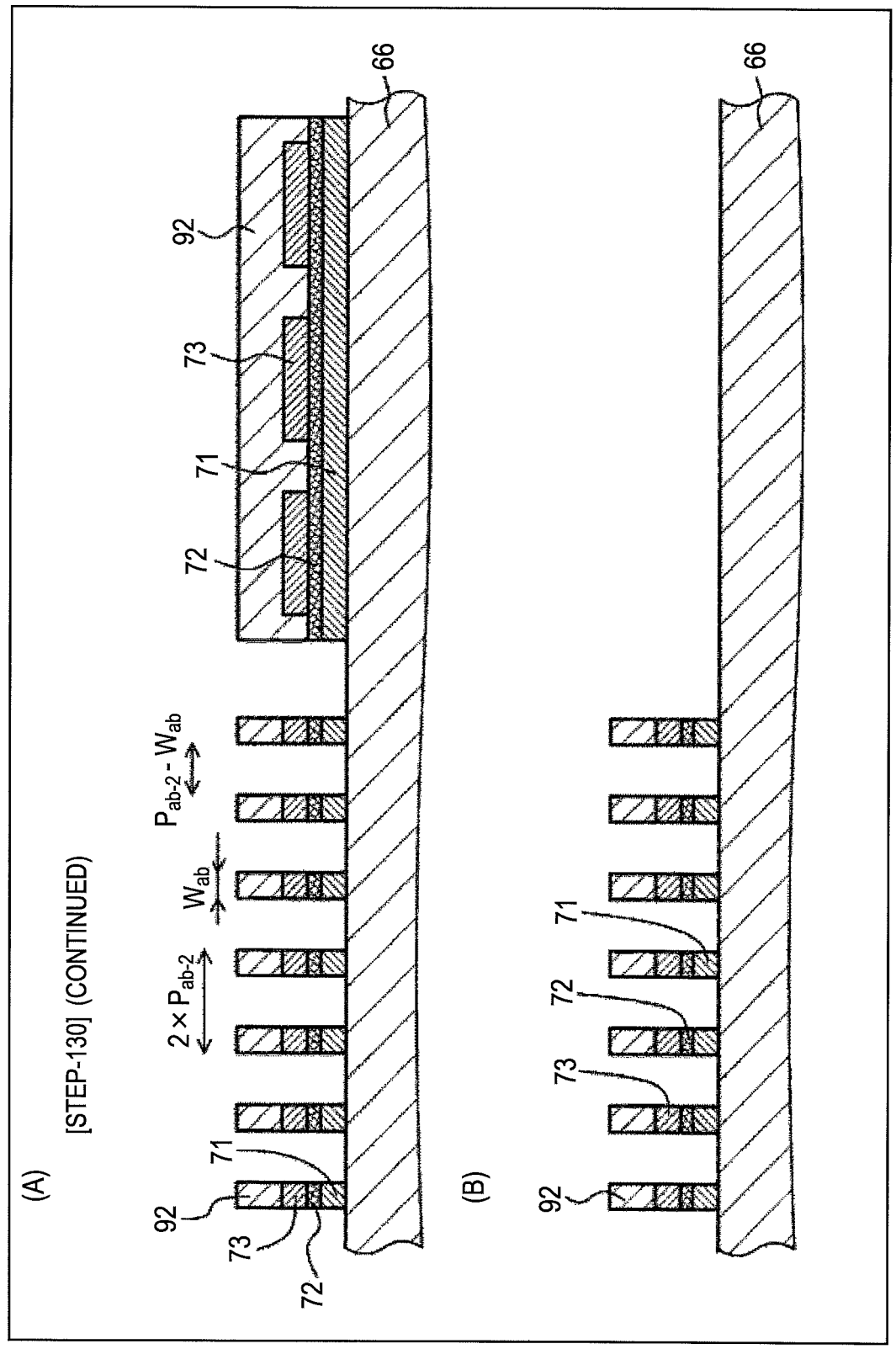

(A) and (B) in FIG. 31 are schematic partial cross-sectional views of a base and the like, for explaining a method of manufacturing a polarizing element of the first embodiment, subsequent to (A) and (B) in FIG. 30.

Figure 32:
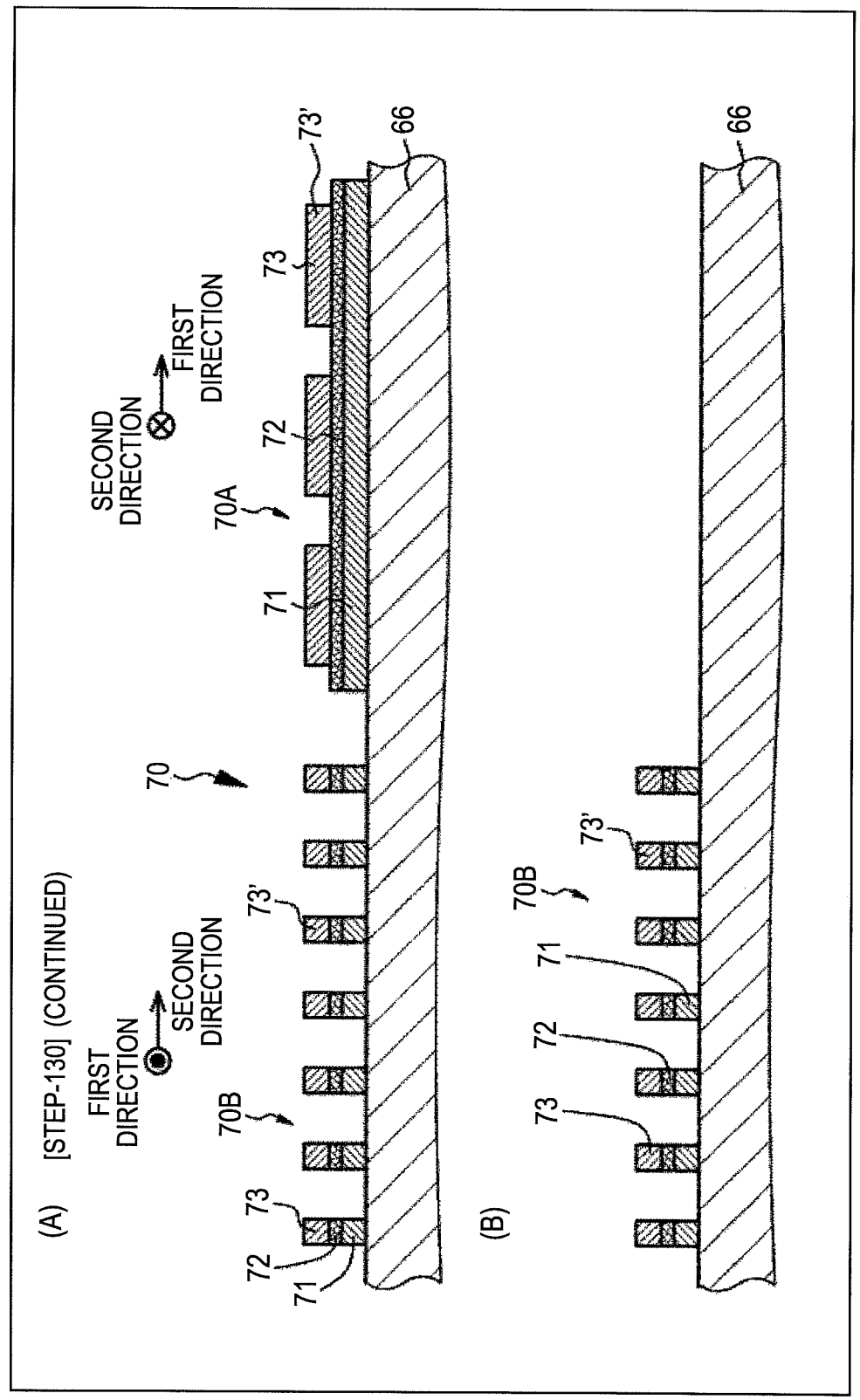

(A) and (B) in FIG. 32 are schematic partial cross-sectional views of a base and the like, for explaining a method of manufacturing a polarizing element of the first embodiment, subsequent to (A) and (B) in FIG. 31.

Figure 33:
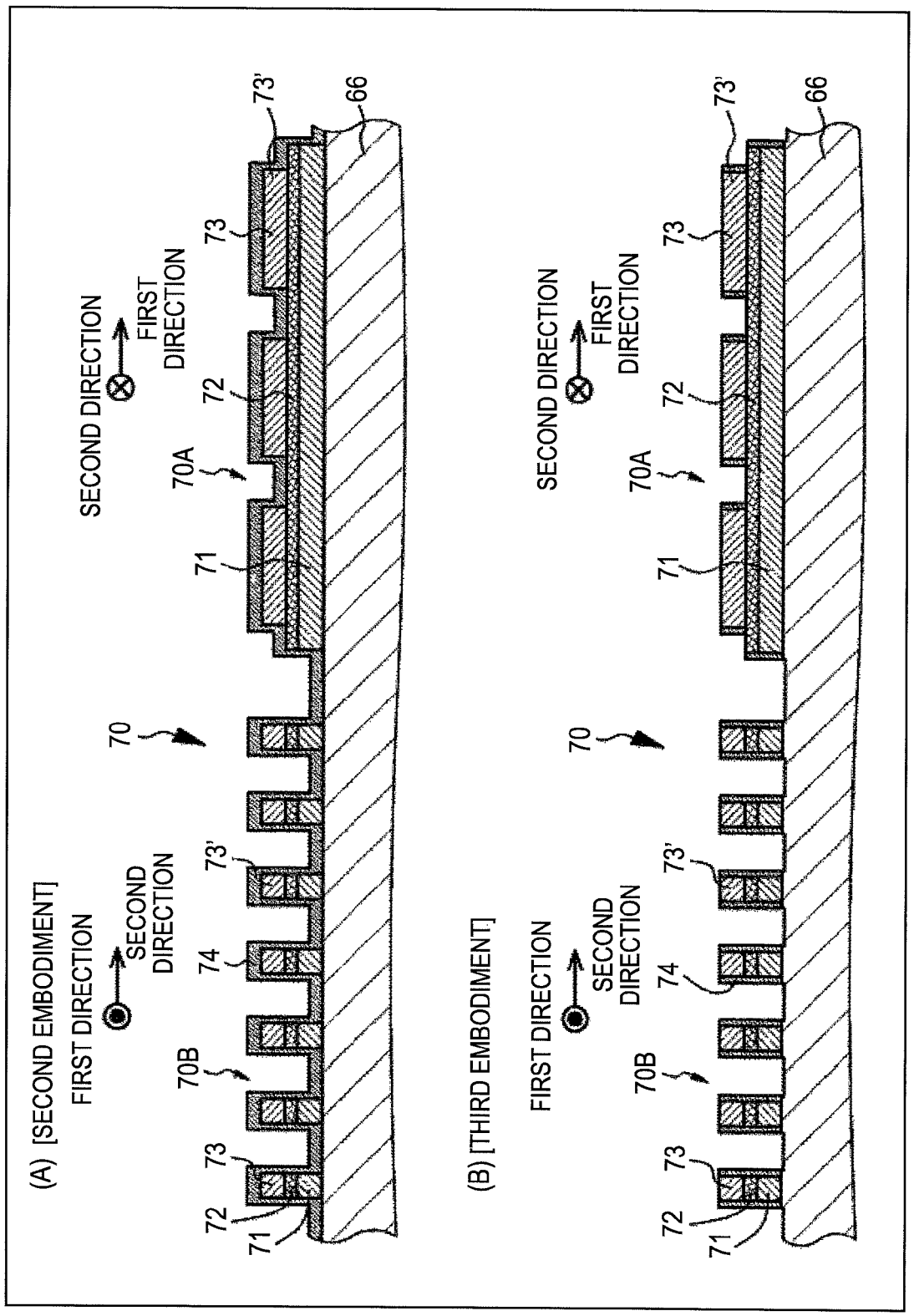

(A) and (B) in FIG. 33 are schematic partial cross-sectional views of a base and the like, for explaining a method of manufacturing a polarizing element of the second and third embodiments.

Figure 34:
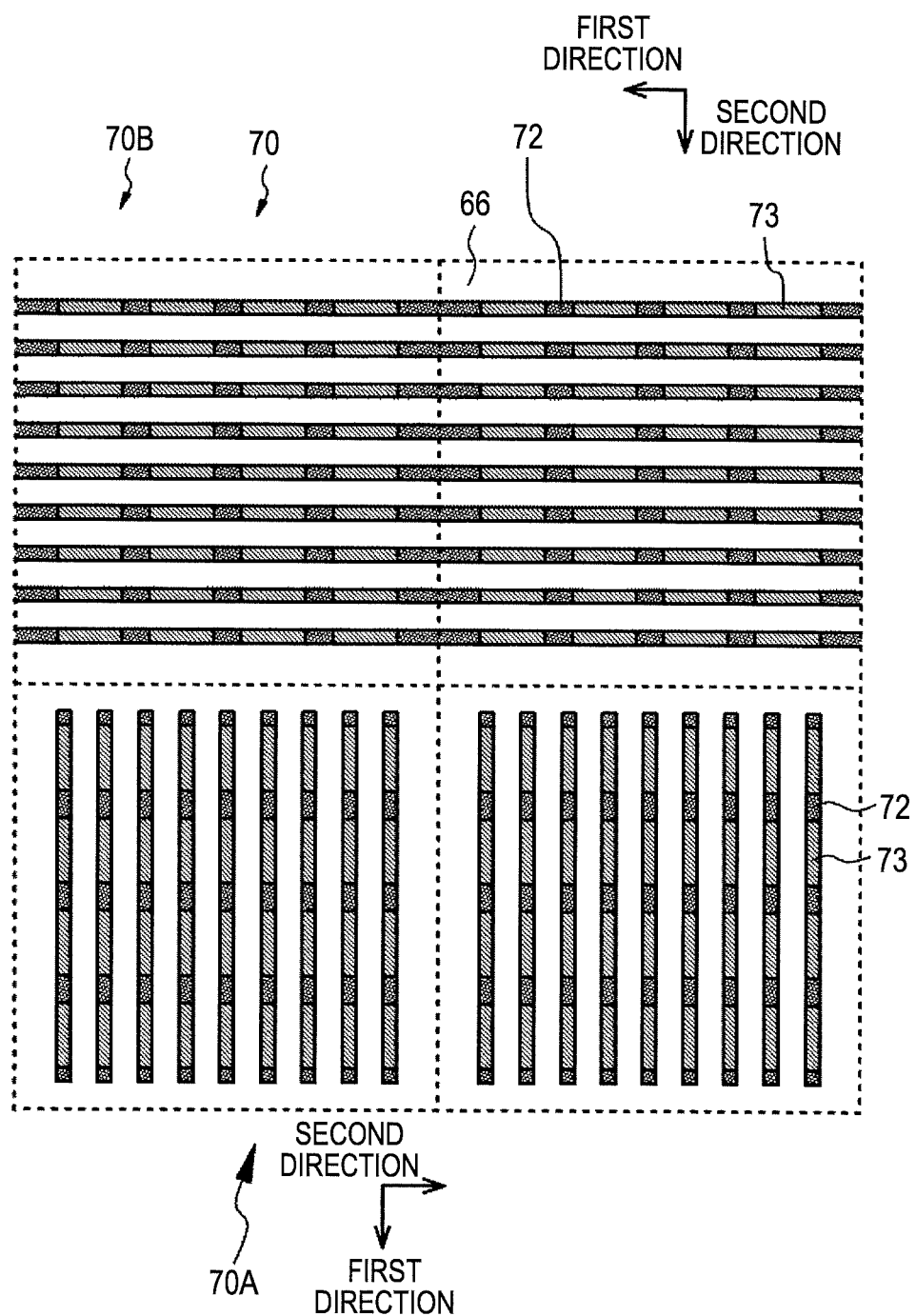

FIG. 34 is a schematic partial plan view of a solid-state imaging element when reflecting layers are not separated between solid-state imaging elements adjacent in the extension direction of a stripe-shaped reflecting layer.

Figure 35:
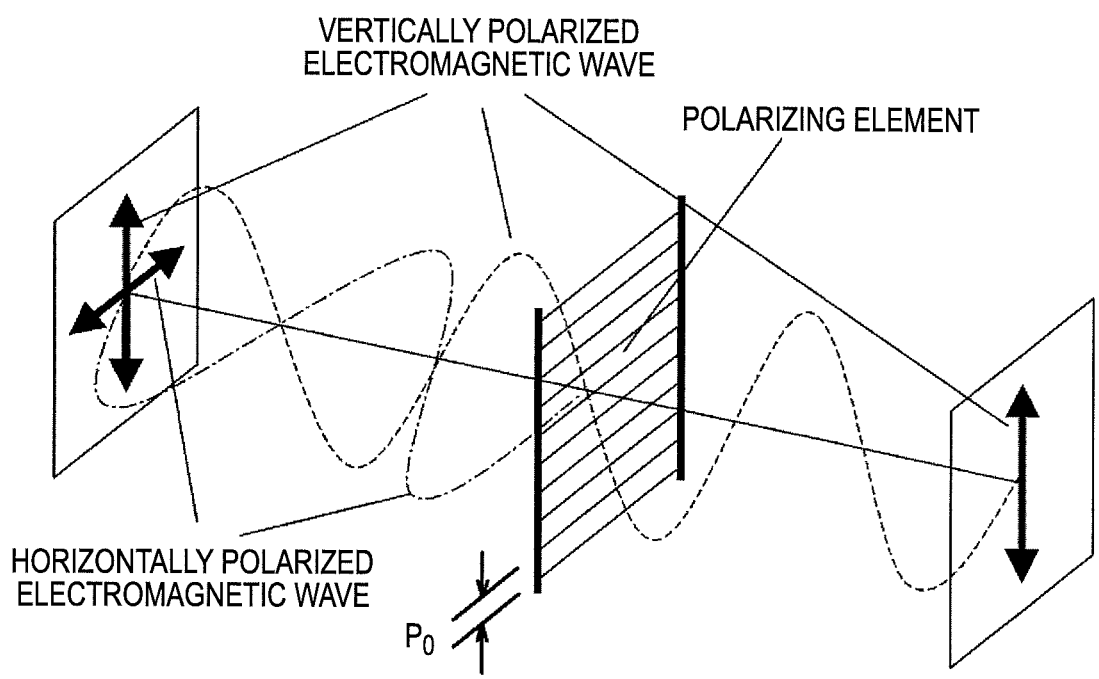

FIG. 35 is a conceptual diagram for explaining light passing through a wire grid polarizer and the like.

DESCRIPTION OF EMBODIMENTS

Hereinafter, the present invention will be described based on embodiments with reference to the drawings. However, the present invention is not limited to the embodiments, and various numerical values and materials mentioned in the embodiments are exemplary. The description will be given in the following order.

1. Overall Description of Solid-State Imaging Element, Solid-State Imaging Device, Imaging Apparatus, and Polarizing Element Manufacturing Method of Present Invention 2. First Embodiment (Solid-State Imaging Element, Solid-State Imaging Device, ImagingApparatus, and Polarizing Element Manufacturing Method of Present Invention)

3. Second Embodiment (Modification of Polarizing Element Manufacturing Method of First Embodiment)

4. Third Embodiment (Modification of Polarizing Element Manufacturing Method of Second Embodiment)

5. Fourth Embodiment (Modification of First Embodiment)
6. Fifth Embodiment (Modification of Solid-State Imaging Device of Present Invention)
7. Sixth Embodiment (Modification of Solid-State Imaging Device of Fifth Embodiment)
8. Seventh Embodiment (Another Modification of Solid-State Imaging Device of Fifth Embodiment)
9. Eighth Embodiment (Still Another Modification of Solid-State Imaging Device of Fifth Embodiment)
10. Ninth Embodiment (Still Another Modification of Solid-State Imaging Device of Fifth Embodiment)
11. Tenth Embodiment (Still Another Modification of Solid-State Imaging Device of Fifth Embodiment)
12. Eleventh Embodiment (Still Another Modification of Solid-State Imaging Device of Fifth Embodiment)
13. Twelfth Embodiment (Modification of Eleventh Embodiment) and Alternative Embodiment
Overall Description of Solid-State Imaging Element, Solid-State Imaging Device, Imaging Apparatus, and Polarizing Element Manufacturing Method of Present Invention In a polarizing element of an solid-state imaging element of the present invention, a polarizing element of a solid-state imaging device of the present invention, a polarizing element of an imaging apparatus of the present invention, or a polarizing element obtained by a polarizing element manufacturing method of the present invention, the extension direction of a stripe-shaped reflecting layer may be identical to the polarization orientation where light is to be extinct, and the repetition direction of the stripe-shaped reflecting layer may be identical to the polarization orientation where light is to be transmitted. That is, the reflecting layer has the function of a wire grid polarizer, so that among the light components incident to the polarizing element, polarized wave (either TE wave (S wave) or TM wave (P wave)) having an electric field component in a direction parallel to the extension direction of the reflecting layer is attenuated, and polarized wave (either TE wave (S wave) or TM wave (P wave)) having an electric field component in a direction (the repetition direction of the stripe-shaped reflecting layer) orthogonal to the extension direction of the reflecting layer is allowed to pass therethrough. That is, the extension direction of the reflecting layer is an optical absorption axis of the polarizing element, and the direction orthogonal to the extension direction of the reflecting layer is an optical transmission axis of the polarizing element.

In the polarizing element of the solid-state imaging element of the present invention including the preferred configuration, the polarizing element of the solid-state imaging device of the present invention, or the polarizing element of the imaging apparatus of the present invention including the preferred configuration, it is desirable that the length ($L_{rf}$) of the reflecting layer in the extension direction of the stripe-shaped reflecting layer is smaller than the length ($L_{id}$) of the solid-state imaging element along the extension direction of the stripe-shaped reflecting layer.

In the solid-state imaging element of the present invention including the preferred configuration and aspect, the solid-state imaging element of the solid-state imaging device of the present invention including the preferred configuration and aspect, or the solid-state imaging element of the imaging apparatus of the present invention including the preferred configuration and aspect, an on-chip lens may be disposed above the photoelectric conversion element, and the polarizing element may be disposed above the on-chip lens. This configuration is sometimes referred to as "solid-state imaging element A of the present invention" for convenience.

In the solid-state imaging element A of the present invention, when the distance in an optical axis direction between the polarizing element and the on-chip lens is D, the amount of sagging of the on-chip lens is S, a refractive index of a medium present between the polarizing element and the on-chip lens is n1, the width of a gap present between adjacent polarizing elements is 2×R, and the maximum value of an incidence angle of light into the polarizing element is $\theta_{in\text{-}max}$, the following relation is satisfied.

$$R \geq (D+S) \times \tan\,[\sin^{-1}\{\sin(\theta_{in\text{-}max})/n_1\}] \quad (1)$$

By satisfying the expression (1) and more specifically by setting the value of "R" so as to satisfy the expression (1), it is possible to prevent a leakage (polarization crosstalk) of light to adjacent solid-state imaging elements. In the solid-state imaging element A of the present invention including the preferred configuration, a light blocking layer formed, for example, of chromium (Cr), copper (Cu), aluminum (Al), or tungsten (W) may be formed in a region within a plane positioned between the on-chip lens and the polarizing element and a region positioned between adjacent on-chip lenses. In this way, it is possible to prevent a leakage (polarization crosstalk) of light to adjacent solid-state imaging elements more efficiently. In addition, in the solid-state imaging element A of the present invention including the preferred configuration, a planarization layer formed, for example, of a transparent resin (for example, an acrylic resin) and an interlayer insulating layer formed of an inorganic material such as a silicon oxide film functioning as the base of the process of a polarizing element manufacturing step may be formed between the on-chip lens and the polarizing element in that order from the on-chip lens side between the on-chip lens side and the polarizing element. In addition, in the solid-state imaging element A of the present invention including the preferred configuration, a wavelength selecting layer (specifically, a known color filter layer, for example) may be disposed between the photoelectric conversion element and the on-chip lens.

Alternatively, in the solid-state imaging element of the present invention including the preferred configuration and aspect, the solid-state imaging element of the solid-state imaging device of the present invention including the preferred configuration and aspect, or the solid-state imaging element of the imaging apparatus of the present invention including the preferred configuration and aspect, the on-chip lens may be disposed above the photoelectric conversion element, and the polarizing element may be formed between the photoelectric conversion element and the on-chip lens. This configuration is sometimes referred to as "solid-state imaging element B of the present invention" for convenience.

In the solid-state imaging element B of the present invention, a wavelength selecting layer (specifically, a known color filter layer, for example) may be disposed between the on-chip lens and the polarizing element. By employing such a configuration, it is possible to optimize the polarizing elements independently in the wavelength band of transmitted light of the respective polarizing elements and to realize a further lower reflectance in the entire visible light range. In addition, in the solid-state imaging element B of the present invention including the preferred configuration, when a formation pitch (of longitudinal direction) of segments constituting the light absorption layer in the extension direction of the stripe-shaped reflecting layer is $P_{ab\text{-}1}$ and the length of the segment of the light absorption layer in the extension direction of the stripe-shaped reflecting layer is $L_{ab}$, the values $P_{ab\text{-}1}$ and $L_{ab}$ may be determined depending on the wavelength of light passing through the wavelength selecting layer. In this way, it is possible to achieve a structure having a further lower reflectance of the polarizing element in the wavelength range of light incident to the solid-state imaging element.

In the polarizing element of the solid-state imaging element of the present invention including the preferred configurations and aspects, the polarizing element of the solid-state imaging device of the present invention including the preferred configurations and aspects, the polarizing element of the imaging apparatus of the present invention including the preferred configurations and aspects, or the polarizing element obtained by the polarizing element manufacturing method of the present invention including the preferred configuration, when a formation pitch of the segments of the light absorption layer in the extension direction of the stripe-shaped reflecting layer is $P_{ab-1}$, a formation pitch of the segments of the light absorption layer in the repetition direction of the stripe-shaped reflecting layer is $P_{ab-2}$, the shortest wavelength of light incident to the polarizing element is $\lambda_{min}$, a refractive index of a medium through which light incident to the polarizing element passes is $n_0$, and the maximum value of an incidence angle of light into the polarizing element is $\theta_{in-max}$, the following relation may be satisfied.

$$(P_{ab-1}^2 + P_{ab-2}^2)^{1/2} \leq [(\lambda_{min}/n_0) \times \cos(\theta_{in-max})] \quad (2)$$

By determining the value of ($P_{ab-1}$, $P_{ab-2}$), it is possible to prevent the occurrence of diffracted light from the segments of the light absorption layer formed periodically and to prevent a leakage of unnecessary light to the adjacent solid-state imaging elements.

In the polarizing element of the solid-state imaging element of the present invention including the preferred configurations and aspects, the polarizing element of the solid-state imaging device of the present invention including the preferred configurations and aspects, the polarizing element of the imaging apparatus of the present invention including the preferred configurations and aspects, or the polarizing element obtained by the polarizing element manufacturing method of the present invention including the preferred configuration, when a formation pitch of the segments of the light absorption layer in the extension direction of the stripe-shaped reflecting layer is $P_{ab-1}$ and the length thereof is $L_{ab}$, the following relation may be satisfied.

$$0.5 \leq (L_{ab}/P_{ab-1}) < 1 \quad (3)$$

In addition, in the solid-state imaging element of the solid-state imaging device of the present invention including the preferred configurations and aspects or the solid-state imaging element of the imaging apparatus of the present invention including the preferred configurations and aspects, the extension direction of the stripe-shaped reflecting layer may be at an angle of 45° or 135° with respect to an arrangement direction of a plurality of solid-state imaging elements.

In the polarizing element of the solid-state imaging element of the present invention including the preferred configurations and aspects, the polarizing element of the solid-state imaging device of the present invention including the preferred configurations and aspects, the polarizing element of the imaging apparatus of the present invention including the preferred configurations and aspects, or the polarizing element obtained by the polarizing element manufacturing method of the present invention including the preferred configuration, the reflecting layer may be formed of a metallic material, an alloy material, or a semiconductor material, and the light absorption layer may be formed of a metallic material, an alloy material, or a semiconductor material.

When a metallic material or an alloy material (hereinafter sometimes referred to as "metallic material or the like") constituting the polarizing element meets outside air, corrosion resistance of the metallic material or the like deteriorates due to attachment of moisture or organic materials from the outside air. Thus, the long-term reliability of the solid-state imaging element may deteriorate. In particular, when moisture adheres on a stacked structure of a metallic material or the like, an insulating material, and a metallic material or the like, since $CO_2$ and $O_2$ are dissolved in the moisture, it acts as electrolytic solution. Thus, a local cell may be formed between two kinds of metals. When such a phenomenon occurs, a reductive reaction such as generation of hydrogen progresses on a cathode (positive electrode) side, and an oxidative reaction progresses on an anode (negative electrode) side, whereby an abnormal precipitation of the metallic material or the like or a change in shape of the polarizing element occurs. As a result, the expected performance of the polarizing element and the solid-state imaging element may be degraded. For example, when aluminum (Al) is used for the reflecting layer, an abnormal precipitation of aluminum as shown by the following reaction formula may occur.

$$Al \rightarrow Al^{3+} + 3e^-$$

$$Al^{3+} + 3OH^- \rightarrow Al(OH)_3$$

Therefore, in the polarizing element of the solid-state imaging element of the present invention including the preferred configurations and aspects, the polarizing element of the solid-state imaging device of the present invention including the preferred configurations and aspects, the polarizing element of the imaging apparatus of the present invention including the preferred configurations and aspects, or the polarizing element obtained by the polarizing element manufacturing method of the present invention including the preferred configuration, it is preferable that a protective film is formed on the polarizing element. In this case, it is more preferable that the polarizing element is formed on the base, and the protective film is not formed in a portion of the base positioned between the polarizing element and the polarizing element. Moreover, in the polarizing element manufacturing method of the present invention including the preferred configuration, the protective film may be formed on the polarizing element and the base subsequent to the step (c). In this case, the protective film on the base may be removed after forming the protective film on the polarizing element and the base.

Various parameters described above will be summarized as follows. Here, the extension direction of the stripe-shaped reflecting layer (that is, having a line-and-space pattern) will be referred to as a "first direction" for convenience, and the repetition direction of the stripe-shaped reflecting layer (the direction orthogonal to the extension direction of the stripe-shaped reflecting layer) will be referred to as a "second direction" for convenience.

$L_{rf}$: length of reflecting layer in first direction
$P_{ab-1}$: formation pitch of segments of light absorption layer in first direction
$P_{ab-2}$: formation pitch of segments of light absorption layer in second direction
$L_{ab}$: length of segment of light absorption layer in first direction
$W_{ab}$: width of segment of light absorption layer along second direction
$L_{id}$: length of solid-state imaging element along first direction
D: distance between polarizing element and on-chip lens S: amount of sagging of on-chip lens R: half-width value of gap present between adjacent polarizing elements $n_0$: refractive index of medium through which light incident to polarizing element passes $n_1$: refractive index of medium present between polarizing element and on-chip lens $\lambda_{min}$: shortest wavelength of light incident to polarizing element $\theta_{in\text{-}max}$: maximum value of incidence angle of incident light to polarizing element, including NA of incident light The segment of the light absorption layer is a layer having a rectangular island shape in a plan view thereof (that is, having a rectangular island pattern) such that the long side thereof is parallel to the first direction and the short side thereof is parallel to the second direction and has optical anisotropy. That is, $$1 < L_{ab}/W_{ab} \quad (4)$$

Preferably, $$2 \leq L_{ab}/W_{ab} \leq 7 \quad (4')$$

That is, the extension direction of the long side of the rectangle is the optical absorption axis of the polarizing element, and the extension direction of the short side is the optical transmission axis of the polarizing element. An appropriate aspect ratio ($L_{ab}/W_{ab}$) of the segment of the light absorption layer having an absorptive effect with respect to wavelength in the visible light region depends on the wavelength of incident light and can be calculated using simple Rayleigh approximation. For example, when the aspect ratio of the segment of the light absorption layer is about 5:1, the maximum extinction ratio and a low reflectance are obtained with a wavelength of about 500 nm. Thus, since absorption efficiency increases with a relatively large aspect ratio in the visible light region, it is preferable that the expression (4) and preferably the expression (4') is satisfied. The thickness of the light absorption layer may be in the range of $1 \times 10^{-8}$ m and $1.0 \times 10^{-7}$ m. Moreover, the formation pitch $P_{ab\text{-}2}$ of the light absorption layer in the second direction and the width $W_{ab}$ of the light absorption layer along the second direction may satisfy the following relation:

$$0.1 \leq W_{ab}/P_{ab\text{-}2} \leq 0.9$$

preferably $$0.2 \leq W_{ab}/P_{ab\text{-}2} < 0.7$$

The thickness of the reflecting layer may be in the range of 0.01 μm to 1 μm. The number of stripe-shaped reflecting layers in the polarizing element corresponding to one photoelectric conversion element may be 20 or more. Although the solid-state imaging device of the present invention or the imaging apparatus of the present invention includes two or more kinds of polarizing elements having different polarization orientations, specifically, it is preferable that the transmission axes of adjacent solid-state imaging elements are orthogonal to each other.

Examples of the inorganic material constituting the reflecting layer (reflecting layer-forming layer) functioning as the wire grid polarizer include a metallic material such as aluminum (Al), silver (Ag), gold (Au), copper (Cu), platinum (Pt), molybdenum (Mo), chromium (Cr), titanium (Ti), nickel (Ni), tungsten (W), iron (Fe), silicon (Si), germanium (Ge), or tellurium (Te), an alloy material including these metals, and a semiconductor material. Alternatively, the reflecting layer may be formed of an inorganic material layer or a resin layer of which the surface reflectance is increased by coloring, for example.

Moreover, examples of the material constituting the light absorption layer (light absorption layer-forming layer) include a metallic material, an alloy material, and a semiconductor material of which the extinction coefficient k is not zero, and that is, which has a light absorbing effect. Specific examples thereof include a metallic material such as aluminum (Al), silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te), or tin (Sn), an alloy material including these metals, and a semiconductor material. Specific examples thereof also include a silicide-based material such as $FeSi_2$ (particularly, $\beta\text{-}FeSi_2$), $MgSi_2$, $NiSi_2$, $EaSi_2$, $CrSi_2$, $CoSi_2$, and the like. In particular, by using aluminum or an alloy thereof, or a semiconductor material including $\beta\text{-}FeSi_2$, germanium, or tellurium as the material constituting the light absorption layer, it is possible to obtain a high contrast (high extinction ratio) in a visible light range. In order to provide polarization characteristics in a wavelength region other than the visible light region, for example, an infrared region, it is preferable to use silver (Ag), copper (Cu), gold (Au), or the like as the material constituting the light absorption layer. This is because the resonance wavelength of these matals is near the infrared region.

The reflecting layer-forming layer and the light absorption layer-forming layer can be formed based on various chemical vapor deposition methods (CVD methods), a coating method, various physical vaporation deposition methods (PVD methods) including a sputtering method and a vacuum evaporation method, and a known method such as a sol-gel method, a plating method, an MOCVD method, or an MBE method. Moreover, examples of a method of patterning the reflecting layer-forming layer and the light absorption layer-forming layer include a combination of a lithography technique and an etching technique (for example, an anisotropic dry etching technique and a physical etching technique using carbon tetrafluoride gas, sulfur hexafluoride gas, trifluoromethane gas, xenon difluoride gas, or the like), and a so-called lift-off technique. Moreover, examples of the lithography technique include a photolithography technique (a lithography technique using a g-ray or i-ray of a high-pressure mercury lamp, a KrF excimer laser, an ArF excimer laser, an EUV, or the like as a light source, and a liquid immersion lithography technique thereof, an electron-beam lithography technique, and an X-ray lithography). Alternatively, the reflecting layer and the light absorption layer can be formed based on a microfabrication technology using an ultra-short-duration pulse laser, such as a femtosecond laser, or a nanoimprinting method.

Examples of the material constituting the insulating layer (insulating layer-forming layer) and the interlayer insulating layer include an insulating material which is transparent to incident light and does not have light absorbing characteristics. Specific examples thereof include $SiO_X$-based materials (materials constituting a silicon-based oxide film) such as $SiO_2$, NSG (Non-doped Silicated Glass), BPSG (Borophosphosilicate glass), PSG, BSG, PbSG, AsSG, SbSG, or SOG (Spin-On Glass), SiN, SiON, SiOC, SiOF, SiCN, a low-dielectric constant insulating material (for example, fluorocarbon, cyclic perfluorocarbon polymer, benzocyclobutene, cyclic fluorocarbon resin, polytetrafluoroethylene, amorphous tetrafluoroethylene, polyaryl ether, aryl ether fluoride, polyimide fluoride, organic SOG, parylene, fluorinated fullerene, amorphous carbon), a polyimide-based resin, a fluorine-based resin, Silk (trademark of The Dow Chemical Co.; a coating-type low-dielectric constant interlayer insulating film material), and Flare (trademark of Honeywell Electronic Materials Co.; a polyaryl ether (PAE)-based material). These materials can be used solely or appropriately in combinations. The insulating layer-forming layer can be formed based on various CVD methods, a coating method, various PVD methods including a sputtering method and a vacuum evaporation method, various printing methods such as a screen printing method, and a known method such as a sol-gel method. The insulating layer functions as a base layer of the light absorption layer and is formed for the purpose of adjusting the phase of polarized light reflected from the light absorption layer and polarized light having passed through the light absorption layer and reflected from the reflecting layer and decreasing the reflectance by an interference effect. Thus, the insulating layer preferably has such a thickness that the phase of light after one round trip is shifted by a half wavelength. Since the light absorption layer has a light absorbing effect, the reflected light is absorbed therein. Therefore, even when the thickness of the insulating layer is not optimized as described above, it is possible to attain an improvement of the extinction ratio. Therefore, the thickness of the insulating layer may be determined based on a balance between practically desired polarization characteristics and actual manufacturing steps. For example, the thickness of the insulating layer may be in the range of $1 \times 10^{-9}$ m to $1 \times 10^{-7}$ m, and more preferably, in the range of $1 \times 10^{-8}$ m to $8 \times 10^{-8}$ m. Moreover, the refractive index of the insulating layer is not limited to a value larger than 1.0 but is preferably set to 2.5 or lower.

The color filter layer may be a filter layer that transmits light of particular wavelengths, such as those of red, green, blue, cyan, magenta, and yellow. The color filter layer may be formed of not only an organic-material-based color filter layer using an organic compound such as pigment or colorant, but also a wavelength selective element employing photonic crystals or plasmon (a color filter layer having a conductor lattice structure in which a latticed hole structure is provided in a conductor thin film; for example, see JP-A-2008-177191), or a thin film formed of inorganic material such as amorphous silicon.

The base may be a silicon semiconductor substrate on which the photoelectric conversion element is formed or a silicon semiconductor substrate on which the photoelectric conversion element, the on-chip lens, and the like are formed.

In the solid-state imaging device and the imaging apparatus of the present invention, one pixel is made up of a plurality of sub-pixels. Each sub-pixel includes one solid-state imaging element. The relation between pixels and sub-pixels will be described later.

In the polarizing element of the solid-state imaging element of the present invention including the preferred configurations and aspects, the polarizing element of the solid-state imaging device of the present invention including the preferred configurations and aspects, the polarizing element of the imaging apparatus of the present invention including the preferred configurations and aspects, or the polarizing element obtained by the polarizing element manufacturing method of the present invention including the preferred configuration (these polarizing elements will be sometimes collectively referred to as "polarizing element of the present invention), light is incident to the light absorption layer. The polarizing element attenuates polarized wave (either TE wave (S wave) or TM wave (P wave)) having an electric field component parallel to the first direction and transmits polarized wave (either TE wave (S wave) or TM wave (P wave)) having an electric field component parallel to the second direction by using four selective light absorbing actions on polarized wave based on transmission, reflection, interference, and optical anisotropy of light. That is, one polarized wave (for example, TE wave) is attenuated by a selective light absorbing action on polarized wave based on the optical anisotropy of the segment of the light absorption layer having shape anisotropy. The stripe-shaped reflecting layer functions as a wire grid polarizer and reflects one polarized wave (for example, TE wave) having passed through the light absorption layer and the insulating layer. In this case, when the insulating layer is configured such that the phase of one polarized wave (for example, TE wave) having passed through the light absorption layer and reflected from the reflecting layer is shifted by a half wavelength, one polarized wave (for example, TE wave) reflected from the reflecting layer is cancelled and attenuated by interference with one polarized wave (for example, TE wave) reflected from the light absorption layer. In this way, it is possible to selectively attenuate one polarized wave (for example, TE wave). In this case, as described above, even when the thickness of the insulating layer is not optimized, it is possible to realize an improvement of the contrast. Therefore, the thickness of the insulating layer may be determined based on a balance between practically desired polarization characteristics and actual manufacturing steps.

As described above, the protective film may be formed on the polarizing element of the present invention (specifically, at least on the side surface of the polarizing element, that is, on the side surface of the polarizing element or the side surface and the top surface of the polarizing element). The thickness of the protective film may be in a range such that polarization characteristics are not affected. However, since the optical characteristics of the segments constituting the light absorption layer are affected by the refractive indices of the surrounding layers, the polarization characteristics may be changed due to formation of the protective film. Moreover, since the reflectance to incident light is also changed depending on an optical thickness (which is (refractive index)×(protective film thickness)) of the protective film, the material and thickness of the protective film may be selected in view of the above. The thickness of the protective film may be 15 nm or smaller. Alternatively, the thickness of the protective film may be ¼ or less of the length (distance) of a space (the portion of the base positioned between the polarizing element and the polarizing element) between adjacent polarizing elements. As the material constituting the protective film, a material of which the refractive index is 2 or smaller and the extinction coefficient is close to zero is preferred. Examples of the material include an insulating material such as $SiO_2$ including TEOS—$SiO_2$, SiON, SiN, SiC, SiOC, or SiCN and a metal oxide such as aluminum oxide ($AlO_x$), hafnium oxide ($HfO_x$), zirconium oxide ($ZrO_x$), or tantalum oxide ($TaO_x$). Alternatively, perfluorodecyl trichlorosilane or octadecyl trichlorosilane may be used. By providing the protective film, it is possible to improve moisture resistance of the polarizing element and to improve the reliability. Although the protective film can be formed by various CVD methods, a coating method, various PVD methods including a sputtering method and a vacuum evaporation method, and a known process such as a sol-gel method, it is preferable to employ a so-called Atomic Layer Deposition (ALD) method. By employing the ALD method, it is possible to form a thin protective film conformally on the polarizing element. Although the protective film may be formed on the entire surface of the polarizing element, it is more preferable that the protective film is formed only on the side surface of the polarizing element but is not formed on a base positioned between the polarizing element and the polarizing element. By forming the protective film so as to cover the side surface which is an exposed portion of the metallic material or the like constituting the polarizing element, it is possible to block moisture and an organic material in the air and to reliably suppress the occurrence of corrosion of the metallic material or the like constituting the polarizing element and the occurrence of a problem of abnormal precipitation. Moreover, it is possible to achieve an improvement of long-term reliability of the solid-state imaging element and to provide a solid-state imaging element having an on-chip polarizing element having higher reliability.

The photoelectric conversion element of the present invention may be a CCD element, a CMOS image sensor, a CIS (Contact Image Sensor), or a CMD (Charge Modulation Device)-type signal amplification image sensor. Moreover, the solid-state imaging element may be a front-illuminated solid-state imaging element or a back-illuminated solid-state imaging element. Hereinafter, the configuration of a monocular parallax stereoscopic camera which is an application example of the present invention will be described.

In the related art, a system is proposed in which two video cameras disposed on the left and right simultaneously photograph the same subject to obtain right-eye image and left-eye image and output the obtained two images (right and left-eye images) simultaneously to thereby display a stereoscopic image. However, when two video cameras are used, the size of the apparatus increases, and it is not practical. Moreover, the baseline between two video cameras, that is, the binocular distance of a stereoscopic camera is often set to about 65 nm which corresponds to the distance between both eyes of a person regardless of the zoom ratio of a lens. In such a case, the binocular parallax increases in a zoom-up image, which compels information processing different from the usual processing to the visual system of an observer, which causes a fatigue of the eyes. Moreover, photographing a moving subject with two video cameras requires accurate synchronization control of the two video cameras, which is very difficult. Moreover, accurate control of the convergence angle is very difficult.

A stereoscopic photographing device is proposed in which polarization filters are combined so as to polarize light in an orthogonal relation in order to facilitate adjustment of a lens system for performing stereoscopic photographing so that an optical system is shared (for example, see JP-B-6-054991). Moreover, a method of performing stereoscopic photographing with an imaging apparatus made up of two lenses and one imaging means is disclosed in JP-A-2004-309868 described above.

However, in the technique disclosed in JP-B-6-054991, the outputs of two polarization filters are superimposed so as to integrate optical paths so that a lens system is shared. However, an additional polarization filter is provided to divide the optical path itself so that light is incident to different polarization filters in order to extract a right-eye image and a left-eye image at a subsequent stage. Therefore, optical loss occurs in the lens system, and it is difficult to miniaturize the device. In the technique disclosed in JP-A-2004-309868, two sets of the combination of a lens and a polarization filter are required, which complicates the device and increase the size thereof.

As described above, although the imaging apparatus of the present invention may specifically be a digital still camera, a video camera, or a camcorder, for example. The imaging apparatus of the present invention can be applied to an imaging device capable of photographing a subject as a stereoscopic image using one imaging device (hereinafter the imaging device will be referred to as "stereoscopic imaging device of the present invention").

A stereoscopic imaging device of the present invention includes:

(A) a first polarization means that polarizes light from a subject;

(B) a lens system that collects light from the first polarizing means; and (C) an imaging element array in which solid-state imaging elements are arranged in a 2-dimensional matrix form defined in the X direction and the Y direction orthogonal to the X direction, and which includes a second polarizing means on the light incident side, and which converts light collected by the lens system into an electrical signal.

The first polarizing means includes a first region and a second region arranged along the X direction.

The polarization state of first region-passing light having passed through the first region is different from the polarization state of second region-passing light having passed through the second region.

The second polarizing means includes a plurality of third regions and a plurality of fourth regions which are arranged alternately along the Y direction so as to extend in the X direction.

The polarization state of third region-passing light having passed through the third region is different from the polarization state of fourth region-passing light having passed through the fourth region.

The first region-passing light passes through the third region and arrives at the solid-state imaging element, and the second region-passing light passes through the fourth region and arrives at the solid-state imaging element, whereby the stereoscopic imaging device captures an image for obtaining a stereoscopic image in which the distance between the central point of the first region and the central point of the second region is the baseline length of a binocular parallax.

Here, the polarizing element of the present invention, the solid-state imaging element of the present invention, and the solid-state imaging device of the present invention may be applied to the second polarizing means.

As above, the stereoscopic imaging device of the present invention is an imaging device which has a simple configuration and structure and which can image a subject with one imaging device as a stereoscopic image. Since the imaging device is made up of a set of first and second polarizing means and one lens system, it is possible to provide a compact monocular imaging device having a simple configuration and structure. Moreover, since two sets of the combination of a lens and a polarization filter are not required, there will be no shift or difference in zooming, the diaphragm, focusing, the convergence angle, or the like. Furthermore, since the baseline length of a binocular parallax is relatively short, a natural stereoscopic effect can be obtained. In addition, by selectively removing the first polarizing means, it is possible to easily obtain a 2-dimension image and a 3-dimensional image.

In an imaging method using the stereoscopic imaging device of the present invention, the solid-state imaging element generates an electrical signal for obtaining a right-eye image with the first region-passing light having passed through the third region and arrived at the solid-state imaging element, the solid-state imaging element generates an electrical signal for obtaining a left-eye image with the second region-passing light having passed through the fourth region and arrived at the solid-state imaging element and outputs these electrical signals.

These electrical signals may be output at the same time and may be output alternately in a time-sequential order.

In the stereoscopic imaging device of the present invention, the first polarizing means is preferably disposed near the diaphragm of the lens system. Alternatively, the first polarizing means is preferably disposed in a portion of the lens system such that the light incident to the lens system becomes parallel light, and is in a parallel light state when it is finally collected (formed) on the solid-state imaging element. In these aspects, it is not necessary to redesign the optical system of the lens system, and the design may be mechanically (physically) changed so that the first polarizing means is fixed or removably attached to an existing lens system. When the first polarizing means is removably attached to the lens system, the first polarizing means may have a configuration and structure similar to the diaphragm blade of a lens and may be disposed in the lens system, for example. Alternatively, in the lens system, a configuration and a structure in which a member where the first polarizing means and an opening are formed is pivotably attached to a pivot shaft parallel to the optical axis of the lens system, and the member is pivoted about the pivot shaft, whereby light passing through the lens system passes through the opening or passes through the first polarizing means may be employed. Alternatively, in the lens system, a configuration and structure in which a member where the first polarizing means and an opening are formed is attached to the lens system so as to be movable in a direction orthogonal to the optical axis of the lens system, for example, and the member is moved, whereby light passing through the lens system passes through the opening or passes through the first polarizing means may be employed.

In the stereoscopic imaging device of the present invention including the preferred aspect, a central region is provided between the first and second regions of the first polarizing means, and the polarization state of central region-passing light having passed through the central region is not changed from that before it is incident to the central region. That is, the central region is in a not-covered state in relation to polarized light. Although light intensity is strong in the central region of the first polarizing means, the parallax amount is small. By employing such an aspect, it is possible to secure a sufficiently large baseline length of a binocular parallax while increasing the intensity of light received by the imaging element array. When the outer shape of the first polarizing means is made to be circular, the central region can be made to be circular, and the first and second regions may be made to be a fan shape so as to surround the central region with a central angle of 180°. Alternatively, the central region may be be made to be rhombic or square, and the first and second regions may be made to be shaped similar to a fan shape so as to surround the central region with a central angle of 180°. Alternatively, the first and second regions may be made to be strip-shaped so as to extend along the Y direction.

In the stereoscopic imaging device of the present invention including various preferred aspects, the first and second regions may be formed of a polarizer, and the direction of the electric field of the first region-passing light may be orthogonal to the direction of the electric field of the second region-passing light. In the stereoscopic imaging device of the present invention including such a configuration, the direction of the electric field of the first region-passing light may be parallel to the X direction. Alternatively, the direction of the electric field of the first region-passing light may be at the angle of 45° with respect to the X direction. In addition, in the stereoscopic imaging device of the present invention including an optional combination of these configurations, the direction of the electric field of the first region-passing light may be parallel to the direction of the electric field of the third region-passing light, and the direction of the electric field of the second region-passing light may be parallel to the direction of the electric field of the fourth region-passing light. In addition, in the stereoscopic imaging device of the present invention including an optional combination of these configurations, the extinction ratio of the polarizer may be 3 or higher and preferably 10 or higher.

Here, the "polarizer" means one which creates linearly polarized light from natural light (non-polarized light) or circularly polarized light. The polarizer constituting the first region itself may be a polarizer (polarizing plate) having a known configuration and structure. Moreover, one polarized light component of the first and second region-passing light may be mainly S wave (TE wave), and the other polarized light component of the first and second region-passing light may be mainly P wave (TM wave). The polarization states of the first and second region-passing light may be linearly polarized light and may be circularly polarized light (the rotation directions thereof are opposite to each other). In general, horizontal wave of which the vibration direction is only a certain particular direction is referred to as polarized wave, and the vibration direction thereof is referred to as a polarization direction or a polarization axis. The direction of the electric field of light is identical to the polarization direction. When the direction of the electric field of the first region-passing light is parallel to the X direction, in the first region, the extinction ratio is the ratio between a light component of which the direction of electric field is the X direction and which is included in the light passing through the first region and a light component of which the direction of electric field is the Y direction. In the second region, the extinction ratio is the ratio between a light component of which the direction of electric field is the Y direction, and which is included in the light passing through the second region and a light component of which the direction of electric field is the X direction. Moreover, when the direction of the electric field of the first region-passing light is at the angle of 45° with respect to the X direction, in the first region, the extinction ratio is the ratio between a light component of which the direction of electric field is at the angle of 45° and light component of which the direction of electric field is at the angle of 135° with respect to the X direction, and which is included in the light passing through the first region. In the second region, the extinction ratio is the ratio of which the direction of electric field is at the angle of 135° with respect to the X direction, and which is included in the light passing through the second region and a light component of which the direction of electric field is at the angle of 45° with respect to the X direction. Alternatively, the polarized light component of the first region-passing light is mainly P wave, and the polarized light component of the second region-passing light is mainly S wave, for example, in the first region, the extinction ratio is the ratio between the P-polarized light component and the S-polarized light component included in the first region-passing light. In the second region, the extinction ratio is the ratio between the S-polarized light component and the P-polarized light component included in the second region-passing light.

In the stereoscopic imaging device of the present invention including various preferred aspects and configurations, the solid-state imaging element may have a configuration in which a color filter, an on-chip lens, and the polarizing element of the present invention are stacked on the photoelectric conversion element, and the polarizing element of the present invention constitutes the third or fourth region. Alternatively, the solid-state imaging element may have a configuration in which the polarizing element of the present invention, a color filter, and an on-chip lens are stacked on the photoelectric conversion element, and the polarizing element of the present invention constitutes the third or fourth region. Alternatively, the solid-state imaging element may have a configuration in which an on-chip lens, a color filter, and the polarizing element of the present invention are stacked on the photoelectric conversion element, and the polarizing element of the present invention constitutes the third or fourth region. The stacked order of the on-chip lens, the color filter, and the polarizing element of the present invention may be changed appropriately. In these aspects, when the direction of the electric field of the first region-passing light is parallel to the X direction, the extension direction (first direction) of the reflecting layer constituting the polarizing element of the present invention may be parallel to the X or Y direction. Specifically, in the polarizing element of the present invention constituting the third region, the extension direction (first direction) of the reflecting layer is parallel to the Y direction. In the polarizing element of the present invention constituting the fourth region, the extension direction (first direction) of the reflecting layer is parallel to the X direction. Alternatively, in these aspects, when the direction of the electric field of the first region-passing light is at the angle of 45° with respect to the X direction, the extension direction (first direction) of the reflecting layer constituting the polarizing element of the present invention may be at the angle of 45° with respect to the X or Y direction. Specifically, in the polarizing element of the present invention constituting the third region, the extension direction (first direction) of the reflecting layer is at the angle of 135° with respect to the X direction. In the polarizing element of the present invention constituting the fourth region, the extension direction (first direction) of the reflecting layer is at the angle of 45° with respect to the X direction.

In addition, in the stereoscopic imaging device of the present invention including various preferred aspects and configurations, it is preferable that a ¼-wavelength plate (λ/4-wavelength plate) is disposed on the light incident side of the first polarizing means in order to eliminate the occurrence of so-called binocular rivalry. The ¼-wavelength plate may be disposed permanently and may be disposed as necessary. Specifically, the ¼-wavelength plate may be removably attached to a filter attachment portion provided to the lens system. Here, the binocular rivalry means a phenomenon in which when a subject such as the surface of water or a window reflecting P-wave components and absorbing S-wave components is photographed, and the images obtained from the P and S-wave components are presented to both eyes, the images are not fused, and only one image appears strong so that the two images appear alternately, and are suppressed in an overlapped region. When light passes through the ¼-wavelength plate, the polarization direction thereof is rearranged. Such light passes through the first and third regions and arrives at the imaging element array, whereby images are obtained. Such light passes through the second and fourth regions and arrives at the imaging element array, whereby images are obtained. In these images, no great difference occurs between the images of a portion of a subject which reflects P-wave components and absorbs S-wave components. It is possible to eliminate the occurrence of binocular rivalry. It is preferable that the fast axis of the ¼-wavelength plate is at the angle of 45° or 45°±10° with respect to the direction of the electric field of the first region-passing light.

Alternatively, in the stereoscopic imaging device of the present invention, in order to eliminate the occurrence of so-called binocular rivalry, a polarizing plate having a polarization axis of α° is disposed on the light incident side of the first polarizing means. The first region may be formed of a first wavelength plate, the second region may be formed of a second wavelength plate, and the direction of the electric field of the first region-passing light may be orthogonal to the direction of the electric field of the second region-passing light. In this case, specifically, the value of α may be 45°, the first wavelength plate may be formed of a ½-wavelength plate (+λ/2-wavelength plate), and the second wavelength plate may be formed of a ½-wavelength plate (−λ/2-wavelength plate) having a different phase difference from the ½-wavelength plate constituting the first wavelength plate. In this case, the polarizing plate having the polarization axis of α° is fixed to the lens system.

In the stereoscopic imaging device of the present invention including various aspects and configurations, the imaging element array may have a Bayer arrangement, the first pixel may be made up of four solid-state imaging elements, and one third region and/or one fourth region may be disposed in one pixel. Moreover, in the stereoscopic imaging device of the present invention including various aspects and configurations including such an aspect, one third region and one fourth region may be disposed with respect to N pixels (where, for example, $N=2^n$, n is a natural number of 1 to 5) along the Y direction. The arrangement of the imaging element array is not limited to the Bayer arrangement, and examples of the arrangement include an interline arrangement, a G-striped RB-checkered arrangement, a G-striped and RB-complete-checkered arrangement, a checkered complementary-color arrangement, a stripe arrangement, an oblique-stripe arrangement, a primary-color color-difference arrangement, a field color-difference sequence arrangement, a frame color-difference sequence arrangement, a MOS arrangement, a modified MOS arrangement, a frame interleaved arrangement, and a field interleaved arrangement.

Moreover, in the stereoscopic imaging device of the present invention including various aspects and configurations, one third region and one fourth region may be disposed with respect to Npixels (where, for example, $N=2^n$, n is a natural number of 1 to 5) along the Y direction. In this case, image data (right-eye image data) for obtaining a right-eye image and image data (left-eye image data) for obtaining a left-eye image may be obtained based on a depth map (depth information) generated from an electrical signal obtained by the first region-passing light having passed through the third region and an electrical signal obtained by the second region-passing light having passed through the fourth region and the electrical signals from all of the solid-state imaging elements constituting the imaging element array.

Alternatively, when the imaging element array has the Bayer arrangement, the third and fourth regions may not be disposed in the red and blue solid-state imaging elements for receiving red and blue light, respectively, but the third region may be disposed in one of the two green solid-state imaging elements for receiving green light and the fourth region may be disposed in the other green solid-state imaging element. Alternatively, when the imaging element array has the Bayer arrangement, the third or fourth region may be disposed two solid-state imaging elements adjacent in the X direction (for example, the red and one green solid-state imaging elements for receiving red and green light, respectively) among one red solid-state imaging element for receiving red light, one blue solid-state imaging element for receiving blue light, and two solid-state imaging elements for receiving green light, and the fourth or third region may be disposed in the remaining two solid-state imaging elements (for example, the blue and the other green solid-state imaging elements for receiving blue and green light, respectively). Alternatively, when the imaging element array has the Bayer arrangement, the third or fourth region may be disposed in any one solid-state imaging element (for example one red or blue solid-state imaging element for receiving red or blue light) among one red solid-state imaging element for receiving red light, one blue solid-state imaging element for receiving blue light, and two green solid-state imaging elements for receiving green light, and the fourth or third region may be disposed in a solid-state imaging element adjacent to the solid-state imaging element in the Y direction (for example, the green solid-state imaging element). In these cases, one third region and one fourth region may be disposed with respect to N pixels along the Y direction, and one third region or one fourth region may be disposed with respect to M pixels along the X direction.

In the stereoscopic imaging device or the imaging method of the present invention including various preferred aspects and configurations, the X direction may be the horizontal direction, and the Y direction may be the vertical direction. The unit length of the third and fourth regions along the X direction may be identical to the length of the solid-state imaging element along the X direction (when the direction of the electric field of the first region-passing light is parallel to the X direction). Alternatively, the unit length may be identical to the length corresponding to one solid-state imaging element (when the direction of the electric field of the first region-passing light is at the angle of 45° with respect to the X direction). The lens system may be a single focus lens and may be a so-called zoom lens, and the configuration and structure of the lens and the lens system may be determined based on specifications required for the lens system.

The central point of the first region means the central point calculated based on the outer shape of the first region, and the central point of the second region means the central point calculated based on the outer shape of the second region. When the outer shape of the first polarizing means is a circle having a radius of "r", and each of the first and second regions has a half-moon shaped outer shape occupying the half of the first polarizing means, the distance between the central point of the first region and the central point of the second region can be calculated by $(8r)/(3\pi)$ from a simple calculation.

First Embodiment

Figure 1:
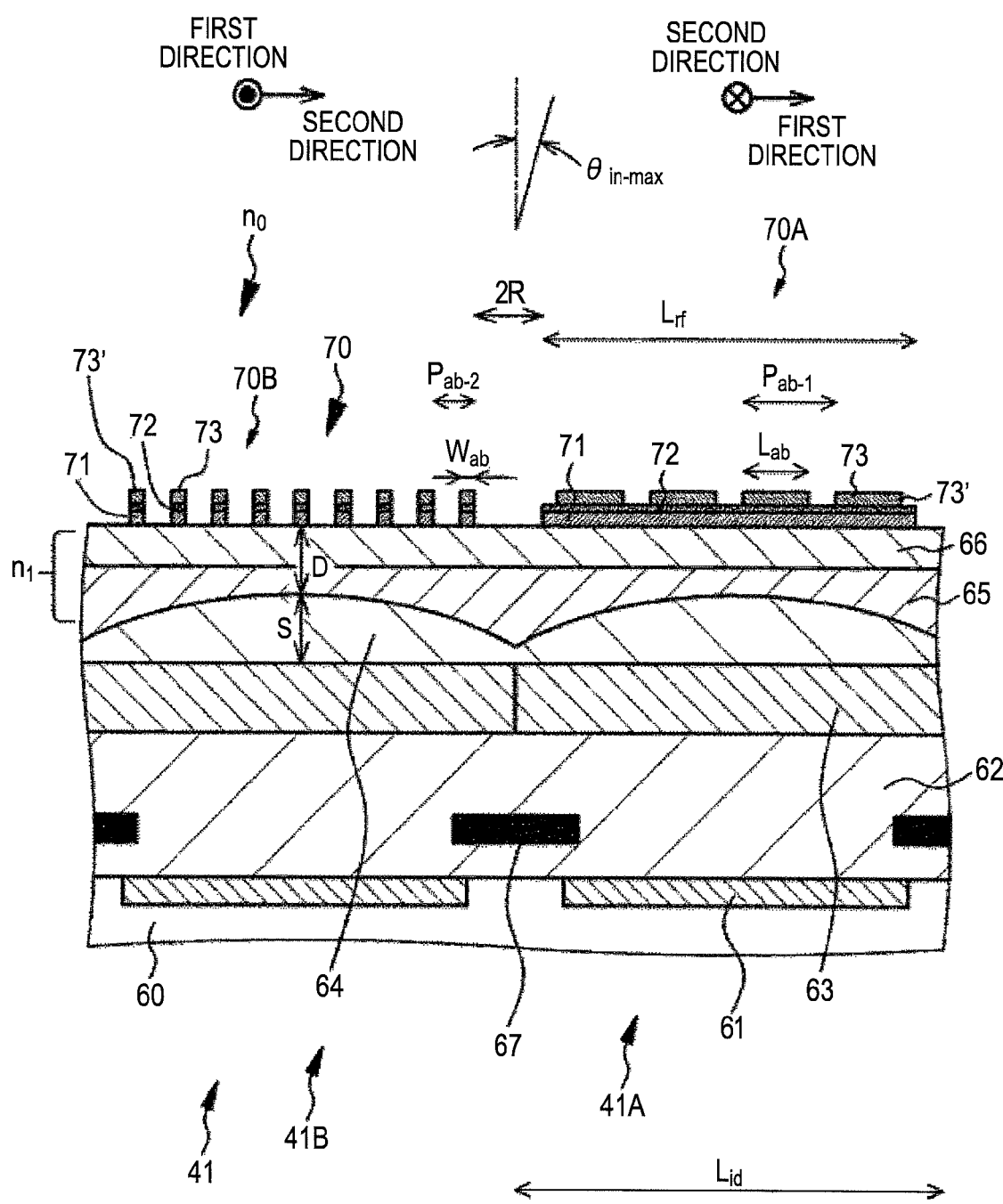
FIG. 1 is a schematic partial cross-sectional view of a solid-state imaging element of a first embodiment.
Figure 2:
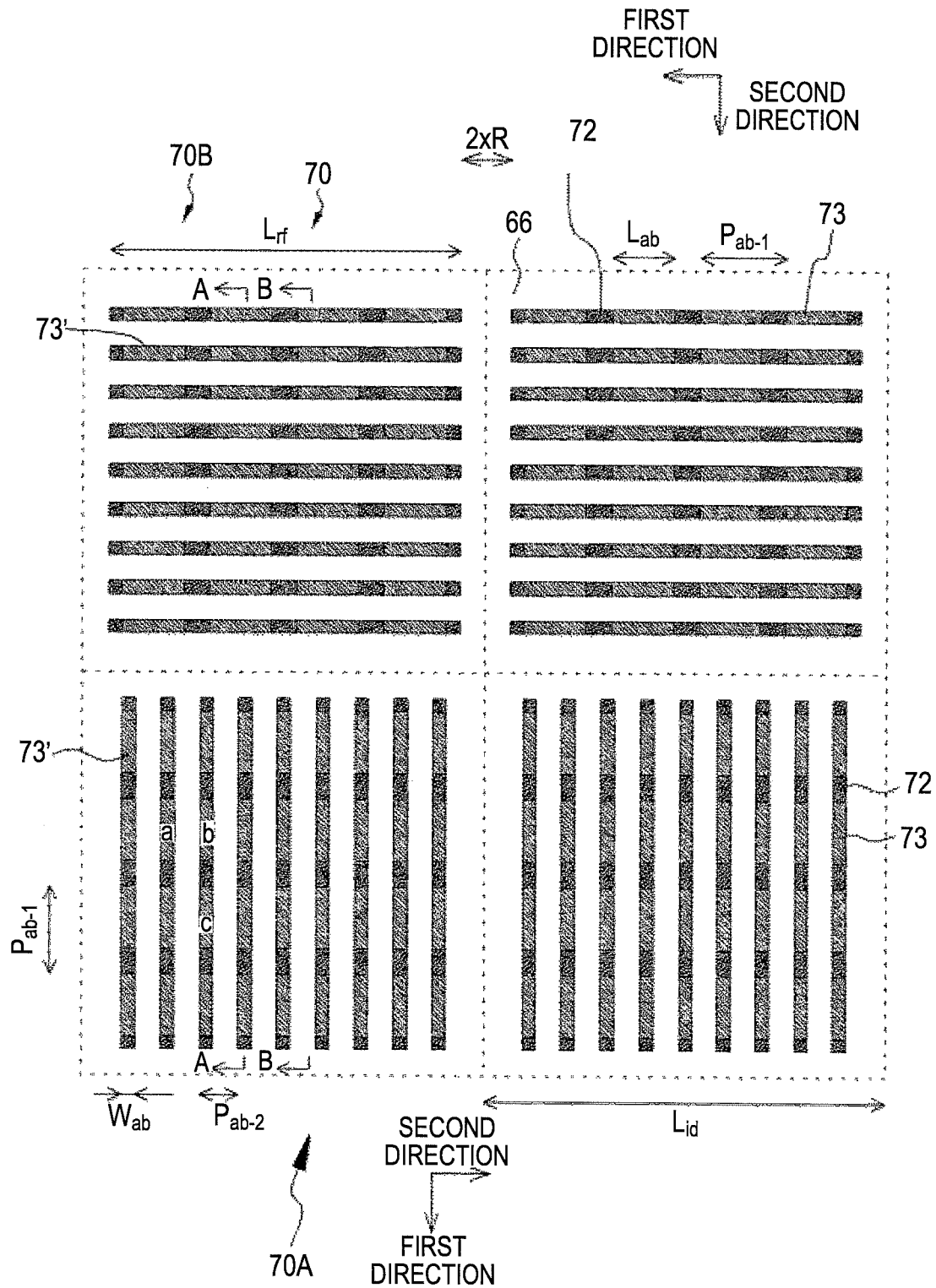
FIG. 2 is a schematic partial plan view of the solid-state imaging element of the first embodiment.

A first embodiment relates to a solid-state imaging element of the invention, a solid-state imaging device of the invention, an imaging apparatus of the present invention, and a polarizing element manufacturing method. More specifically, the first embodiment relates to the solid-state imaging element A of the present invention. A schematic partial cross-sectional view of a solid-state imaging element constituting the solid-state imaging device of the first embodiment is shown in FIG. 1, and a schematic partial plan view of the solid-state imaging element is shown in FIG. 2. A schematic partial cross-sectional view of a polarizing element is shown in (A) and (B) in FIG. 32. Two solid-state imaging elements are shown in FIG. 1, and four solid-state imaging elements are shown in FIG. 2. FIG. 1 is a schematic partial cross-sectional view taken along the arrows A-A in FIG. 2 and shows a schematic partial cross-sectional view of a solid-state imaging element along the extension direction of a stripe-shaped reflecting layer in a polarizing element and a schematic partial cross-sectional view of a solid-state imaging element along a repetition direction (direction orthogonal to the extension direction of the stripe-shaped reflecting layer) of the stripe-shaped reflecting layer. In FIG. 2, the boundaries between the solid-state imaging elements are depicted by dotted lines. (A) and (B) in FIG. 32 are schematic partial cross-sectional views taken along the arrows A-A and B-B in FIG. 2, respectively.

A solid-state imaging element 41 of the first embodiment includes a photoelectric conversion element (light receiving element) 61 and a polarizing element 70 formed on a light incident side of the photoelectric conversion element 61. A solid-state imaging device of the first embodiment is a solid-state imaging device including a plurality of the solid-state imaging elements 41 of the first embodiment and includes two or more kinds of polarizing elements 70 having different polarization orientations. In adjacent solid-state imaging elements 41A and 41B, the transmission axes of the polarizing elements 70A and 70B are orthogonal to each other. The imaging apparatus of the first embodiment includes the solid-state imaging device of the first embodiment and is configured as a digital still camera, a video camera, or a camcorder, for example. In the first embodiment, an on-chip lens 64 is disposed above the photoelectric conversion element 61, and the polarizing element 70 is formed above the on-chip lens 64. Details of the imaging apparatus of the present invention will be described in the fifth and subsequent embodiments.

Specifically, the solid-state imaging element 41 of the first embodiment has a configuration in which a first planarization film 62, a wavelength selecting layer (color filter layer 63), the on-chip lens 64, a planarization layer (referred to as a second planarization film 65), an interlayer insulating layer (referred to as an inorganic insulating base layer 66), and the polarizing element 70 are stacked on a photoelectric conversion element 61 formed on a silicon semiconductor substrate 60, for example. The first planarization film 62 and the interlayer insulating layer (inorganic insulating base layer 66) are formed of $SiO_2$, and the planarization layer (second planarization film 65) is formed of an acrylic resin. The photoelectric conversion element 61 is configured as a CCD element, a CMOS image sensor, or the like. Reference sign 67 is a light blocking portion provided near the photoelectric conversion element 61.

In the first embodiment, the solid-state imaging element has the Bayer arrangement. That is, one pixel is made up of one sub-pixel configured to receive red light, one sub-pixel configured to receive blue light, and two sub-pixels configured to receive green light, and each sub-pixel includes a solid-state imaging element. Pixels are arranged in a 2-dimensional matrix form in the row and column directions. The first directions of all polarizing elements within one pixel are the same. In pixels arranged in the row direction, the first directions of the polarizing elements are the same. On the other hand, pixels in which the first direction of the polarizing element is parallel to the row direction and pixels in which the first direction of the polarizing element is parallel to the column direction are alternately arranged along the column direction.

The polarizing element 70 has a stacked structure in which a stripe-shaped reflecting layer 71, an insulating layer 72 formed on the reflecting layer 71, and a light absorption layer 73 made up of plural segments 73' formed on the insulating layer 72 in a separated state are stacked in that order from the photoelectric conversion element side. Here, the reflecting layer 71 is formed of aluminum (Al) having a thickness of 100 nm, the insulating layer 72 is formed of $SiO_2$ having a thickness of 25 nm, and the light absorption layer 73 is formed of tungsten (W) having a thickness of 50 nm. The extension direction (first direction) of the stripe-shaped reflecting layer 71 is identical to a polarization orientation where light is to be extinct, and the repetition direction (second direction orthogonal to the first direction) of the stripe-shaped reflecting layer 71 is identical to the polarization orientation where light is to be transmitted. That is, the reflecting layer 71 has the function of a wire grid polarizer and is configured to attenuate a polarized wave having an electric field component among the light incident to the polarizing element 70 in the direction parallel to the extension direction (first direction) of the reflecting layer 71 and transmit a polarized wave having an electric field component in the direction (second direction) orthogonal to the extension direction of the reflecting layer 71. The first direction is an optical absorption axis of a polarizing element, and the second direction is an optical transmission axis of a polarizing element.

In the first embodiment, although details thereof are described later, the length ($L_{rf}$) of the reflecting layer 71 in the first direction is smaller than the length ($L_{id}$) of the solid-state imaging element 41 along the first direction.

However, in adjacent solid-state imaging elements 41A and 41B, the transmission axes of the polarizing elements 70A and 70B are orthogonal to each other. Thus, when leakage (polarization crosstalk) of polarized light into the adjacent solid-state imaging element 41 occurs, a polarized light component that is to be extinct is mixed from the adjacent solid-state imaging element 41, so that a final extinction ratio decreases. That is, the optical transmission axis (second direction) of the polarizing element 70A to which incident light having an incidence angle of $\theta_{in-max}$ in FIG. 1 is the direction vertical to the drawing sheet. On the other hand, the optical transmission axis (second direction) of the adjacent polarizing element 70B is the direction parallel to the drawing sheet. Thus, when light from the solid-state imaging element 41A having the polarizing element 70A is incident to the solid-state imaging element 41B having the polarizing element 70B, there is a problem in that the extinction ratio in the solid-state imaging element 41B decreases greatly.

In order to prevent the occurrence of such a polarization crosstalk, a limitation in distance in the depth (thickness) direction may be provided between the polarizing element 70 and the on-chip lens 64, and a non-effective region without the function of a polarizing element may be provided in the boundary between the polarizing element 70A and the polarizing element 70B. Specifically, as shown in FIG. 1, when the distance between the polarizing element 70 and the on-chip lens 64 is D, the amount of sagging of the on-chip lens 64 is S, the refractive index (approximated to an average refractive index) of a medium (specifically, an interlayer insulating layer (inorganic insulating base layer) 66 and a planarization layer (second planarization film) 65) present between the polarizing element 70 and the on-chip lens 64 is $n_1$, the width of a gap present between adjacent polarizing elements is 2×R, and the maximum value of an incidence angle of incident light to the polarizing element including the NA of the incident light is $\theta_{in-max}$, the following relation is satisfied.

$$R \geq (D+S) \times \tan[\sin^{-1}\{\sin(\theta_{in-max})/n_1\}] \quad (1)$$

In order to prevent the occurrence of diffracted light from the segments 73' of the light absorption layer formed periodically and to reliably prevent a leakage of unnecessary light into adjacent solid-state imaging elements 41, as shown in FIG. 2, when a segment (referred to as a "segment c" for convenience) of a light absorption layer positioned to be adjacent along the first direction of a segment (referred to as a "segment b" for convenience) of a light absorption layer adjacent along the second direction to a segment (referred to as a "segment a" for convenience) of a certain light absorption layer is considered, the occurrence of a diffraction phenomenon between the segment a and the segment c may be prevented. If this is satisfied, no diffraction phenomenon occur between the segment a and the segment b. Thus, when a formation pitch of the segments 73' of the light absorption layer in the first direction is $P_{ab-1}$, a formation pitch of the segments 73' of the light absorption layer in the second direction is $P_{ab-2}$, the shortest wavelength of light incident to the polarizing element 70 is $\lambda_{min}$, the refractive index of a medium through which light incident to the polarizing element passes is $n_0$, and the maximum value of the incidence angle of light to the polarizing element is $\theta_{in-max}$, the following relation may be satisfied.

$$(P_{ab-1}^2 + P_{ab-2}^2)^{1/2} \leq [(\lambda_{min}/n_0) \times \cos(\theta_{in-max})] \quad (2)$$

From the perspective of improving the extinction characteristics, when the formation pitch of the segments 73' of the light absorption layer in the first direction is $P_{ab-1}$ and the length thereof is $L_{ab}$, the following relation is satisfied.

$$0.5 \leq (L_{ab}/P_{ab-1}) < 1 \quad (3)$$

The influence on the extinction ratio, of the length $L_{rf}$ of the reflecting layer 71 in the first direction was analyzed using a simulation based on a Finite-difference time-domain (FDTD) method.

In order to focus on the dependency of the length $L_{rf}$ of the reflecting layer 71, a structure in which the insulating layer 72 and the light absorption layer 73 are not provided is employed, and the reflecting layer 71 is formed of aluminum. The base of the reflecting layer 71 is formed of an SiO$_2$ layer. The thickness of the reflecting layer 71 is made constant at 100 nm, the formation pitch of the reflecting layer 71 in the second direction is made constant at 150 nm, the width of the reflecting layer 71 in the second direction is made constant at 50 nm, and the value of the width 2×R of the gap present between adjacent polarizing elements in the first direction is made constant at 150 nm. The length $L_{rf}$ of the reflecting layer 71 in the first direction is set to 1 μm, 2 μm, 4 μm, and infinity.

Figure 4:
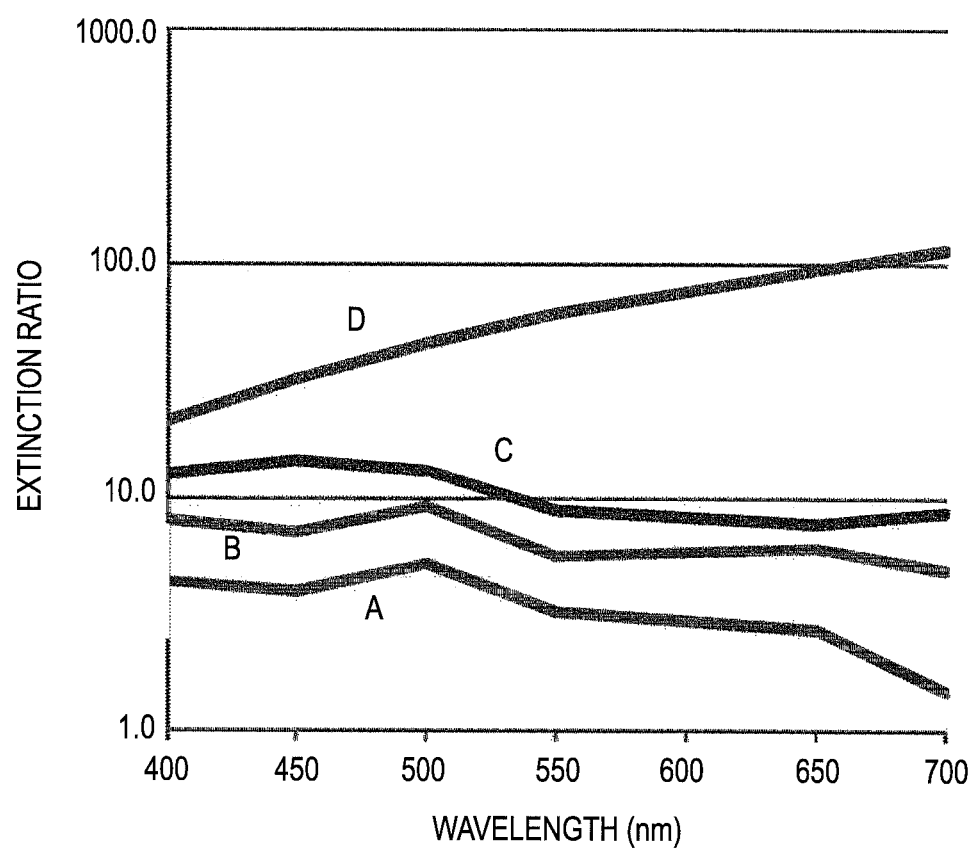
FIG. 4 is a graph showing the relation between the length $L_{rf}$ of a stripe-shaped reflecting layer and an extinction ratio in an extension direction of the reflecting layer in a polarizing element of the first embodiment.

The simulation results are shown in FIG. 4. In FIG. 4, "A" shows the results when the length $L_{rf}$ of the reflecting layer 71 in the first direction was 1 μm, "B" shows the results when the length $L_{rf}$ of the reflecting layer 71 in the first direction was 2 μm, "C" shows the results when the length $L_{rf}$ of the reflecting layer 71 in the first direction was 4 μm, and "D" shows the results when the length $L_{rf}$ of the reflecting layer 71 in the first direction was infinite.

As can be understood from FIG. 4, the extinction ratio has dependency on the length $L_{rf}$ of the reflecting layer 71, and there is a great difference in the extinction ratio between when the length $L_{rf}$ of the reflecting layer 71 was infinite and when the length $L_{rf}$ of the reflecting layer 71 was 4 μm. Thus, as shown by the schematic partial plan view of the solid-state imaging element in FIG. 34, unless the reflecting layers 71 are separated between the solid-state imaging elements adjacent in the first direction, the length of the reflecting layer 71 in the first direction becomes very large. As a result, there is a great difference in the extinction ratio between the solid-state imaging elements 41A and 41B adjacent in the second direction. Thus, as shown by the schematic partial plan view of the solid-state imaging element in FIG. 2, the length ($L_{rf}$) of the reflecting layer 71 in the first direction is made smaller than the length ($L_{id}$) of the solid-state imaging element 41 in the first direction (specifically, $L_{rf} = L_{id} - 2 \times R$, for example).

As a result, a difference in the extinction ratio scarcely occurs between the solid-state imaging elements 41A and 41B adjacent in the second direction.

However, as shown in FIG. 4, when the length ($L_{rf}$) of the reflecting layer 71 in the first direction decreases, the extinction ratio decreases. This is considered to be attributable to the fact that not only the length ($L_{rf}$) of the reflecting layer 71 in the first direction but also a mixing of a non-polarized light component in the segmentation boundary (non-effective region) between the reflecting layer 71 and the reflecting layer 71 have a great contribution.

Figure 5:
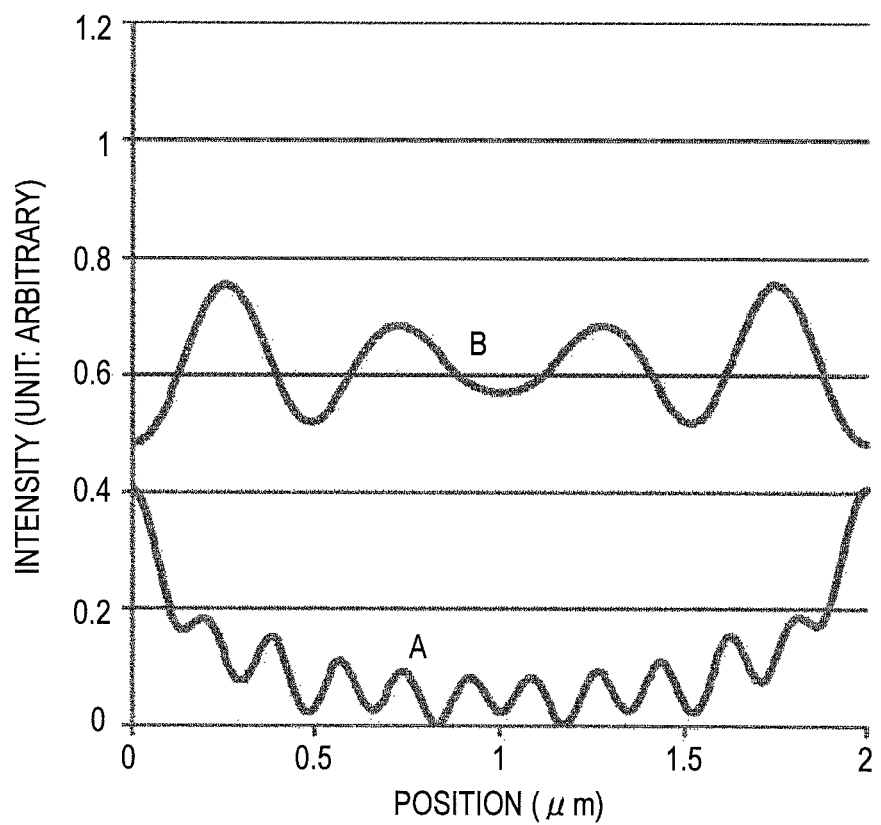
FIG. 5 is a graph showing the simulation results of transmitted light intensity distributions of respective polarized light components of light passing through a strip-shaped reflecting layer in the extension direction of the reflecting layer when the length $L_{rf}$ of the stripe-shaped reflecting layer in the extension direction of the reflecting layer in a polarizing element of the first embodiment is 2 μm.

FIG. 5 shows the simulation results of the intensity of light passing through the reflecting layer 71 in the first and second directions when the length $L_{rf}$ of the reflecting layer 71 in the first direction was 2 μm. The wavelength of the incident light was 550 nm. In FIG. 5, "A" shows the light intensity (unit: arbitrary) along an optical absorption axis (first direction), and "B" shows the light intensity (unit: arbitrary) along an optical transmission axis (second direction). From the simulation results, it can be understood that due to the absence of the reflecting layer 71 at both ends in the first direction of the reflecting layer 71, both a TE polarized light component and a TM polarized light component pass through the reflecting layer 71, and a state close to non-polarized transmission is realized, whereby a large number of non-polarized light components are mixed therein. Although the extinction state is different depending on the position within a pixel, collecting (integrating) all polarized light components within the pixel means applying polarization characteristics (extinction ratio) in one pixel.

Figure 3:
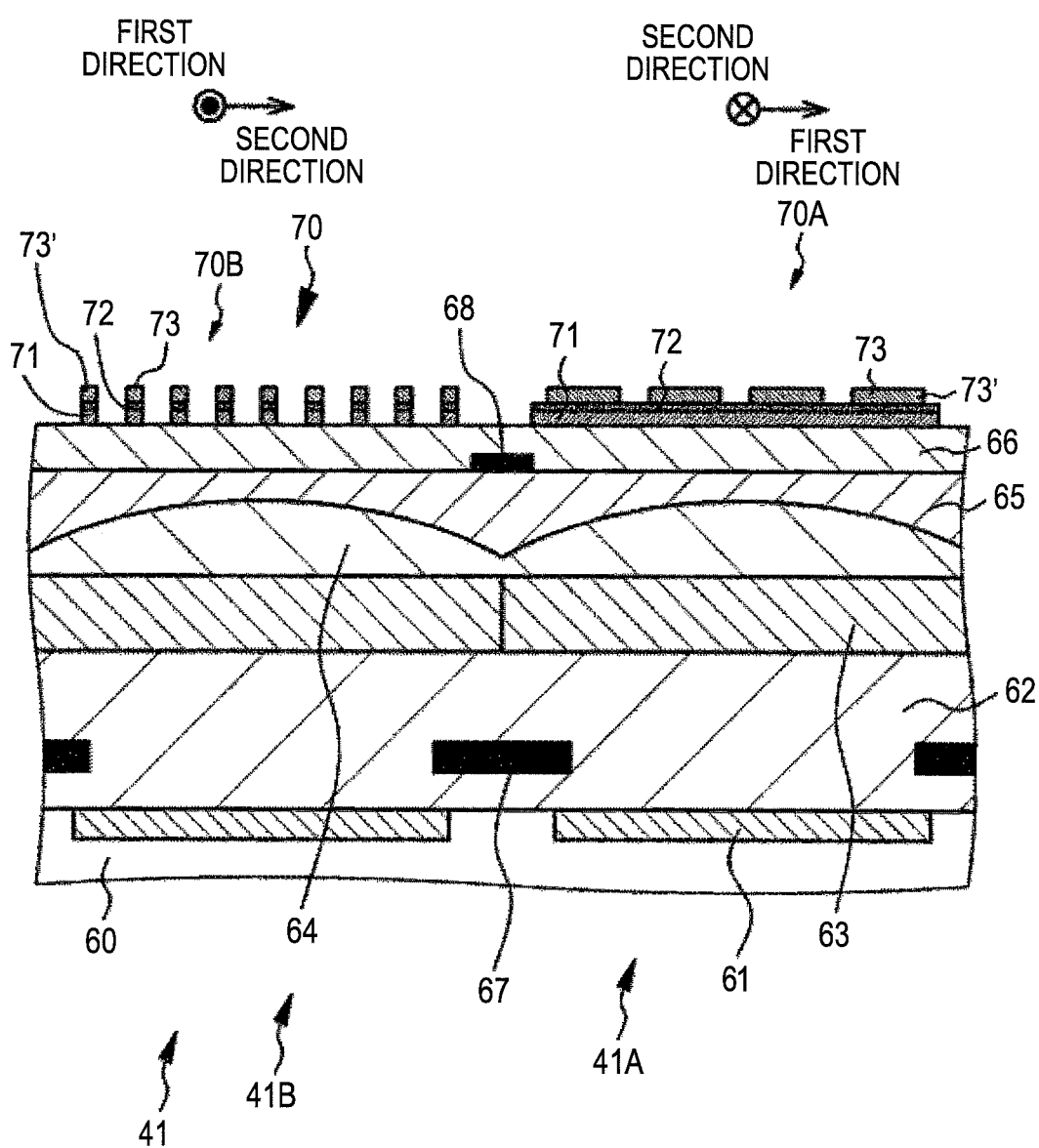
FIG. 3 is a schematic partial cross-sectional view of a modified example of the solid-state imaging element of the first embodiment.

In order to improve the decrease of the extinction ratio at both ends in the first direction of the reflecting layer 71, as shown by the schematic partial cross-sectional view of the solid-state imaging element in FIG. 3, a light blocking layer (commonly called a black matrix layer) 68 formed of tungsten (W), for example may be provided in a region positioned between adjacent on-chip lenses 64 (more specifically, an interlayer insulating layer (inorganic insulating base layer 66) positioned between the on-chip lens 64 and the on-chip lens 64). It is desirable that the light blocking layer 68 is disposed within the interlayer insulating layer 66 which is an insulating material in order to prevent mutual interference of free electrons in the reflecting layer 71 and the light blocking layer 68 formed of a metallic material, for example.

Figure 6:
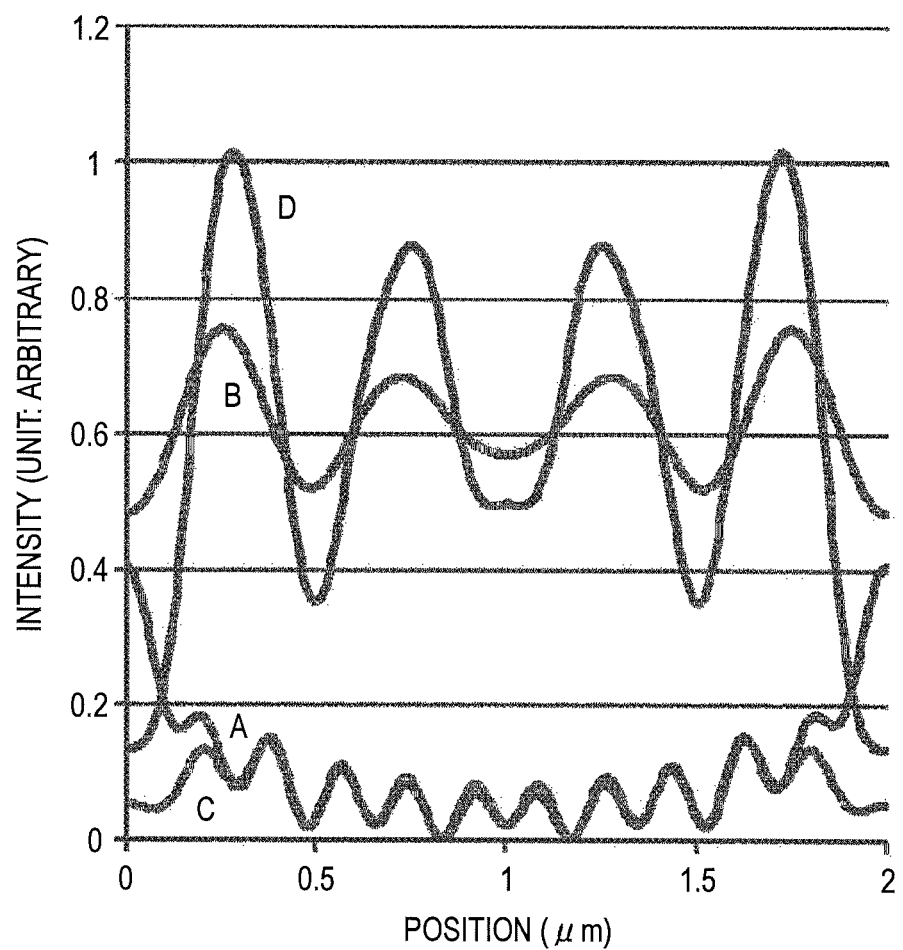
FIG. 6 is a graph showing the simulation results of transmitted light intensity distributions when a light blocking layer has a thickness of 20 nm and a width of 100 nm, and incident light has a wavelength of 550 nm.

The simulation results of transmitted light intensity distributions when the light blocking layer 68 has a thickness of 20 nm and a width (=2×R) of 200 nm, and incident light has a wavelength of 550 nm are shown in FIG. 6. In FIG. 6, "A" shows the light intensity (unit: arbitrary) along the optical absorption axis (first direction) when the light blocking layer 68 is not provided, and "B" shows the light intensity (unit: arbitrary) along the optical transmission axis (second direction) when the light blocking layer 68 is not provided. Moreover, "C" shows the light intensity (unit: arbitrary) along the optical absorption axis (first direction) when the light blocking layer 68 is provided, and "D" shows the light intensity (unit: arbitrary) along the optical transmission axis (second direction) when the light blocking layer 68 is provided. It can be understood that the decrease of the extinction ratio at both ends in the first direction of the reflecting layer 71 is improved. The extinction ratio calculated by integrating the transmission intensity within a pixel obtained from a simulation based on the FDTD method was improved by about 1.5 times from 5.6 for the case where the light blocking layer 68 was not provided to 9.0 for the case where the light blocking layer 68 was provided. In addition, the comparison results of the extinction ratio (wavelength: 550 nm) between when the light blocking layer 68 was provided and when the same was not provided while changing the length $L_{rf}$ of the reflecting layer 71 in the first direction to 1 μm, 2 μm, and 4 μm are as shown in Table 1 below. From the above results, it can be understood that even when the size of the solid-state imaging element decreases, the extinction ratio is improved by about 1.5 times when the light blocking layer 68 is provided. For example, if a necessary extinction ratio is assumed to be 10 or higher, the lower limit size of the solid-state imaging element when no light blocking layer is provided is about 5 μm. However, by providing the light blocking layer, the size of the solid-state imaging element can be decreased to about 3 μm. Thus, it is possible to decrease the chip size of the solid-state imaging device for the same number of pixels and to miniaturize the imaging apparatus itself.

TABLE 1

| | <Extinction Ratio> | |
|---|---|---|
| $L_{rf}$ | With Light blocking layer | Without Light blocking layer |
| 1 μm | 4.7 | 3.0 |
| 2 μm | 8.1 | 5.6 |
| 4 μm | 12.3 | 7.5 |

Here, the calculation results of polarization characteristics with specific structural dimensions will be described.

For example, when $\lambda_{min}$=400 nm, $\theta_{in-max}$=20°, and $n_0$=1.0 (air), the value of the right side of Expression (2) is 376 nm. On the other hand, when $P_{ab-1}$=300 nm and $P_{ab-2}$=150 nm, the value of the right side of Expression (2) is 335 nm, and Expression (2) is satisfied.

Here, it is assumed that $L_{ab-1}$=150 nm and $W_{ab}$=50 nm.

Moreover, it is assumed that $L_{id}$=6 μm and R=75 nm.

Figure 7:
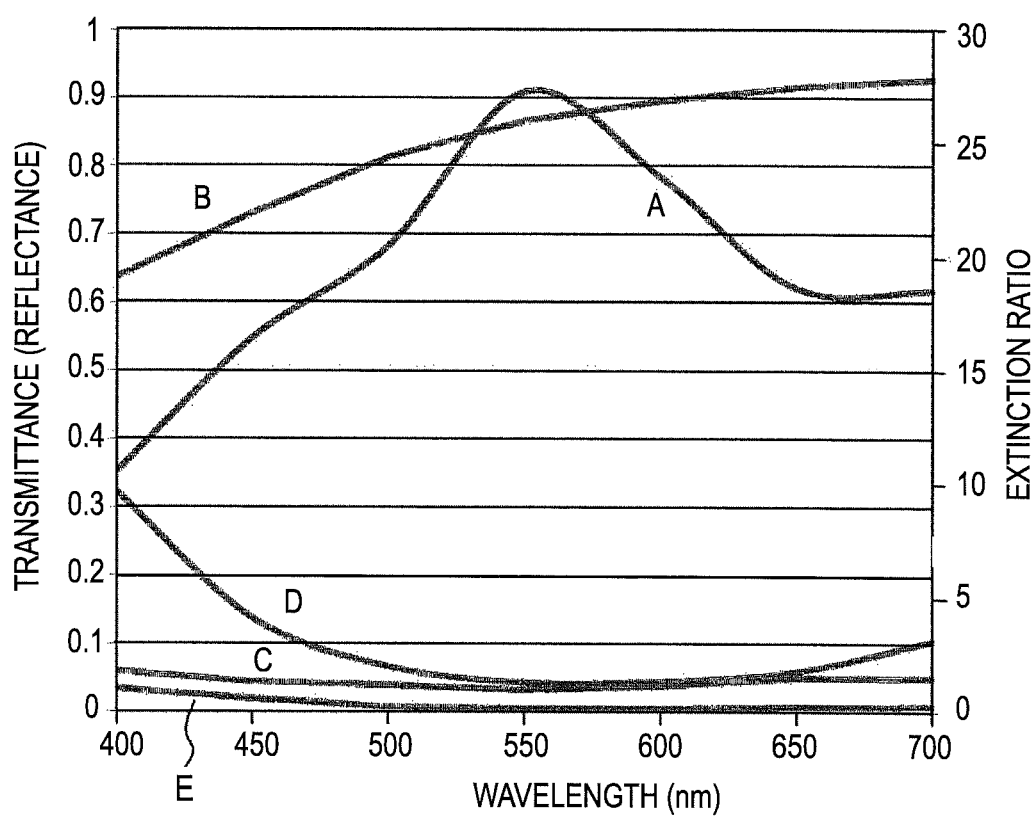
FIG. 7 is a graph showing the simulation results of polarization characteristics of a polarizing element of the first embodiment.

The number of segments of the light absorption layer in the second direction is 20, and the number of segments of the light absorption layer in the first direction is 1 (1 cycle). In addition, the reflecting layer is formed of aluminum (Al) having a thickness of 100 nm, the insulating layer is formed of $SiO_2$ having a thickness of 25 nm, and the light absorption layer is formed of tungsten (W) having a thickness of 50 nm. A simulation based on the FDTD method was conducted on the polarizing element having such a configuration, and the characteristics as a polarizing element were estimated. Since a periodic boundary condition is used in the simulation, the length of the reflecting layer in the first direction is infinite. Moreover, a structure in which an infinite number of reflecting layers are arranged in the second direction is employed. The simulation results are shown in FIG. 7. In FIG. 7, "A" shows extinction ratio data, "B" shows optical transmittance (unit: arbitrary) for polarization orientation incidence in the optical transmission axis (second direction), "C" shows optical transmittance (unit: arbitrary) for polarization orientation incidence in the optical absorption axis (first direction), "D" shows optical reflectance (unit: arbitrary) for polarization orientation incidence in the optical absorption axis (first direction), and "E" shows optical reflectance (unit: arbitrary) for polarization orientation incidence in the optical transmission axis (second direction).

From the simulation results, it can be understood that the extinction ratio is the best at a wavelength of 550 nm, and an extinction ratio of 27 and reflectance of 4% are obtained at the wavelength of 550 nm in the first direction.

Hereinafter, a polarizing element manufacturing method according to the first embodiment (as an example, a method of manufacturing polarizing elements having different polarization orientations for each solid-state imaging element) will be described with reference to (A) and (B) in FIG. 27, (A) and (B) in FIG. 28, (A) and (B) in FIG. 29, (A) and (B) in FIG. 30, (A) and (B) in FIG. 31, and (A) and (B) in FIG. 32 which are schematic partial cross-sectional views of a base and the like. In these drawings, various constituent elements formed below the interlayer insulating layer 66 are not illustrated. (A)

and (B) in FIG. 27, (A) in FIG. 28, (A) in FIG. 29, (A) in FIG. 30, (A) in FIG. 31, and (A) in FIG. 32 are the same schematic partial cross-sectional views as taken along the arrows A-A in FIG. 2 and shows schematic partial cross-sectional views (virtual cutting plane is parallel to the first direction) of the polarizing element 70A taken along the first direction and schematic partial cross-sectional views (virtual cutting plane is parallel to the second direction) of the polarizing element 70B taken along the second direction. (B) in FIG. 28, (B) in FIG. 29, (B) in FIG. 30, (B) in FIG. 31, (B) in FIG. 32, and (B) in FIG. 27 are the same schematic partial cross-sectional views as taken along the arrows B-B in FIG. 2 and show schematic partial cross-sectional views (virtual cutting plane is parallel to the second direction) of the polarizing element 70B taken along the second direction and schematic partial cross-sectional views (virtual cutting plane is parallel to the first direction) of the gap between the polarizing element 70A and the polarizing element 70A adjacent in the second direction.

[Step-100]

First, a reflecting layer-forming layer 71A which forms the reflecting layer 71, an insulating layer-forming layer 72A which forms the insulating layer 72, and a light absorption layer-forming layer 73A which forms the light absorption layer 73 are provided on a base (see (A) in FIG. 27). Specifically, using the interlayer insulating layer 66 as a base, the reflecting layer-forming layer 71A formed of aluminum (Al) is formed on the base by a vacuum evaporation method, the insulating layer-forming layer 72A formed of $SiO_2$ is formed by a CVD method, and the light absorption layer-forming layer 73A formed of tungsten (W) is formed by a sputtering method. The photoelectric conversion element 61 may be provided on the silicon semiconductor substrate 60 by a known method, and the first planarization film 62, the wavelength selecting layer (color filter layer 63), the on-chip lens 64, the planarization layer (second planarization film 65), and the interlayer insulating layer (inorganic insulating base layer 66) may be formed thereon by a known method.

[Step-110]

Subsequently, the light absorption layer-forming layer 73A is patterned, whereby a strip-shaped light absorption layer-forming layer 73A having a length of $L_{ab}$ is obtained (see (B) in FIG. 27). Specifically, the light absorption layer-forming layer 73A is patterned on the light absorption layer-forming layer 73A based on a lithography technique and a dry-etching technique, whereby a patterned light absorption layer-forming layer 73A is obtained.

[Step-120]

Subsequently, a resist layer 91 in which the formation pitch in the repetition direction (second direction) of the strip-shaped light absorption layer is $2 \times P_{ab-2}$ (=300 nm) and the width in the second direction is $(P_{ab-2} - W_{ab})$ is formed on the entire surface (specifically, in a predetermined solid-state imaging element region or a pixel where the polarization orientation is rearranged) based on a lithography technique (see (A) and (B) in FIG. 28). The resist layer 91 is formed of a photoresist material, for example. Here, KrF exposure with an exposure wavelength of 248 nm is desirable. After that, an etching mask layer (hard mask material layer) 92 of which the thickness on the side wall of the resist layer 91 is $W_{ab}$ (=50 nm) is formed on the side wall of the resist layer 91 (see (A) and (B) in FIG. 29). Specifically, after the etching mask layer 92 formed of TEOS is formed conformally (on the entire surface) based on a CVD method, a portion of the etching mask layer 92 such as a top surface of the resist layer 91 is removed by a known etch-back method.

[Step-130]

Subsequently, the exposed portion of the resist layer 91 is removed based on an ashing technique (see (A) and (B) in FIG. 30). The formation pitch of the etching mask layer 92 is 150 nm, and the width in the second direction is 50 nm. After that, the light absorption layer-forming layer 73A, the insulating layer-forming layer 72A, and the reflecting layer-forming layer 71A are sequentially etched using the etching mask layer 92 as an etching mask to obtain the polarizing element 70 having a stacked structure of the reflecting layer 71, the insulating layer 72, and the light absorption layer 73 (see (A) and (B) in FIG. 31). Then, the etching mask layer 92 is removed. In this way, the structure shown in (A) and (B) in FIG. 32 can be obtained. After that, a protective film which is formed of an insulating material such as $SiO_2$, SiON, or SiN and has a thickness of several tens of nm (specifically, a protective film having a thickness of 15 nm on the side surface of the polarizing element 70, for example) may be formed conformally on the entire surface based on a CVD method or an ALD method as necessary.

[Step-140]

After that, a solid-state imaging device and an imaging apparatus may be assembled based on a known method which involves formation of electrode pads (not shown), dicing for chip separation, and packaging.

In the polarizing element manufacturing method of the first embodiment, a method called a spacer method which involves forming a resist layer of which the formation pitch is $2 \times P_{ab-2}$ and the width is $(P_{ab-2} - W_{ab})$ forming an etching mask layer of which the thickness on the side wall of the resist layer is $W_{ab}$ on the side wall of the resist layer, and sequentially etching a light absorption layer-forming layer, an insulating layer-forming layer, and a reflecting layer-forming layer using the etching mask layer as a dry-etching mask. Therefore, even when the resist layer of which the formation pitch in the second direction is $2 \times P_{ab-2}$ is formed in Step-120, it is possible to obtain a light absorption layer and a reflecting layer of which the formation pitch along the second direction is $P_{ab-2}$ and the width is $W_{ab}$, and there is no concern about a collapse of the etching mask layer (hard mask material layer) having a width of 50 nm. Here, a double patterning method may be employed instead of the spacer method. That is, after forming odd polarizing elements along the second direction, even polarizing elements may be formed.

In the first embodiment, the light absorption layer of the polarizing element is formed based on a deposition technique and a patterning technique. Unlike the related art, it is not necessary to form a light absorption layer having shape anisotropy based on an oblique sputtering film forming method. Thus, it is possible to easily obtain polarizing elements having different polarization orientations for each solid-state imaging element. In addition, since polarizing elements are integrally formed above the photoelectric conversion element in an on-chip form, it is possible to decrease the thickness of the solid-state imaging element. As a result, it is possible to minimize mixing (polarization crosstalk) of polarized light into the adjacent solid-state imaging element. Moreover, since the polarizing element is an absorption-type polarizing element having an absorption layer, reflectance is low, and the influence of stray light, flare, or the like on video can be reduced. Moreover, since the solid-state imaging device includes two or more kinds of polarizing elements having different polarization orientations, a polarization separating function of spatially separating polarization information of incident light can be provided to the solid-state imaging device.

Second Embodiment

The second embodiment is a modification of the first embodiment. The ADL method can form a film on the side surface of the polarizing element 70 more conformally than the CVD method. Thus, it is possible to prevent deterioration of optical characteristics of polarizing elements. In particular, a protective film formed of a metal oxide such as $AlO_x$ or $HfO_x$ has a high ability to protect a polarizing element and can form a film conformally in a small thickness. Therefore, such a protective film can function as a good protective film which does not deteriorate optical characteristics.

In the second embodiment, the polarizing element 70 is formed so that the formation pitch $P_{ab-2}$ along the second direction is 180 nm, the width $W_{ab}$ is 80 nm, and the space $(P_{ab-2}-W_{ab})$ between the polarizing element 70 and the polarizing element 70 is 100 nm. Specifically, in the second embodiment, in the same step as Step-130 of the first embodiment, after removing the etching mask layer 92, a protective film 74 formed of $AlO_x$ or $HfO_x$ is formed on the polarizing element 70 (more specifically, the polarizing element 70 and the interlayer insulating layer (base and the inorganic insulating base layer 66)) based on the ALD method. In this embodiment, the protective film 74 is formed so that the thickness on the side surface of the polarizing element 70 is 15 nm. In this way, the structure as shown in (A) in FIG. 33 can be obtained. (A) in FIG. 33 and (B) in FIG. 33 described later are the same schematic partial cross-sectional views as taken along the arrows A-A in FIG. 2 and shows a schematic partial cross-sectional view (virtual cutting plane is parallel to the first direction) of the polarizing element 70A along the first direction and a schematic partial cross-sectional view (virtual cutting plane is parallel to the second direction) of the polarizing element 70B along the second direction.

In the second embodiment, by forming the protective film 74 based on the ADL method, it is possible to decrease the thickness of the protective film 74 on the inorganic insulating base layer 66 where the polarizing element 70 is not formed. As a result, it is possible to prevent reflection and refraction of incident light in the portion of the protective film 74 on the inorganic insulating base layer 66 and to prevent a leakage of unnecessary light into the adjacent solid-state imaging elements. Therefore, it is possible to attain an improvement of optical characteristics such as an improvement of sensitivity and reduction of a color mixture. In particular, since a metal oxide which has a higher ability to protect against outside air than a silicon-based oxide film and has a high refractive index can be formed in a small thickness, it is possible to provide a solid-state imaging element having high-performance and high-reliability polarizing elements. Moreover, ADL-based deposition can realize more conformal deposition than CVD-based deposition, and a difference in coverage due to a difference in the distance of the space between the polarizing element 70 and the polarizing element 70 (the portion of a base positioned between the polarizing element and the polarizing element) scarcely occurs. Thus, more uniform characteristics in terms of optical characteristics and reliability are obtained within the solid-state imaging element. When the ADL method was actually applied for the protective film 74, characteristic unevenness (unevenness of sensitivity or the like) of the solid-state imaging element was improved greatly as compared to when the CVD method was applied.

Third Embodiment

The third embodiment is a modification of the second embodiment. In the second embodiment, the protective film 74 was also formed on the inorganic insulating base layer 66 where the polarizing element 70 is not formed. However, a further characteristic improvement (specifically, a further improvement of sensitivity) can be attained when the protective film 74 is not formed on the inorganic insulating base layer 66 where the polarizing element 70 is not formed.

In the third embodiment, in the same step as "Step-130" of the first embodiment, after removing the etching mask layer 92, a protective film 74 formed of $AlO_x$ or $HfO_x$ is formed on the polarizing element 70 (more specifically, the polarizing element 70 and the inorganic insulating base layer 66) based on the ADL method similarly to the second embodiment. Here, the protective film 74 is formed so that the thickness on the side surface of the polarizing element 70 is 15 nm (see the schematic partial cross-sectional view of a base or the like in (A) in FIG. 33). After that, the protective film on the base is removed. Specifically, the protective film 74 deposited on the inorganic insulating base layer 66 is removed by an etch-back method, and only the protective film 74 deposited on the side surface of the polarizing element 70 is left (see the schematic partial cross-sectional view of a base or the like in (B) in FIG. 33). When etching back the protective film 74, it is desirable to employ conditions of high power and high (strong) orientation in order to remove only the protective film 74 deposited on the inorganic insulating base layer 66 with high efficiency. In this case, although the protective film 74 on top of the polarizing element 70 is removed simultaneously, it does not cause any problem. In this way, since the protective film 74 is present only on the side surface of the polarizing element 70, the protective film 74 is not present in the space between the polarizing element 70 and the polarizing element 70 while providing the polarizing element 70 with resistance to corrosion and abnormal precipitation. Thus, light incident to the space may not be reflected and refracted by the protective film 74, and a leakage of unnecessary light into the adjacent solid-state imaging elements can be prevented more reliably. As a result, it is possible to further improve sensitivity and to realize a solid-state imaging element having good characteristics.

Fourth Embodiment

Figure 8:
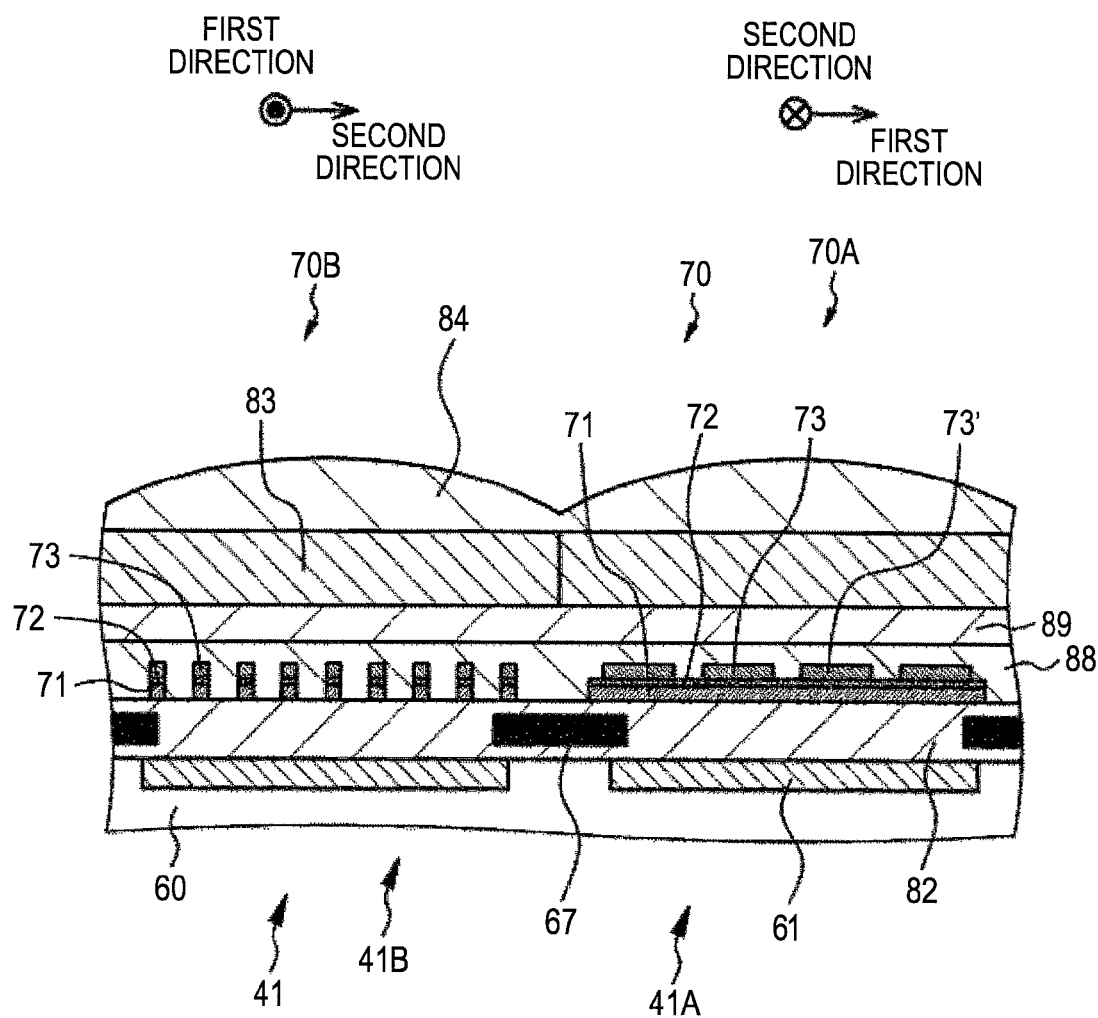
FIG. 8 is a schematic partial cross-sectional view of a solid-state imaging element of a fourth embodiment.

The fourth embodiment is a modification of the first embodiment and relates to the solid-state imaging element B of the present invention. In the fourth embodiment, as shown by a schematic partial cross-sectional view of a solid-state imaging element in FIG. 8, an on-chip lens 84 is disposed above a photoelectric conversion element (light receiving element) 81, and a polarizing element 70 is provided between the photoelectric conversion element 81 and the on-chip lens 84. A wavelength selecting layer (specifically, a color filter layer 83) is disposed between the on-chip lens 84 and the polarizing element 70.

Specifically, the solid-state imaging element 41 of the fourth embodiment has a configuration in which an interlayer insulating layer (first planarization film 82), the polarizing element 70, a polarizing element-filling material layer 88, a second planarization film 89, a wavelength selecting layer (color filter layer 83), and the on-chip lens 84 are stacked on the photoelectric conversion element 81 formed on a silicon semiconductor substrate 80, for example. The interlayer insulating layer (first planarization film 82) and the second planarization film 89 are formed of $SiO_2$, and the polarizing element-filling material layer 88 is formed of $SiO_2$, an acrylic resin, SOG, or the like. The photoelectric conversion element 81, the polarizing element 70, the wavelength selecting layer (color filter layer 83), and the on-chip lens 84 can have the same configuration and structure as the first embodiment.

In the fourth embodiment, the formation pitch $P_{ab-1}$ of the segments 73' of the light absorption layer in the first direction and the length $L_{ab}$ of the segments 73' of the light absorption layer in the first direction are determined depending on the wavelength of light passing through the wavelength selecting layer (color filter layer 83). That is, ($P_{ab-1}$, $L_{ab}$) is optimized in each of a red solid-state imaging element for receiving red light, a blue solid-state imaging element for receiving blue light, and a green solid-state imaging element for receiving green light, whereby a structure having a further lower reflectance is achieved in each solid-state imaging element. In the fourth embodiment, the solid-state imaging element has the Bayer arrangement.

Hereinafter, the results of calculation of the relation between ($P_{ab-1}$, $L_{ab}$) and the optical reflectance obtained by a simulation based on the FDTD method will be described. In this simulation, the central wavelength of light passing through the color filter layer 83 was set to 450 nm, 550 nm, and 650 nm, the formation pitch $P_{ab-2}$ of P the light absorption layer 73 in the second direction was 120 nm, the width $W_{ab}$ of the segments 73' of the light absorption layer along the second direction was 40 nm, the refractive index of the polarizing element-filling material layer 88 was 1.45, the thickness of the reflecting layer 71 formed of aluminum (Al) was 100 nm, the thickness of the insulating layer 72 formed of $SiO_2$ was 25 nm, and the thickness of the light absorption layer 73 formed of tungsten (W) was 50 nm. Moreover, the base of the reflecting layer 71 is formed of an $SiO_2$ layer.

Moreover, the average reflectance of the reflectance in the first direction and the reflectance in the second direction was calculated as a characteristics evaluation index while changing the value of the duty ratio $L_{ab}/P_{ab-1}$ to various values, and the optimum value of $L_{ab}/P_{ab-1}$ was calculated. However, the characteristics evaluation index is not limited to this, and an extinction ratio, the optical transmittance in the second direction, or a plurality of these parameters may be selected. Moreover, an important parameter may be selected appropriately.

The simulation results are shown in (A) and (B) in FIG. 9, FIG. 10, and Table 2 below. The horizontal axis represents $L_{ab}/P_{ab-1}$, that is, the duty ratio, and $P_{ab-1}$ is changed into three levels (A, B, and C) for each wavelength. The vertical axis represents the average reflectance described above. (A) in FIG. 9 shows the simulation results for the wavelength of 450 nm, in which "A" shows the results for $P_{ab-1}$=200 nm, "B" shows the results for $P_{ab-1}$=240 nm, and "C" shows the results for $P_{ab-1}$=280 nm. (B) in FIG. 9 shows the simulation results for the wavelength of 550 nm, in which "A" shows the results for $P_{ab-1}$=250 nm, "B" shows the results for $P_{ab-1}$=300 nm, and "C" shows the results for $P_{ab-1}$=350 nm. FIG. 10 shows the simulation results for the wavelength of 650 nm, in which "A" shows the results for $P_{ab-1}$=300 nm, "B" shows the results for 350 nm, and "C" shows the results for $P_{ab-1}$=400 nm. From the results, it was possible to obtain the following optimum conditions. As above, an average reflectance of 4% or lower can be obtained in all of the respective wavelength ranges of red, green, and blue.

TABLE 2

| Wavelength | $P_{ab-1}$ | $L_{ab}$ | Average reflectance |
| --- | --- | --- | --- |
| 450 nm | 240 nm | 120 nm | 4.0% |
| 550 nm | 250 nm | 150 nm | 0.6% |
| 650 nm | 300 nm | 210 nm | 3.9% |

In the fourth embodiment, since the polarizing element 70 is disposed between the photoelectric conversion element 81 and the on-chip lens 84 so as to be closer to the base than the wavelength selecting layer (specifically, the color filter layer 83), and the formation of the polarizing element 70 is realized before formation of the color filter layer, the formation of the polarizing element 70 is scarcely restricted by process temperature. In addition, the polarizing element 70 is formed to be embedded in the filling material layer 88. Therefore, when mounting the solid-state imaging device on a package, it is possible to reliably prevent the occurrence of damage of the polarizing element in a dicing step or the like for cutting the rear surface of the silicon semiconductor substrate for adjusting thickness and for realizing subsequent chip separation. Moreover, from the perspective of securing the reliability of the solid-state imaging element, it is desirable to form a protective film to protect the polarizing element. However, in the fourth embodiment, since the polarizing element-filling material layer 88 is formed, formation of the protective film is not necessary.

Fifth Embodiment

The fifth embodiment relates to an imaging apparatus of the present invention, and more specifically, relates to a solid-state imaging device and an imaging method for imaging a subject as a stereoscopic image. In the imaging apparatus of the fifth embodiment, the solid-state imaging device and the solid-state imaging element described in the first to fourth embodiments can be applied.

A conceptual diagram of the imaging apparatus (stereoscopic imaging device) according to the fifth embodiment is shown in (A) in FIG. 11. The polarization states of the first and second polarizing means are schematically shown in (B) and (C) in FIG. 11, respectively. A conceptual diagram of light passing through a lens system, a first region of the first polarizing means, and a third region of the second polarizing means and arriving at an imaging element array is shown in (A) in FIG. 12. A conceptual diagram of light passing through a second region of the first polarizing means and a fourth region of the second polarizing means and arriving at the imaging element array is shown in (B) in FIG. 12. Images formed on the imaging element array by the light shown in (A) and (B) in FIG. 12 are schematically shown in (C) and (D) in FIG. 12, respectively. In the following description, an advancing direction of light will be referred to as a Z-axis direction, the X direction as the horizontal direction (X-axis direction), and the Y direction as the vertical direction (Y-axis direction).

The stereoscopic imaging device of the fifth embodiment or the sixth to twelfth embodiments described later includes:

(A) a first polarizing means 130, 230, 330, 430, 530, or 630 that polarizes light from a subject;

(B) a lens system 20 that collects light from the first polarizing means 130, 230, 330, 430, 530, or 630; and (C) an imaging element array 40 in which solid-state imaging elements 41 are arranged in a 2-dimensional matrix form defined in the X direction (horizontal direction, X-axis direction) and the Y direction (vertical direction, Y-axis direction) orthogonal to the X direction, and which includes a second polarizing means 150 or 250 on a light incident side and which converts light collected by the lens system 20 into an electrical signal.

In the stereoscopic imaging device of the fifth embodiment or the sixth to twelfth embodiments described later, the first polarizing means 130, 230, 330, 430, 530, or 630 includes a first region 131, 231, 331, 531, or 631 and a second region 132, 232, 332, 532, or 632 arranged along the X direction (horizontal direction, X-axis direction), the polarization state of first region-passing light $L_1$ having passed through the first region 131, 231, 331, 531, or 631 is different from the polarization state of second region-passing light $L_2$ having passed through the second region 132, 232, 332, 532, or 632, the second polarizing means 150 or 250 includes a plurality of third regions 151 or 251 and a plurality of fourth regions 152 or 252 which are arranged alternately along the Y direction (vertical direction, Y-axis direction) so as to extend in the X direction (horizontal direction, X-axis direction), and the polarization state of third region-passing light $L_3$ having passed through the third regions 151 or 251 is different from the polarization state of fourth region-passing light $L_4$ having passed through the fourth regions 152 or 252, the first region-passing light $L_1$ passes through the third regions 151 or 251 and arrives at the solid-state imaging element 41, the second region-passing light $L_2$ passes through the fourth regions 152 or 252 and arrives at the solid-state imaging element 41, whereby the stereoscopic imaging device captures an image for obtaining a stereoscopic image in which the distance between a central point $BC_1$ of the first region 131, 231, 331, 531, or 631 and a central point $BC_2$ of the second region 132, 232, 332, 532, or 632 is the baseline length of a binocular parallax.

Here, in the stereoscopic imaging device of the fifth embodiment or the sixth to twelfth embodiments described later, the lens system 20 includes a photographing lens 21, a diaphragm 22, and an imaging lens 23 and functions as a zoom lens. The photographing lens 21 is a lens for collecting incident light from a subject. The photographing lens 21 includes a focus lens for realizing focusing, a zoom lens for enlarging a subject, and the like, and are generally realized by a combination of a plurality of lenses in order to correct chromatic aberration. The diaphragm 22 has a narrowing function in order to adjust the amount of collected light, and is generally formed of a combination of a plurality of plate-shaped blades. At least at the position of the diaphragm 22, light from one point of the subject becomes parallel light. The imaging lens 23 forms light having passed through the first polarizing means 130, 230, 330, 430, 530, or 630 on the imaging element array 40. The imaging element array 40 is disposed in the camera main body 11. In the above configuration, an entrance pupil is positioned closer to the imaging lens 23 than the camera main body. The stereoscopic imaging device constitutes a digital still camera, a video camera, and a camcorder, for example, as described above.

The camera main body 11 includes an image processing means 12 and an image storage unit 13, for example, in addition to the imaging element array 40. Right-eye image data and left-eye image data are formed based on the electrical signal converted by the imaging element array 40. The imaging element array 40 is realized by a CCD element, a CMOS image sensor, or the like, for example, as described above. The image processing means 12 converts the electrical signal output from the imaging element array 40 into right-eye image data and left-eye image data and records the image data in the image storage unit 13.

The first polarizing means 130, 230, 330, 430, 530, or 630 is disposed near the diaphragm 22 of the lens system 20. Specifically, the first polarizing means 130, 230, 330, 430, 530, or 630 is disposed at such a position as close as possible to the diaphragm 22 as long as it does not cause any problem in the operation of the diaphragm 22. The first polarizing means 130, 230, 330, 430, 530, or 630 is disposed in a portion of the lens system 20 such that the light incident to the lens system 20 becomes parallel light, and is in a parallel light state when it is finally collected (formed) on the solid-state imaging element 41 as described above.

In the stereoscopic imaging device 110 of the fifth embodiment, the first polarizing means 130 is made up of the first region 131 and the second region 132. Specifically, the outer shape of the first polarizing means 130 is a circle, and each of the first and second regions 131 and 132 has a half-moon shaped outer shape occupying the half of the first polarizing means 130. The boundary line between the first and second regions 131 and 132 extends along the Y direction. The first polarizing means 130 made up of a combination of two polarization filters splits incident light into two light components having different polarization states. The first polarizing means 130 is made up of horizontally symmetrical polarizers as described above, and generates linearly polarized light components orthogonal to each other or circularly polarized light components of the opposite directions at two left and right positions in the standing state of a camera. The first region 131 is a filter that polarizes an image (light received by the right eye) of a subject viewed by the right eye. On the other hand, the second region 132 is a filter that polarizes an image (light received by the left eye) of a subject viewed by the left eye.

Here, in the stereoscopic imaging device 110 of the fifth embodiment, the first and second regions 131 and 132 are formed of a polarizer. The direction (indicated by the empty arrow) of the electric field of the first region-passing light $L_1$ is orthogonal to the direction (indicated by the empty arrow) of the electric field of the second region-passing light $L_2$ (see (B) in FIG. 11). Here, in the fifth embodiment, the direction of the electric field of the first region-passing light $L_1$ is parallel to the X direction. Specifically, for example, the first region-passing light $L_1$ mainly includes the P waves (TM waves) as the polarized light components, and the second region-passing light $L_2$ mainly includes the S waves (TE waves) as the polarized light components. In addition, the direction of the electric field of the first region-passing light $L_1$ is parallel to the direction (indicated by the empty arrow) of the electric field of the third region-passing light $L_3$, and the direction of the electric field of the second region-passing light $L_2$ is parallel to the direction (indicated by the empty arrow) of the fourth region-passing light $L_4$ (see (C) in FIG. 11). Moreover, the extinction ratio of each polarizer is 3 or higher, and more specifically, 10 or higher.

In the stereoscopic imaging device 110 of the fifth embodiment, the outer shape of the first polarizing means 130 was a circle having a radius of r=10 mm. The first and second regions 131 and 132 had a half-moon shape occupying the half of the first polarizing means 130. Thus, the distance between the central point $BC_1$ of the first region 131 and the central point $BC_2$ of the second region 132 is $[(8r)/3\pi)]=8.5$ mm.

The polarizing element 70 described in the first to fourth embodiments is formed in the third and fourth regions 151 and 152. Here, the first direction (direction parallel to the optical absorption axis) in the polarizing element constituting the third region 151 is parallel to the Y direction, and the first direction in the polarizing element constituting the fourth region 152 is parallel to the X direction.

In the imaging method of the fifth embodiment, the solid-state imaging element 41 generates an electrical signal for obtaining the right-eye image data using the first region-passing light $L_1$ which has passed through the third region 151 and arrived at the solid-state imaging element 41. Moreover, the solid-state imaging element 41 generates an electrical signal for obtaining the left-eye image data using the second region-passing light $L_2$ which has passed through the fourth region 152 and arrived at the solid-state imaging element 41. These electrical signals are output simultaneously or alternately in a time-sequential order. The output electrical signals (electrical signals for obtaining the right-eye image data and the left-eye image data output from the imaging element array 40) are subject to image processing by the image processing means 12 and are recorded in the image storage unit 13 as the right-eye image data and the left-eye image data.

As schematically shown in (A) and (B) in FIG. 12, it is assumed that the lens system 20 is in focus on a square object A. Moreover, it is assumed that a round object B is positioned closer to the lens system 20 than the object A. The image of the square object A is formed on the imaging element array 40 in a focused state. Moreover, the image of the round object B is formed on the imaging element array 40 in a non-focused state. In the example shown in (A) in FIG. 12, the object B is imaged on the imaging element array 40 at a position separated by a distance $(+\Delta X)$ on the right-hand side of the object A. On the other hand, in the example shown in (B) in FIG. 12, the object B is imaged on the imaging element array 40 at a position separated by a distance $(-\Delta X)$ on the left-hand side of the object A. Thus, the distance $(2 \times \Delta X)$ serves as the information on the depth of the object B. That is, the amount of blurring and the direction of blurring of an object positioned on a side closer to the solid-state imaging device than the object A are different from the amount of blurring and the direction of blurring of an object positioned on a side farther from the solid-state imaging device than the object A, and the amount of blurring of the object B is different depending on the distance between the object A and the object B. Thus, a stereoscopic image in which the distance between the central positions of the shapes of the first and second regions 131 and 132 of the first polarizing means 130 is the baseline length of a binocular parallax can be obtained. That is, a stereoscopic image can be obtained based on a known method from the right-eye image (see the schematic diagram of (C) in FIG. 12) and the left-eye image (see the schematic diagram of (D) in FIG. 12) obtained in this way. When the right-eye image data and the left-eye image data are combined together, a general 2-dimensional (planar)) image rather than a stereoscopic image can be obtained.

As shown by the conceptual diagram in FIG. 13, in the fifth embodiment, the imaging element array 40 has the Bayer arrangement, and one pixel is made up of four solid-state imaging elements (one red solid-state imaging element R for receiving red light, one blue solid-state imaging element B for receiving blue light, and two green solid-state imaging elements G for receiving green light). The third region 151 is disposed in one row of pixels arranged along the X direction, and similarly, the fourth region 152 is disposed in one row of pixels arranged along the X direction to be adjacent in the Y direction to the pixels. The third and fourth regions 151 and 152 are disposed alternately along the Y direction. Although the third and fourth regions 151 and 152 generally extend in the X direction, the unit lengths along the X and Y directions of the third and fourth regions 151 and 152 are the same as the lengths along the X and Y directions of the solid-state imaging element 41. With such a configuration, a strip-shaped image (right-eye image) extending in the X direction based on light mainly having P-wave components and a strip-shaped image (left-eye image) extending in the X direction based on light mainly having S-wave components are generated alternately along the Y direction. In FIG. 13, although vertical lines are inserted in the third regions 151 and horizontal lines are inserted in the fourth regions 152, these lines schematically show the second direction (which is the repetition direction of the stripe-shaped reflecting layer and the direction orthogonal to the extension direction of the stripe-shaped reflecting layer and is the optical transmission axis) of the polarizing element. The same is applied to FIG. 16 and FIG. 20 to FIG. 24.

The electrical signals for obtaining the right-eye image data and the left-eye image data are generated along the Y direction in a kind of loose-tooth state as described above. Thus, the image processing means 12 performs demosaic processing on the electrical signals and performs interpolation processing based on super-resolution processing, for example, in order to create the right-eye image data and the left-eye image data. In this way, the right-eye image data and the left-eye image data are generated and created. Moreover, parallaxes may be emphasized and optimized by a parallax detection technique of creating a disparity map through stereo matching from the left-eye image data and the right-eye image data, for example, and a parallax control technique of controlling parallaxes based on the disparity map.

FIG. 14 shows a conceptual diagram of an imaging element array having the Bayer arrangement, for explaining image processing (mosaic processing) of performing demosaic processing on electrical signals obtained from a solid-state imaging element to obtain signal values. FIG. 14 shows an example of generating a signal value of a left-eye image in relation to a green solid-state imaging element. In general demosaic processing, the average value of electrical signals of adjacent solid-state imaging elements of the same color is generally used. However, when a pixel group (pixel row) for obtaining right-eye image data and a pixel group (pixel row) for obtaining left-eye image data are repeated alternately similarly to the fifth embodiment, there is a concern that the original image data are not obtained if the adjacent values are used as they were. Therefore, demosaic processing is performed by checking whether the electrical signal of a referenced solid-state imaging element corresponds to right-eye image data or left-eye image data.

In the Bayer arrangement, it is assumed that a red solid-state imaging element R is disposed at the position (4,2). In this case, in order to generate a signal value g' of a green solid-state imaging element corresponding to the position (4,2), calculation expressed by the following equation is performed.

$$g'_{4,2} = (g_{4,1} + g_{4,3} + g_{5,2} + g_{1,2} \times W_3)/(3.0/W_3)$$

Here, $g'_{i,j}$ on the left side is a signal value of a green solid-state imaging element at the position (i,j). Moreover, $g_{i,j}$ on the right side is the value of an electrical signal of a green solid-state imaging element at the position (i,j). In addition, when the distance ($W_1$) of the target solid-state imaging element $G_{4,2}$ to each of the adjacent solid-state imaging elements $G_{4,1}$, $G_{4,3}$, and $G_{5,2}$ is "1.0", for example, and the inverse numbers thereof are weighting factors, "3.0" corresponds to the sum of these weights. Similarly, $W_3$ is a weighting factor of the value of the electrical signal of the solid-state imaging element $G_{1,2}$ separated by a distance of three solid-state imaging elements, which in this case, is "⅓". The above equation is generalized as the following equation.

For even "i" (the signal value of the green solid-state imaging element G corresponding to the position of the red solid-state imaging element R), $$g'_{i,j} = (g_{i,j-1} \times W_1 + g_{i,j+1} \times W_1 + g_{i+1,j} \times W_1 + g_{i-3,j} \times W_3)/(W_1 \times 3.0 + W_3)$$

If odd "i" (the signal value of the green solid-state imaging element G corresponding to the position of the blue solid-state imaging element B), $$g'_{i,j} = (g_{i,j-1} \times W_1 + g_{i,j+1} \times W_1 + g_{i-1,j} \times W_1 + g_{i+3,j} \times W_3)/(W_1 \times 3.0 + W_3)$$

Here, $W_1 = 1.0$ and $W_3 = \frac{1}{3}$.

Demosaic processing can be performed on the red solid-state imaging element R and the blue solid-state imaging element B based on the same thinking.

Although the signal values of the solid-state imaging elements at the positions of the respective solid-state imaging elements can be obtained through demosaic processing, in this stage, the signal values are in a kind of loose-tooth state as described above. Thus, for regions where the signal value of the solid-state imaging element is not present, it is necessary to generate the signal value of the solid-state imaging element by interpolation. As an interpolation method, a known method such as a method using an averaged sum of adjacent values can be used. The interpolation processing may be performed in parallel with demosaic processing. Since image quality is completely held in the X direction, deterioration of image quality such as deterioration of resolution of the entire image is relatively small.

In the fifth embodiment, since the stereoscopic imaging device 110 includes a set of first and second polarizing means 130 and 150 and one lens system 20, it is possible to generate two different images split in the horizontal direction, for example, at the same time and to provide a compact monocular stereoscopic imaging device having a simple configuration and structure and few constituent components. Moreover, since two sets of the combination of a lens and a polarization filter are not required, there will be no shift or difference in zooming, the diaphragm, focusing, the convergence angle, or the like. Furthermore, since the baseline length of a binocular parallax is relatively short, a natural stereoscopic effect can be obtained. In addition, when a structure in which the first polarizing means 130 is removable, it is possible to easily obtain a 2-dimensional image and a 3-dimensional image.

Sixth Embodiment

The sixth embodiment is a modification of the fifth embodiment. In the fifth embodiment, the direction of the electric field of the first region-passing light $L_1$ was parallel to the X direction. On the other hand, in the sixth embodiment, the direction of the electric field of the first region-passing light $L_1$ is at the angle of 45° with respect to the X direction. That is, the extension direction (first direction) of the stripe-shaped reflecting layer in the polarizing element is at the angle of 45° C. with respect to the arrangement direction of a plurality of solid-state imaging elements. The polarization states of the first and second polarizing means 230 and 250 provided to the stereoscopic imaging device of the sixth embodiment are schematically shown in (A) and (B) in FIG. 15.

A conceptual diagram of the imaging element array 40 having the Bayer arrangement is shown in FIG. 16. In the sixth embodiment, in the imaging element array 40, one pixel is made up of four solid-state imaging elements (one red solid-state imaging element R for receiving red light, one blue solid-state imaging element B for receiving blue light, and two green solid-state imaging elements G for receiving green light). A third region 251 is disposed in one row of pixels arranged along the X direction, and similarly, a fourth region 252 is disposed in one row of pixels arranged along the X direction to be adjacent in the Y direction to the pixels. The third and fourth regions 251 and 252 are disposed alternately along the Y direction. Although the third and fourth regions 251 and 252 generally extend in the X direction, the unit lengths of the third and fourth regions 251 and 252 are the same as the length of one solid-state imaging element. With such a configuration, a strip-shaped image (right-eye image) extending in the X direction based on light mainly having P-wave components and a strip-shaped image (left-eye image) extending in the X direction based on light mainly having S-wave components are generated alternately along the Y direction. In FIG. 16, although oblique lines are inserted in the third and fourth regions 251 and 252, these lines schematically show the reflecting layer of the polarizing element.

Since the configuration and structure of the stereoscopic imaging device of the sixth embodiment except for these aspects are the same as the configuration and structure of the stereoscopic imaging device 110 described in the fifth embodiment, detailed description thereof will not be provided. The configuration and structure of the stereoscopic imaging device of the sixth embodiment can be applied to the stereoscopic imaging device of the seventh to twelfth embodiments described later.

Seventh Embodiment

The seventh embodiment is a modification of the fifth embodiment. In the stereoscopic imaging device of the seventh embodiment, a central region 333 is provided between the first and second regions 331 and 332 of a first polarizing means 330, and the polarization state of central region-passing light having passed through the central region 333 is not changed from that before it is incident to the central region 333. That is, the central region 333 is in a not-covered state in relation to polarized light.

However, when incident light passes through the first polarizing means, the quantity thereof decreases in proportion to the spectral characteristics and the extinction ratio, and a dark display is realized. Here, the extinction ratio is the ratio between the quantity of passing light selected by the polarizer and the quantity of leaking light reflected or absorbed by the polarizer without being selected by the polarizer. Specifically, in the case of a polarizer that transmits P-wave components having an extinction ratio of 10, for example, this polarizer transmits P and S-wave components by the ratio of 50:5 when the intensity of incident natural light where the ratio of P-wave component to S-wave component is 50:50 is 100. Moreover, in the case of a polarizer that transmits P-wave components having an extinction ratio of ∞, this polarizer transmits 100% of the P-wave component and does not transmit the S-wave components by totally reflecting or completely absorbing the S-wave components. Thus, when average natural light is incident, a brightness of about ½ is realized. The quantity of light having passed through the first and second polarizing means 130 and 150 shown in (B) and (C) in FIG. 11 becomes about 25% of the quantity of light before entering the first polarizing means 130 even if a transmission loss is zero. Moreover, when the light having passed through the first and second regions is incident to the imaging element array 40 in a mixed state and a not-separable state, the baseline length of a binocular parallax decreases in proportion to the mixing ratio. In a state where the light components are completely mixed, the left-eye image and the right-eye image become identical images, so that a parallax is not realized, and stereoscopic vision is not realized.

Although light intensity is strong in the central region 333 of the first polarizing means 330, the parallax amount is small. Thus, by employing the first polarizing means 330 of the seventh embodiment, it is possible to secure a sufficiently large baseline length of a binocular parallax while increasing the intensity of light received by the imaging element array 40. As shown by the schematic diagram of the first polarizing means 330 in (A) in FIG. 17, when the outer shape of the first polarizing means 330 is made to be circular, the central region 333 can be made to be circular, and the first and second regions 331 and 332 can be made to be a fan shape so as to surround the central region 333 with a central angle of 180°. Alternatively, as shown by the schematic diagrams of the first polarizing means 330 in (B) and (C) in FIG. 17, the central region 333 can be made to be rhombic or square, and the first and second regions 331 and 332 can be made to be shaped similar to a fan shape so as to surround the central region 333 with a central angle of 180°. Alternatively, as shown by the schematic diagram of the first polarizing means 330 in (D) in FIG. 17, the first region 331, the central region 333, and the second region 332 can be made to be strip-shaped so as to extend in the Y direction.

Since the configuration and structure of the stereoscopic imaging device of the seventh embodiment except for these aspects are the same as the configuration and structure of the stereoscopic imaging device 110 described in the fifth embodiment, detailed description thereof will not be provided. The configuration and structure of the stereoscopic imaging device of the seventh embodiment can be applied to the stereoscopic imaging device of the eighth to twelfth embodiments described later.

Eighth Embodiment

The eighth embodiment is a modification of the fifth embodiment. A conceptual diagram of a stereoscopic imaging device 410 of the eighth embodiment is shown in FIG. 18. In the stereoscopic imaging device 410 of the eighth embodiment, a ¼-wavelength plate (λ/4-wavelength plate) 433 is disposed on the light incident side of a first polarizing means 430. In this way, the occurrence of so-called binocular rivalry can be eliminated. The ¼-wavelength plate 433 may be removably attached to a filter attaching portion provided to a lens system. When light passes through the ¼-wavelength plate 433, the polarization direction thereof is rearranged (that is, the light is linearly polarized). Such light passes through the first and third regions 131 and 151 and arrives at the imaging element array 40, whereby images are obtained. Moreover, such light passes through the second and fourth regions 132 and 152 and arrives at the imaging element array 40, whereby images are obtained. In these images, no great difference occurs between images of a portion of a subject which reflects P-wave components and absorbs S-wave components. It is possible to eliminate the occurrence of binocular rivalry. It is desirable that the fast axis of the ¼-wavelength plate 433 is at a predetermined angle (specifically, the angle of 45° or the angle of 45°±10°) with respect to the direction of the electric field of the first region-passing light in the stereoscopic imaging device described in the first or second embodiment.

Ninth Embodiment

The ninth embodiment is a modification of the fifth embodiment.

A conceptual diagram of a stereoscopic imaging device 510 of the ninth embodiment is shown in (A) in FIG. 19, and the polarization states of the first and second polarizing means are schematically shown in (B) and (C) in FIG. 19, respectively. In the stereoscopic imaging device 510 of the ninth embodiment, in order to eliminate the occurrence of binocular rivalry, a polarizing plate 534 having a polarization axis of α° is disposed on the light incident side of a first polarizing means 530. Moreover, the first region 531 is formed of a first wavelength plate, the second region 532 is formed of a second wavelength plate, and the direction of the electric field of the first region-passing light $L_1$ is orthogonal to the direction of the electric field of the second region-passing light $L_2$. More specifically, the value of α is 45°, the first wavelength plate constituting the first region 531 is formed of a ½-wavelength plate (λ/2-wavelength plate), and the second wavelength plate constituting the second region 532 is formed of a ½-wavelength plate (−λ/2-wavelength plate) having a different phase difference from the ½-wavelength plate constituting the first wavelength plate. In this way, the direction of the electric field of the first region-passing light $L_1$ is parallel to the X direction, and the direction of the electric field of the second region-passing light $L_2$ is parallel to the Y direction. The polarizing plate 534 is fixed to the lens system.

Tenth Embodiment

The tenth embodiment is a modification of the fifth embodiment. As shown by the conceptual diagram of an imaging element array having the Bayer arrangement in FIG. 20, in the stereoscopic imaging device of the tenth embodiment, one third region 151 and one fourth region 152 are disposed with respect to N pixels (where N=$2^n$, n is a natural number of 1 to 5, and specifically, n=3 in the tenth embodiment) along the Y direction. Moreover, an electrical signal for obtaining a right-eye image and an electrical signal for obtaining a left-eye image are obtained based on a depth map (depth information) based on a parallax amount generated from an electrical signal obtained by the first region-passing light having passed through the third region 151 and an electrical signal obtained by the second region-passing light having passed through the fourth region 152 and the electrical signals from all of the solid-state imaging elements 41 constituting the imaging element array 40. However, the associated method itself may be a known method. Demosaic processing may be performed based on all of the electrical signals from solid-state imaging elements where the third and fourth regions are disposed and solid-state imaging elements where the regions are not disposed. Moreover, portions obtained by thinning out the row of solid-state imaging elements where the third and fourth regions are disposed may be interpolated by super-resolution processing to generate image data. Moreover, the image quality and pixel count of the depth map need not be in the 1:1 relation with respect to the image quality and pixel count of an image. This is because, in most photographic scenes, individual subjects are sufficiently larger than a pixel resolution, and unless a distance difference as small as the pixel resolution is present in the individual subjects, the same distance information resolution as the pixel resolution of an image is not required. Moreover, in such a sense of distance difference, if the horizontal resolution is sufficient, the sense of incongruity is small even when the vertical resolution is low.

Alternatively, although a conceptual diagram of an imaging element array having the Bayer arrangement of a first modified example of the stereoscopic imaging device of the tenth embodiment is shown in FIG. 21, a configuration in which one third region 151 and one fourth region 152 are disposed with respect to two pixels along the X direction may be employed. In the example shown in FIG. 21, the third region 151 and the fourth region 152 are disposed in a zigzag form (checkered form). That is, although the third region 151 is adjacent to the fourth region 152 in one boundary thereof along the Y direction, the third region 151 is not adjacent to the fourth region 152 in the other boundary thereof.

Alternatively, although a conceptual diagram of an imaging element array having the Bayer arrangement of a second modified example of the stereoscopic imaging device of the tenth embodiment is shown in FIG. 22, the third and fourth regions 151 and 152 are not disposed in the red and blue solid-state imaging elements R and B for receiving red and blue light, respectively, but the third region 151 is disposed in one of the two green solid-state imaging elements G for receiving green light and the fourth region 152 is disposed in the other green solid-state imaging element G. Moreover, although a conceptual diagram of an imaging element array of the Bayer arrangement of a third modified example of the stereoscopic imaging device of the tenth embodiment is shown in FIG. 23, a configuration in which the third region 151 is disposed in one of the two green solid-state imaging elements G for receiving green light and the fourth region 152 is disposed in the other green solid-state imaging element G, and in which one third region 151 and one fourth region 152 are disposed with respect to N pixels (where N=2$^n$, and n=2 in the shown example) along the Y direction may be employed. Moreover, as shown in FIG. 24, the third and fourth regions 151 and 152 may be disposed in a zigzag form (checkered form).

Eleventh Embodiment

The eleventh embodiment includes a modification of the stereoscopic imaging device of the fifth to seventh embodiments and the ninth and tenth embodiments. A conceptual diagram of a solid-state imaging device according to the eleventh embodiment is shown in (A) in FIG. 25, a conceptual diagram of a ¼-wavelength plate is shown in (B) in FIG. 25, the polarization state of the first polarizing means is schematically shown in (C) in FIG. 25, and the polarization state of a polarizer (second polarizing means) is schematically shown in (D) in FIG. 25.

A solid-state imaging device 610 of the eleventh embodiment includes:

(A) a ¼-wavelength plate 633;

(B) a lens system 20 that collects light from the ¼-wavelength plate 633; and (C) an imaging element array 40 in which solid-state imaging elements 41 are arranged in a 2-dimensional matrix form defined in the X direction (horizontal direction, X-axis direction) and the Y direction (vertical direction, Y-axis direction) orthogonal to the X direction, and which includes a polarizer 150 or 250 on a light incident side and which converts light collected by the lens system 20 into an electrical signal. With the solid-state imaging device of the eleventh embodiment having such a simple configuration and structure, it is possible to easily capture a general 2-dimensional image. Moreover, it is possible to easily incorporate the solid-state imaging device of the eleventh embodiment having such a configuration and structure into the stereoscopic imaging device of the fifth to seventh embodiments and the ninth and tenth embodiments. In this way, it is possible to easily capture a general 2-dimensional image as well as a stereoscopic image with high quality.

Here, the polarizer 150 or 250 includes a plurality of first regions 151 or 251 and a plurality of second regions 152 or 252 which are disposed alternately along the Y direction (vertical direction, Y-axis direction) so as to extend in the X direction (horizontal direction, X-axis direction), the polarization state of first region-passing light having passed through the first regions 151 or 251 is different from the polarization state of second region-passing light having passed through the second regions 152 or 252, and the fast axis (indicated by the black arrow in (B) in FIG. 25 and (A), (D) and (E) in FIG. 26) of the ¼-wavelength plate 633 is at a predetermined angle with respect to the direction of the electric field of the first region-passing light. The predetermined angle is 45° or 45°±10°. The same is applied to the following description. Moreover, the direction of the electric field of the first region-passing light is orthogonal to the direction of the electric field of the second region-passing light. The direction of the electric field of the first region-passing light is parallel to the X direction (see (D) in FIG. 25), and alternatively, the direction of the electric field of the first region-passing light is at an angle of 45° with respect to the X direction (see (C) in FIG. 26). The ¼-wavelength plate 633 has a configuration and structure similar to the diaphragm blade of a lens, for example, and is disposed in the lens system 20.

The polarizer 150 or 250 of the solid-state imaging device 610 of the eleventh embodiment described above corresponds to the second polarizing means 150 or 250 of the stereoscopic imaging device of the fifth to seventh embodiments and the ninth and tenth embodiments. The plurality of first regions 151 or 251 and the plurality of second regions 152 or 252 of the polarizing means 150 or 250 correspond to the third regions 151 or 251 and the fourth regions 152 or 252 of the stereoscopic imaging device of the fifth to seventh embodiments and the ninth and tenth embodiments, respectively. In the following description, in order to prevent confusion, the polarizer will be unified to "second polarizing means 150 or 250", and the polarizing means 150 or 250 (the third regions 151 or 251 and the fourth regions 152 or 252 of the stereoscopic imaging device of the fifth to seventh embodiments and the ninth and tenth embodiments) of the solid-state imaging device 610 of the eleventh embodiment is expressed as a "fifth region 151 or 251" and a "sixth region 152 or 252".

Alternatively, in the solid-state imaging device 610 of the eleventh embodiment, the ¼-wavelength plate 633 is disposed on the light incident side of the first polarizing means 630, and the fast axis of the ¼-wavelength plate 633 is at a predetermined angle with respect to the direction of the electric field of the first region-passing light $L_1$. The direction of the electric field of the first region-passing light $L_1$ is parallel to the direction of the electric field of the third region-passing light $L_2$, and the direction of the electric field of the second region-passing light $L_2$ is parallel to the direction of the electric field of the fourth region-passing light $L_4$.

As will be described in the twelfth embodiment, the ¼-wavelength plate 633 may be made up of a first ¼-wavelength plate 633A and a second ¼-wavelength plate 633B arranged along the Y direction. The fast axis of the first ¼-wavelength plate 633A may be at a predetermined angle with respect to the direction of the electric field of the fifth region-passing light. The fast axis of the second ¼-wavelength plate 633B is orthogonal to the fast axis of the first ¼-wavelength plate 633A (in other words, the fast axis of the second ¼-wavelength plate 633B is parallel to the slow axis of the first ¼-wavelength plate 633A). In the solid-state imaging device of the eleventh embodiment including such an aspect, the predetermined angle may be 45° or 45°±10°. In addition, in the solid-state imaging device of the eleventh embodiment including such an aspect, the direction of the electric field of the fifth region-passing light may be orthogonal to the direction of the electric field of the sixth region-passing light. In this case, the direction of the electric field of the fifth region-passing light may be parallel to the X direction, and alternatively, the direction of the electric field of the fifth region-passing light may be at an angle of 45° with respect to the X direction. In addition, in the solid-state imaging device of the eleventh embodiment including such an aspect, the ¼-wavelength plate may be removably attached to the lens system.

Alternatively, when the solid-state imaging device 610 of the eleventh embodiment is applied to the stereoscopic imaging device of the fifth to seventh embodiments and the ninth and tenth embodiments, the ¼-wavelength plate 633 may be disposed on the light incident side of the first polarizing means 630, and the fast axis of the ¼-wavelength plate 633 may be at a predetermined angle with respect to the direction of the electric field of the first region-passing light $L_1$. Alternatively, as will be described in the twelfth embodiment, the ¼-wavelength plate 633 may be made up of a first ¼-wavelength plate 633A and a second ¼-wavelength plate 633B arranged along the Y direction. The fast axis of the first ¼-wavelength plate 633A may be at a predetermined angle with respect to the direction of the electric field of the first region-passing light $L_1$. The fast axis of the second ¼-wavelength plate 633B may be orthogonal to the fast axis of the first ¼-wavelength plate 633A (in other words, the fast axis of the second ¼-wavelength plate 633B is parallel to the slow axis of the first ¼-wavelength plate 633A). In such an aspect, the predetermined angle may be 45° or 45°±10°. In addition, in such an aspect, the direction of the electric field of the first region-passing light $L_1$ may be parallel to the direction of the electric field of the third region-passing light $L_3$, and the direction of the electric field of the second region-passing light $L_2$ may be parallel to the direction of the electric field of the fourth region-passing light $L_4$. In addition, in such an aspect, the first polarizing means 630 may be removably attached to the lens system 20, and the ¼-wavelength plate 633 may be removably attached to the lens system 20. Furthermore, in such an aspect, the ¼-wavelength plate 6330 may be adjacent to the first polarizing means 630, and for example, may be arranged on the light incident side of the first polarizing means 630.

In the solid-state imaging device 610 of the eleventh embodiment, the first polarizing means 630 is removably attached to the lens system 20, and the ¼-wavelength plate 633 is also removably attached to the lens system 20. The ¼-wavelength plate 633 is arranged to be adjacent to the first polarizing means 630. In (A) in FIG. 25, although the ¼-wavelength plate 633 and the first polarizing means 630 are illustrated in that order from the light incident side, in some cases, the first polarizing means 630 and the ¼-wavelength plate 633 may be disposed in that order. By disposing the ¼-wavelength plate 633 and the first polarizing means 630 in that order from the light incident side and disposing the ¼-wavelength plate 633 and the first polarizing means 630 in the lens system, it is possible to capture a 3-dimensional image (stereoscopic image). Alternatively, by disposing the first polarizing means 630 in the lens system and removing the ¼-wavelength plate 633 from the lens system, it is possible to capture a 3-dimensional image (stereoscopic image). By disposing the ¼-wavelength plate 633 in the lens system and removing the first polarizing means 630 from the lens system, it is possible to capture a 2-dimensional image. On the other hand, by disposing the first polarizing means 630 and the ¼-wavelength plate 633 in that order from the light incident side, disposing the first polarizing means 630 in the lens system, and removing the ¼-wavelength plate 633 from the lens system, it is possible to capture a 3-dimensional image (stereoscopic image). By disposing the ¼-wavelength plate 633 in the lens system and removing the first polarizing means 630 from the lens system, it is possible to capture a 2-dimensional image. The fast axis of the ¼-wavelength plate 633 indicated by the black arrow extending in the top-right direction of 45° in (B) in FIG. 25 is not limited to this direction but may extend in the top-left direction of 45°. Moreover, a conceptual diagram of the ¼-wavelength plate of the solid-state imaging device of the eleventh embodiment, and modified examples of the polarization state of the first polarizing means and the polarization state of the polarizer (second polarizing means) are shown in (A), (B) and (C) in FIG. 26, respectively. This example is a modification of the sixth embodiment shown in FIG. 15.

When the ¼-wavelength plate 633 is removably attached to the lens system 20, the ¼-wavelength plate 633 may have a configuration and structure similar to the diaphragm blade of a lens and may be disposed in the lens system, for example, as described above. Alternatively, in the lens system 20, a configuration and a structure in which a member where the ¼-wavelength plate 633 and an opening are formed is pivotably attached to a pivot shaft parallel to the optical axis of the lens system 20, and the member is pivoted about the pivot shaft, whereby light passing through the lens system 20 passes through the opening or passes through the ¼-wavelength plate 633 may be employed. Alternatively, in the lens system 20, a configuration and structure in which a member where the ¼-wavelength plate 633 and an opening are formed is attached to the lens system so as to be movable in a direction orthogonal to the optical axis of the lens system 20, for example, and the member is moved, whereby light passing through the lens system 20 passes through the opening or passes through the ¼-wavelength plate 633 may be employed. In this case, the ¼-wavelength plate 633 may be formed of a plurality of members, and the respective members may be configured to be movable in the direction orthogonal to the optical axis of the lens system 20.

When the first polarizing means 630 is removed from the lens system 20 and photographing of a general 2-dimensional image is performed, if light incident to the solid-state imaging device includes linearly polarized light, a difference may occur between the intensity of light having passed through the fifth region 151 or 251 and the intensity of light having passed through the sixth region 152 or 252. As a result, a difference in the density of light may appear in stripes in the obtained 2-dimensional image. In the solid-state imaging device of the eleventh embodiment, since the ¼-wavelength plate 633 of which the fast axis is at a predetermined angle (specifically, 45° or 45°±10°) with respect to the direction of the electric field of the third region-passing light is incorporated, the linearly polarized light incident to the ¼-wavelength plate 633 becomes circularly polarized light, which is then output from the ¼-wavelength plate 633. Thus, a difference scarcely occurs between the intensity of the light having passed through the fifth region 151 or 251 and the light having passed through the sixth region 152 or 252, and there is no concern about the occurrence of the difference in the density of light in stripes in the obtained 2-dimensional image.

Twelfth Embodiment

The twelfth embodiment is a modification of the eleventh embodiment.

As shown by the conceptual diagram of a ¼-wavelength plate of a solid-state imaging device of the twelfth embodiment in (D) or (E) in FIG. 26, in the twelfth embodiment, the ¼-wavelength plate 633 is made up of a first ¼-wavelength plate 633A and a second ¼-wavelength plate 633B arranged along the Y direction. The first ¼-wavelength plate 633A and the second ¼-wavelength plate 633B are integrated with each other. The fast axis of the first ¼-wavelength plate 633A is at a predetermined angle with respect to the direction of the electric field of the third region-passing light, and the fast axis of the second ¼-wavelength plate 633B is orthogonal to the fast axis of the first ¼-wavelength plate 633A. In other words, the fast axis of the second ¼-wavelength plate 633B is parallel to the slow axis of the first ¼-wavelength plate 633A. Here, the predetermined angle is 45° or 45°±10°. The example shown in (D) in FIG. 26 is a modification of the example shown in (B) in FIG. 25, and the example shown in (E) in FIG. 26 is a modification of the example shown in (A) in FIG. 26. Since the configuration and structure of the stereoscopic imaging device of the twelfth embodiment except for these aspects are the same as the configuration and structure of the stereoscopic imaging device of the eleventh embodiment, detailed description thereof will not be provided. Since the ¼-wavelength plate 633 is made up of the first ¼-wavelength plate 633A and the second ¼-wavelength plate 633B, a difference is less likely to occur between the intensity of the light having passed through the fifth region 151 or 251 and the intensity of the light having passed through the sixth region 152 or 252.

While preferred embodiments of the present invention have been described, the present invention is not limited to these embodiments. The configuration and structure of the polarizing element, the solid-state imaging element, the solid-state imaging device, and the imaging apparatus described in the embodiments are exemplary, and can be changed appropriately. For example, the solid-state imaging element may have a configuration in which the first planarization film, the on-chip lens, the second planarization film, the color filter layer, the inorganic insulating base layer, and the polarizing element of the present invention are stacked on the photoelectric conversion element formed on the silicon semiconductor substrate. Moreover, the solid-state imaging element may be a front-illuminated type as well as a back-illuminated type.

Although the stereoscopic image is displayed based on right-eye image data and left-eye image data, examples of a display method thereof include a method in which a circularly or linearly polarizing filter is provided to two projectors so as to display left and right-eye images, and the images are observed with the corresponding circularly or linearly polarized glasses, a lenticular lens method, and a parallax barrier method. When the images are observed without using the circularly or linearly polarized glasses, a general 2-dimensional (planar) image can be observed. The procedures described in the embodiments of the present invention may be treated as a method having a series of procedures and may be treated as a program for executing a series of procedures on a computer or a recording medium for storing the program. As this recording medium, for example, a Compact Disc (CD), a Mini Disc (MD), a Digital Versatile Disc (DVD), a memory card, a Blu-ray Disc (registered trademark) or the like may be used.

Alternatively, when the polarizing element described in the embodiments is formed on a transparent substrate or a base, and two kinds of polarizing elements are allocated to right and left-eye pixels of an image display device such as a television receiver, it is possible to obtain a stereoscopic image. Alternatively, by embedding a plurality of images in a single image, a plurality of persons can view a plurality of different images (programs) at the same time. In addition, when two layers of an uneven structure for vertical polarization and an uneven structure for horizontal polarization are formed in a recording medium of an optical pickup of DVD or Blu-ray optical-disc system, it is possible to record twice the amount of information with the same size by using two kinds of laser polarized in vertical and horizontal directions. The present invention can also be applied to optical communications equipment and the like.

REFERENCE SIGNS LIST 110, 410, 510: STEREOSCOPIC IMAGING DEVICE
610: SOLID-STATE IMAGING DEVICE
11: CAMERA MAIN BODY
12: IMAGE PROCESSING MEANS
13: IMAGE STORAGE UNIT
20: LENS SYSTEM
21: PHOTOGRAPHING LENS
22: DIAPHRAGM
23: IMAGING LENS
130, 230, 330, 430, 530, 630: FIRST POLARIZING MEANS
131, 231, 331, 531, 631: FIRST REGION
132, 232, 332, 532, 632: SECOND REGION
333: CENTRAL REGION
433, 633: ¼-waveLENGTH PLATE (λ/4-WAVELENGTH PLATE)
633A: FIRST ¼-waveLENGTH PLATE (λ/4-WAVELENGTH PLATE)
633B: SECOND ¼-waveLENGTH PLATE (λ/4-WAVELENGTH PLATE)
534: POLARIZING PLATE
40: IMAGING ELEMENT ARRAY
41: SOLID-STATE IMAGING ELEMENT
150, 250: SECOND POLARIZING MEANS(POLARIZER)
151, 251: THIRD REGION (FIFTH REGION)
152, 252: FOURTH REGION (SIXTH REGION)
60: SILICON SEMICONDUCTOR SUBSTRATE
61, 81: PHOTOELECTRIC CONVERSION ELEMENT
62: FIRST PLANARIZATION FILM
63, 83: WAVELENGTH SELECTING LAYER (COLOR FILTER LAYER)
64, 84: ON-CHIP LENS
65: PLANARIZATION LAYER (SECOND PLANARIZATION FILM)
66: INTERLAYER INSULATING LAYER (INORGANIC INSULATING BASE LAYER)
67: LIGHT BLOCKING PORTION
68: LIGHT BLOCKING LAYER
70: POLARIZING ELEMENT
71: REFLECTING LAYER
71A: REFLECTING LAYER-FORMING LAYER
72: INSULATING LAYER
72A: INSULATING LAYER-FORMING LAYER
73: LIGHT ABSORPTION LAYER
73': SEGMENT OF LIGHT ABSORPTION LAYER
73A: LIGHT ABSORPTION LAYER-FORMING LAYER
74: PROTECTIVE FILM
82: INTERLAYER INSULATING LAYER (FIRST PLANARIZATION FILM)
88: POLARIZING ELEMENT-FILLING MATERIAL LAYER
89: SECOND PLANARIZATION FILM

The invention claimed is:

1. A solid-state imaging device comprising:
a plurality of solid-state imaging elements each including:
(A) a photoelectric conversion element, and
(B) a polarizing element formed on a light incident side of the photoelectric conversion element,
wherein the solid-state imaging device includes two or more kinds of polarizing elements having different polarization orientations,
wherein each of the polarizing elements has a stacked structure in which a stripe-shaped reflecting layer, an insulating layer formed on the reflecting layer, and a light absorption layer made up of a plurality of segments formed on the insulating layer in a separated state are stacked in that order from the photoelectric conversion element side,
wherein an on-chip lens is disposed above the photoelectric conversion element,
wherein the polarizing element is formed above the on-chip lens, and
wherein a light blocking layer is formed in a region positioned between adjacent on-chip lenses and in a region within a plane positioned between the on-chip lens and the polarizing element.

2. The solid-state imaging device according to claim 1,
wherein an extension direction of the stripe-shaped reflecting layer is identical to a polarization orientation where light is to be extinct, and
wherein a repetition direction of the stripe-shaped reflecting layer is identical to a polarization orientation where light is to be transmitted.

3. The solid-state imaging device according to claim 1,
wherein the length of the reflecting layer in the extension direction of the stripe-shaped reflecting layer is smaller than the length of the solid-state imaging element along the extension direction of the stripe-shaped reflecting layer.

4. The solid-state imaging device according to claim 1,
wherein when the distance in an optical axis direction between the polarizing element and the on-chip lens is D, the amount of sagging of the on-chip lens is S, a refractive index of a medium present between the polarizing element and the on-chip lens is $n_1$, the width of a gap present between adjacent polarizing elements is $2 \times R$, and the maximum value of an incidence angle of light into the polarizing element is $\theta_{in\text{-}max}$, the following relation is satisfied:

$R \geq (D+S) \times \tan[\sin^{-1}\{\sin(\theta_{in\text{-}max})/n_1\}]$.

5. The solid-state imaging device according to claim 1,
wherein a planarization layer and an interlayer insulating layer formed of an inorganic material are formed between the on-chip lens and the polarizing element in that order from the on-chip lens side.

6. The solid-state imaging device according to claim 1,
wherein a wavelength selecting layer is disposed between the photoelectric conversion element and the on-chip lens.

7. The solid-state imaging device according to claim 1,
wherein when a formation pitch of the segments of the light absorption layer in the extension direction of the stripe-shaped reflecting layer is $P_{ab\text{-}1}$, a formation pitch of the segments of the light absorption layer in the repetition direction of the stripe-shaped reflecting layer is $P_{ab\text{-}2}$, the shortest wavelength of light incident to the polarizing element is $\lambda_{min}$, a refractive index of a medium through which light incident to the polarizing element passes is $n_0$, and the maximum value of an incidence angle of light into the polarizing element is $\theta_{in\text{-}max}$, the following relation is satisfied:

$(P_{ab\text{-}1}^2 + P_{ab\text{-}2}^2)^{1/2} \leq [(\lambda_{min} n_0) \times \cos(\theta_{in\text{-}max})]$.

8. The solid-state imaging device according to claim 1,
wherein when a formation pitch of the segments of the light absorption layer in the extension direction of the stripe-shaped reflecting layer is $P_{ab\text{-}1}$ and the length thereof is $L_{ab}$, the following relation is satisfied:

$0.5 \leq (L_{ab}/P_{ab\text{-}1}) < 1$.

9. The solid-state imaging device according to claim 1,
wherein the extension direction of the stripe-shaped reflecting layer is at an angle of 45° or 135° with respect to an arrangement direction of a plurality of solid-state imaging elements.

10. The solid-state imaging device according to claim 1,
wherein the reflecting layer is formed of a metallic material, an alloy material, or a semiconductor material.

11. The solid-state imaging device according to claim 1,
wherein the light absorption layer is formed of a metallic material, an alloy material, or a semiconductor material.

12. The solid-state imaging device according to claim 1,
wherein a protective film is formed on the polarizing element.

13. The solid-state imaging device according to claim 12,
wherein the polarizing element is formed on a base, and
wherein the protective film is not formed on a portion of the base positioned between the polarizing element and the polarizing element.

14. An imaging apparatus comprising the solid-state imaging device according to claim 1.

15. The imaging apparatus according to claim 14,
wherein an extension direction of the stripe-shaped reflecting layer is identical to a polarization orientation where light is to be extinct, and
wherein a repetition direction of the stripe-shaped reflecting layer is identical to a polarization orientation where light is to be transmitted.

16. The imaging apparatus according to claim 14,
wherein the length of the reflecting layer in the extension direction of the stripe-shaped reflecting layer is smaller than the length of the solid-state imaging element along the extension direction of the stripe-shaped reflecting layer.

17. The imaging apparatus according to claim 14,
wherein when the distance in an optical axis direction between the polarizing element and the on-chip lens is D, the amount of sagging of the on-chip lens is S, a refractive index of a medium present between the polarizing element and the on-chip lens is $n_1$, the width of a gap present between adjacent polarizing elements is $2 \times R$, and the maximum value of an incidence angle of light into the polarizing element is $\theta_{in\text{-}max}$, the following relation is satisfied:

$R \geq (D+S) \times \tan[\sin^{-1}\{\sin(\theta_{in\text{-}max})/n_1\}]$.

18. The imaging apparatus according to claim 14,
wherein a planarization layer and an interlayer insulating layer formed of an inorganic material are formed between the on-chip lens and the polarizing element in that order from the on-chip lens side.

19. The imaging apparatus according to claim 14,
wherein a wavelength selecting layer is disposed between the photoelectric conversion element and the on-chip lens.

* * * * *